(12) United States Patent
Dikopoltsev et al.

(10) Patent No.: US 11,703,464 B2
(45) Date of Patent: Jul. 18, 2023

(54) SMALL-ANGLE X-RAY SCATTEROMETRY

(71) Applicant: Bruker Technologies Ltd., Migdal HaEmek (IL)

(72) Inventors: Alex Dikopoltsev, Haifa (IL); Matthew Wormington, Highlands Ranch, CO (US); Yuri Vinshtein, Hadera (IL); Alexander Krokhmal, Haifa (IL)

(73) Assignee: BRUKER TECHNOLOGIES LTD., Migdal HaEmek (IL)

( * ) Notice: Subject to any disclaimer, the term of this patent is extended or adjusted under 35 U.S.C. 154(b) by 0 days.

(21) Appl. No.: 17/505,696

(22) Filed: Oct. 20, 2021

(65) Prior Publication Data

US 2022/0042933 A1 Feb. 10, 2022

Related U.S. Application Data

(63) Continuation of application No. 17/254,281, filed as application No. PCT/IB2019/055735 on Jul. 4, 2019, now Pat. No. 11,181,490.
(Continued)

(51) Int. Cl.
*G01N 23/201* (2018.01)
*G01N 23/207* (2018.01)
(Continued)

(52) U.S. Cl.
CPC ......... *G01N 23/201* (2013.01); *G01N 23/207* (2013.01); *G01N 23/223* (2013.01); *G01T 1/166* (2013.01); *G01N 2223/6116* (2013.01)

(58) Field of Classification Search
None
See application file for complete search history.

(56) References Cited

U.S. PATENT DOCUMENTS

| 6,108,398 A | 8/2000 | Mazor et al. |
| 7,068,753 B2 | 6/2006 | Berman et al. |

(Continued)

FOREIGN PATENT DOCUMENTS

| JP | H3223656 A | 10/1991 |
| JP | H0954050 A | 2/1997 |

(Continued)

OTHER PUBLICATIONS

JP Application # 2020207993 Office Action dated Dec. 15, 2021.
(Continued)

*Primary Examiner* — Hoon K Song
(74) *Attorney, Agent, or Firm* — Kligler & Associates Patent Attorneys Ltd

(57) ABSTRACT

A method for evaluating an array of high aspect ratio (HAR) structures on a sample includes illuminating the sample with an x-ray beam along a first axis parallel to within two degrees to the HAR structures in the array and sensing a first pattern of small angle x-ray scattering (SAXS) scattered from the sample while illuminating the sample along the first axis. The sample is illuminated with the x-ray beam along a second axis that is oblique to the HAR structures in the array, and a second pattern of the SAXS scattered from the sample is sensed while illuminating the sample along the second axis. Information is extracted with respect to the HAR structures based on the first and second patterns.

19 Claims, 45 Drawing Sheets

Related U.S. Application Data

(60) Provisional application No. 62/711,477, filed on Jul. 28, 2018, provisional application No. 62/711,478, filed on Jul. 28, 2018, provisional application No. 62/711,476, filed on Jul. 28, 2018.

(51) Int. Cl.
*G01T 1/166* (2006.01)
*G01N 23/223* (2006.01)

(56) References Cited

U.S. PATENT DOCUMENTS

| | | | |
|---|---|---|---|
| 7,406,153 B2 | 7/2008 | Berman | |
| 7,453,985 B2 | 11/2008 | Mazor et al. | |
| 7,653,174 B2 | 1/2010 | Mazor et al. | |
| 9,632,043 B2 | 4/2017 | Mazor et al. | |
| 10,352,695 B2 | 7/2019 | Dziura et al. | |
| 10,386,313 B2 | 8/2019 | Mazor et al. | |
| 2004/0032581 A1 | 2/2004 | Nikoonahad et al. | |
| 2006/0284081 A1 | 12/2006 | Miyamoto et al. | |
| 2006/0288325 A1 | 12/2006 | Miyamoto et al. | |
| 2006/0289790 A1 | 12/2006 | Raymond et al. | |
| 2007/0290703 A1 | 12/2007 | Hollman | |
| 2008/0239318 A1 | 10/2008 | Ono et al. | |
| 2015/0241469 A1 | 8/2015 | Osborne et al. | |
| 2017/0199136 A1* | 7/2017 | Krokhmal | G01N 23/207 |
| 2017/0227478 A1 | 8/2017 | Grimshaw et al. | |
| 2019/0049602 A1* | 2/2019 | Hench | G01N 21/47 |
| 2019/0310080 A1 | 10/2019 | Hill et al. | |
| 2020/0319443 A1 | 10/2020 | Liu et al. | |

FOREIGN PATENT DOCUMENTS

| | | |
|---|---|---|
| TW | 201704728 A | 2/2017 |
| TW | 201802245 A | 1/2018 |
| WO | 2013052318 A1 | 4/2013 |

OTHER PUBLICATIONS

Yw Application # 108113315 Office Action dated Jul. 25, 2022.
TW Applicaton # 108113314 Office Action dated Aug. 5, 2022.
TW Application # 108113313 Office Action dated Nov. 16, 2022.
KR Application # 1020190044142 Office Action dated Mar. 6, 2023.
JP Application # 2020573226 Office Action dated Jan. 18, 2023.

* cited by examiner

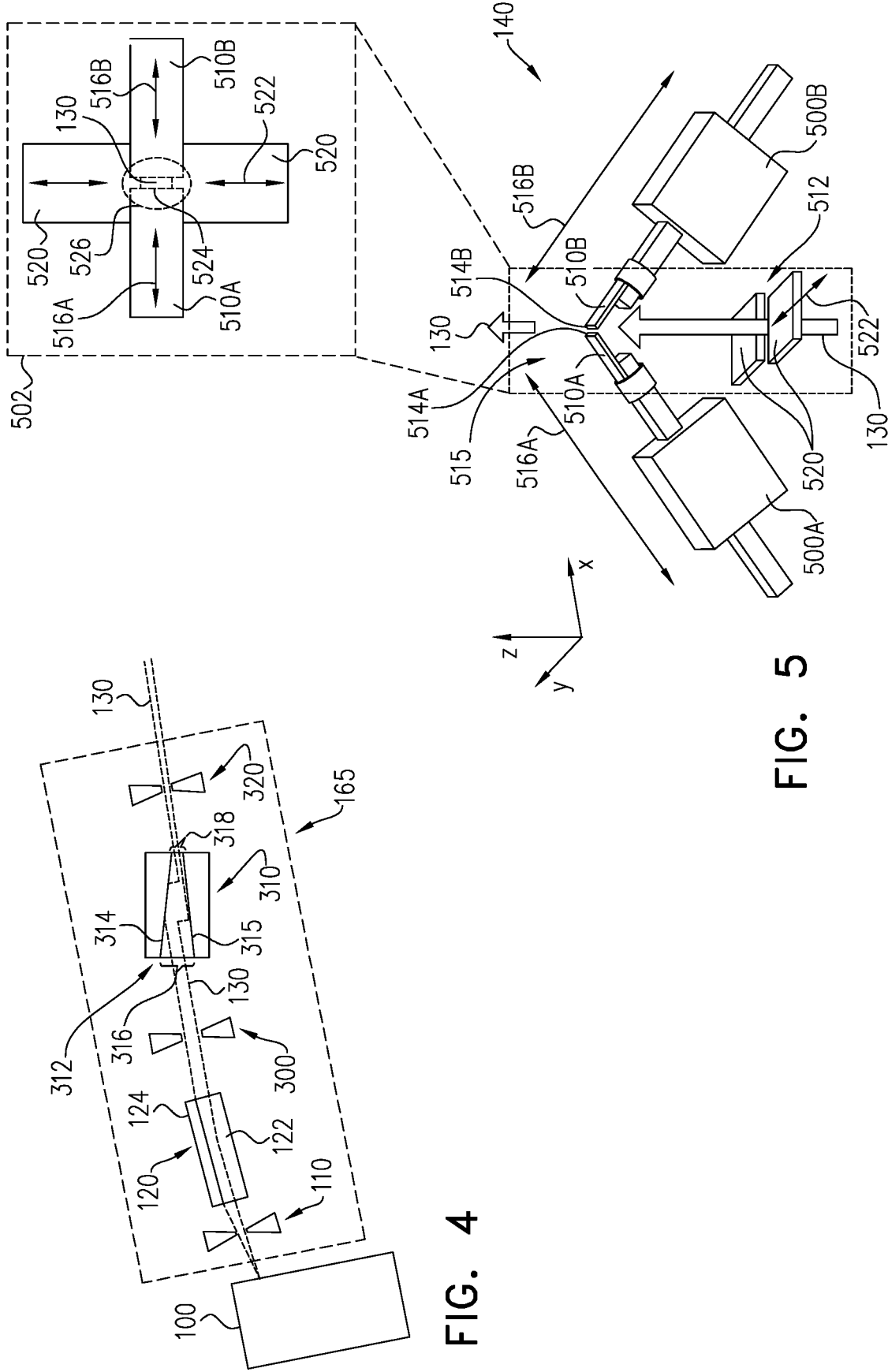

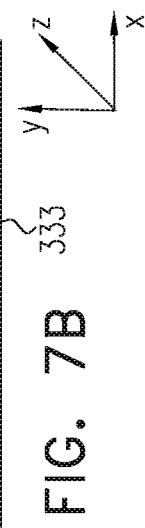
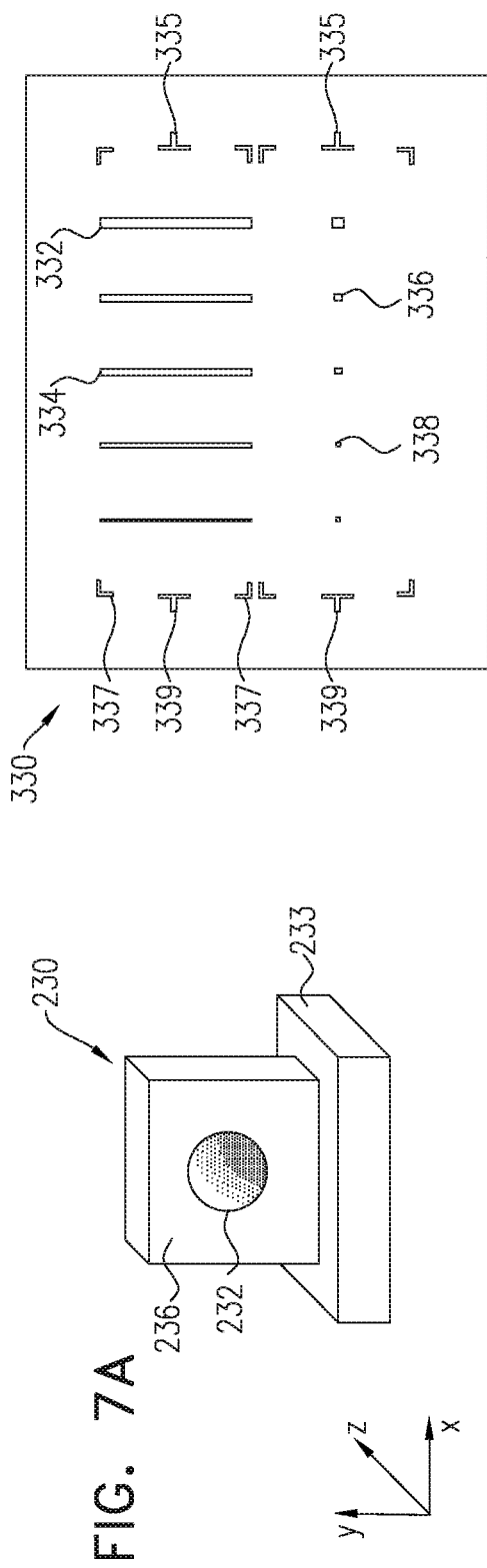
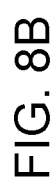
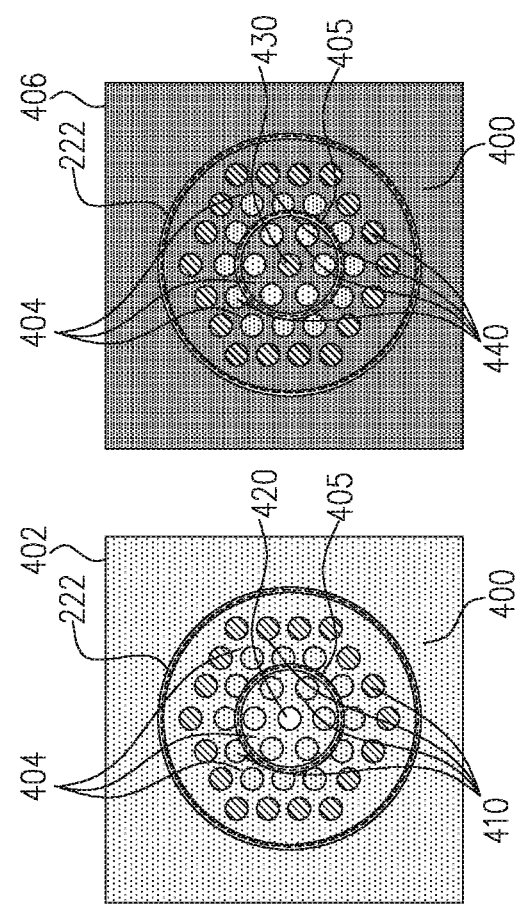

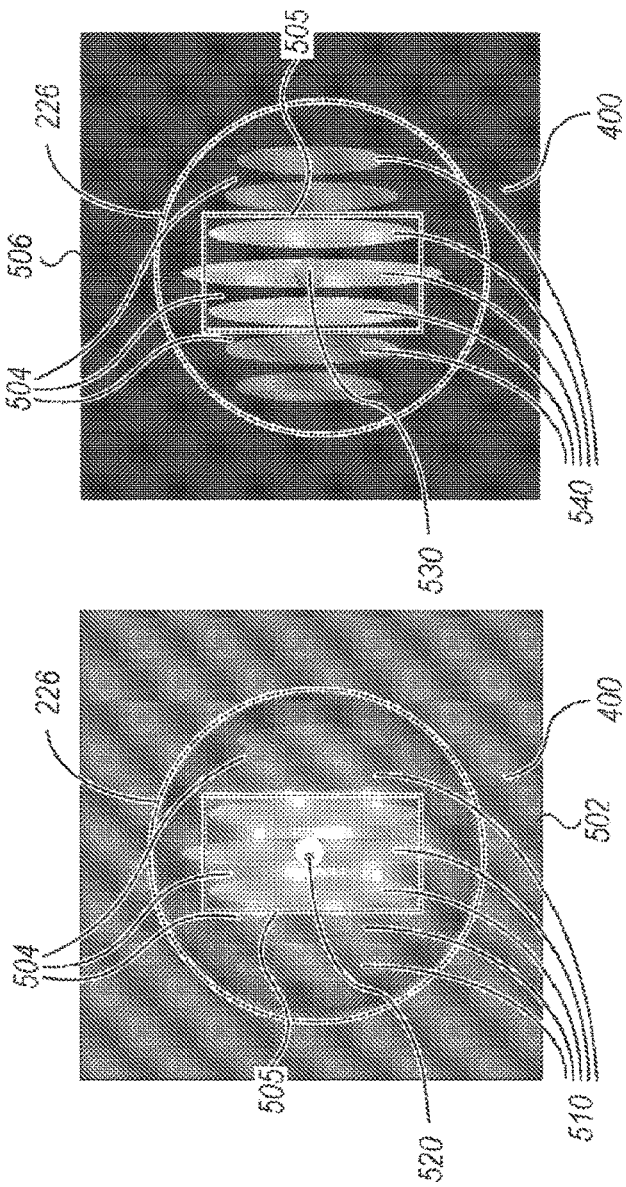
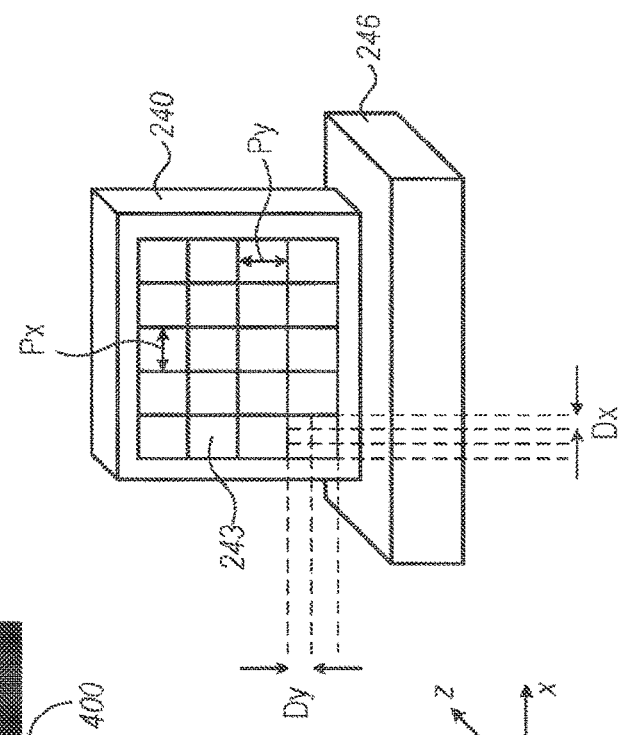
FIG. 9A
FIG. 9B
FIG. 10

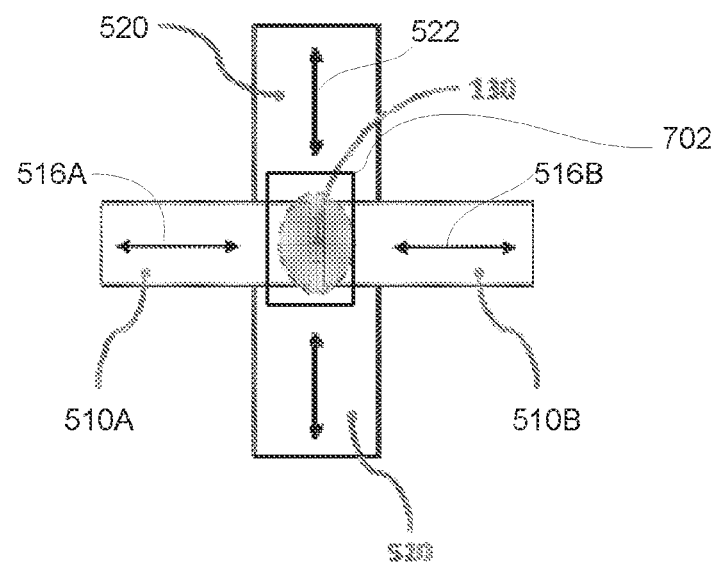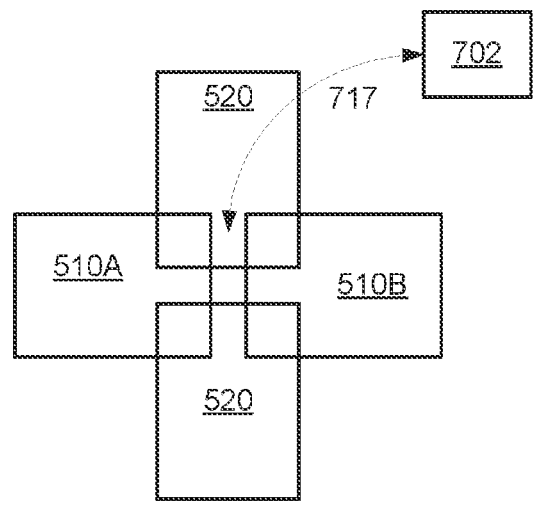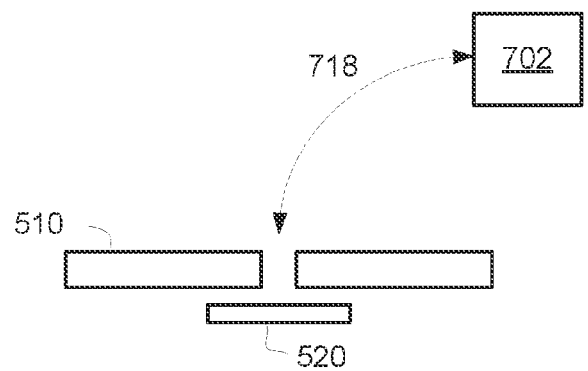
FIG. 13

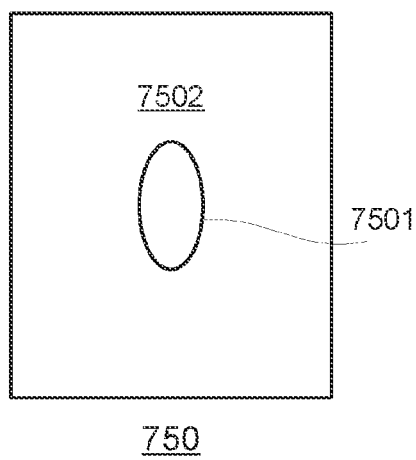
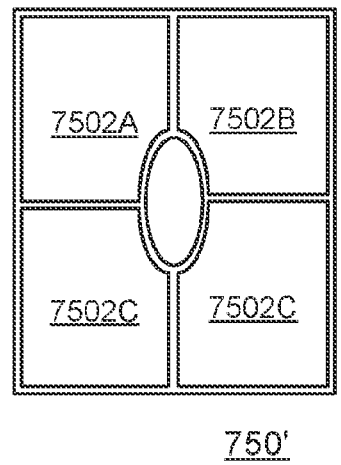
FIG. 22
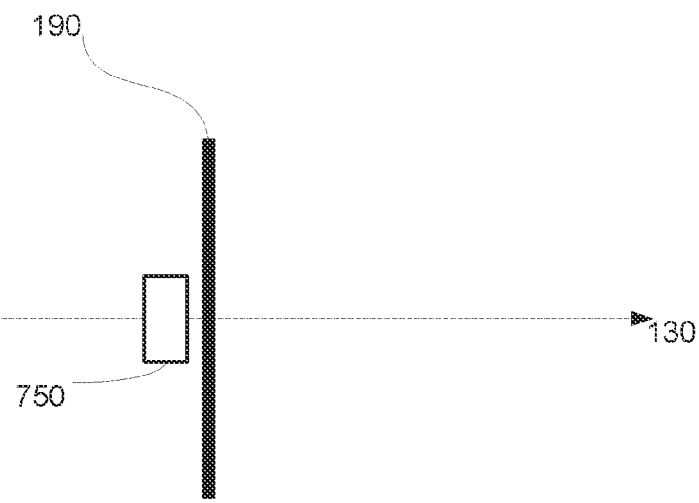
FIG. 23
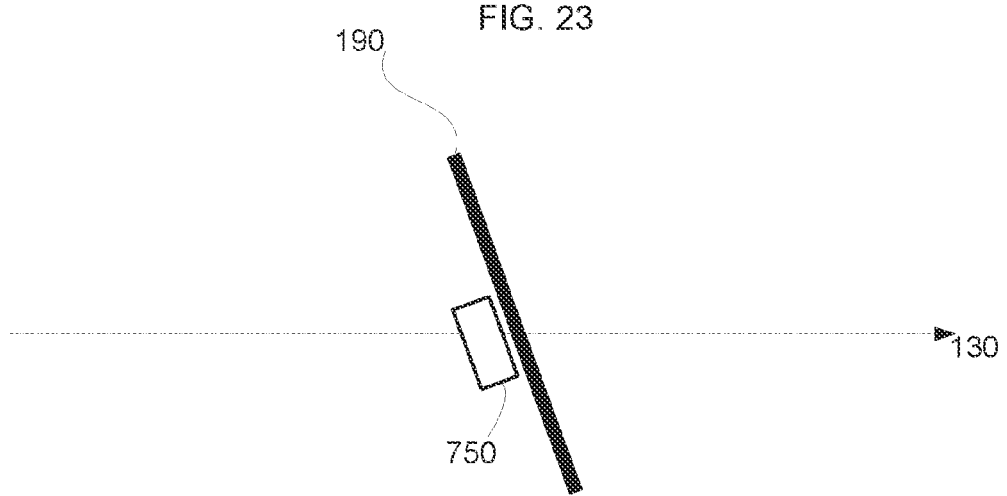
FIG. 24

1041
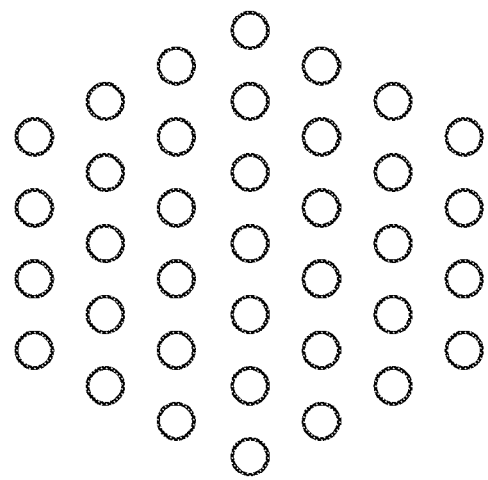
1042
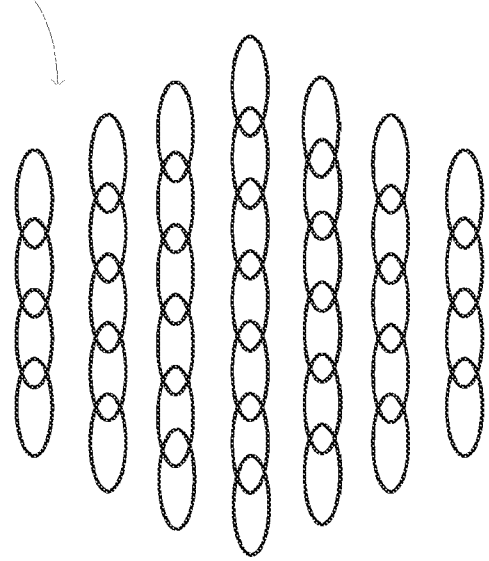
FIG. 51

1043

SMALL-ANGLE X-RAY SCATTEROMETRY

CROSS-REFERENCE TO RELATED APPLICATIONS

This application is a continuation of U.S. patent application Ser. No. 17/254,281, filed Dec. 20, 2020, in the national phase of PCT Patent Application PCT/IB2019/055735, filed Jul. 4, 2019, which claims the benefit of the following U.S. provisional patent applications:
(a) U.S. provisional patent application 62/711,477 filing date Jul. 28, 2018;
(b) U.S. provisional patent application 62/711,478 filing date Jul. 28, 2018; and
(c) U.S. provisional patent application 62/711,476 filing date Jul. 28, 2018.

FIELD OF THE INVENTION

The present invention relates generally to X-ray analysis, and particularly to methods and systems for measuring geometrical structures of semiconductor devices using X-ray scatterometry.

BACKGROUND OF THE INVENTION

X-ray scatterometry techniques are used for measuring geometrical structures of semiconductor devices.

For example, U.S. Pat. No. 7,481,579 describes a method for inspection that includes directing a beam of X-rays to impinge upon an area of a sample containing first and second features formed respectively in first and second thin film layers, which are overlaid on a surface of the sample. A pattern of the X-rays diffracted from the first and second features is detected and analyzed in order to assess an alignment of the first and second features.

U.S. Pat. No. 9,606,073 describes apparatus that includes a sample-support that retains a sample in a plane having an axis, the plane defining first, and second regions separated by the plane. A source-mount in the first region rotates about the axis, and an X-ray source on the source-mount directs first and second incident beams of X-rays to impinge on the sample at first and second angles along beam axes that are orthogonal to the axis. A detector-mount in the second region moves in a plane orthogonal to the axis and an X-ray detector on the detector-mount receives first and second diffracted beams of X-rays transmitted through the sample in response to the first and second incident beams, and outputs first and second signals, respectively, in response to the received first and second diffracted beams. A processor analyzes the first and the second signals so as to determine a profile of a surface of the sample.

U.S. Pat. No. 9,269,468 describes an X-ray optical device that includes a crystal containing a channel, which passes through the crystal and has multiple internal faces. A mount is configured to hold the crystal in a fixed location relative to a source of an X-ray beam and to shift the crystal automatically between two predefined dispositions: a first disposition in which the X-ray beam passes through the channel while diffracting from one or more of the internal faces, and a second disposition in which the X-ray beam passes through the channel without diffraction by the crystal.

U.S. Pat. No. 8,243,878 describes a method for analysis including directing a converging beam of X-rays toward a surface of a sample having an epitaxial layer formed thereon, and sensing the X-rays that are diffracted from the sample while resolving the sensed X-rays as a function of angle so as to generate a diffraction spectrum including a diffraction peak and fringes due to the epitaxial layer.

Orientation of high aspect ratio holes High aspect ratio (HAR) holes are formed in semiconductor objects such as but not limited to semiconductor wafers. An aspect ratio (AR) is defined as the ratio of transverse (out-of-plane of the wafer) dimension of a hole to the lateral (in-plane) dimensions of a hole. A high aspect ratio may exceed 10:1. The lateral dimensions may be of sub-micron scale. The HAR holes may be unfilled or filled with materials that may differ from the composition of the surrounding materials.

A stack (also referred to as a sequence) of HAR holes may provide a structure that has an aspect ratio that is higher than the AR of each one of the HAR holes of the stack. When the HAR holes of the sequence are identical and perfectly aligned then the AR of the sequence is the sum of ARs of the HAR holes.

Due to manufacturing process imperfections the HAR holes may be oriented in a manner that deviates from a desired orientation. The HAR holes may be mutually misaligned.

Additionally or alternatively, at least one of the HAR holes may be orientated (in relation to the surface of the wafer) at an angle the deviates from a desired angle of deviation. For example—while an HAR hole should be normal to the surface of the wafer—the HAR hole may be oblique to the surface of the wafer.

There is a growing need to determine the orientations of HAR holes of sequences of HAR holes that belong to an array of sequences, wherein each sequence includes HAR holes.

Extracting Information Related to an Array of High Aspect Ratio Holes.

Small angle x-ray scattering (SAXS) can be used to measure the arrangement and shape of an array of HAR holes on or within semiconductor samples. SAXS involves irradiating a semiconductor sample, wafer or coupon, with an x-ray beam. The x-ray beam passes through the semiconductor sample and is scattered by the array of objects thereby providing a scattered pattern (also referred to as a SAXS pattern or SAXS intensity distribution) that is sensed by a detector.

The array of objects may include, in addition to an array of HAR holes, one or more additional repetitive structure that includes a scattered pattern that is generated due to scattering of the x-ray beam by the array of the HAR holes, and by the one or more additional repetitive structures.

There is a growing need to provide a system, method and a computer program product for extracting information about the array of HAR holes Evaluating an Object from Different Angles Small angle x-ray scattering (SAXS) can be used to measure the arrangement and shape of an array of HAR holes on or within semiconductor samples. SAXS involves irradiating a semiconductor sample, wafer or coupon, with an x-ray beam. The x-ray beam passes through the semiconductor sample and is scattered by the array of objects thereby providing a scattered pattern (also referred to as a SAXS pattern or SAXS intensity distribution) that is sensed by a detector In some cases the semiconductor object should be measured from different angles.

There is a growing need to provide a system and method for inspecting a semiconductor object from different angles in order to provide more accurate and precise shape information.

The present invention will be more fully understood from the following detailed description of the embodiments thereof, taken together with the drawings in which:

BRIEF DESCRIPTION OF THE DRAWINGS

FIG. 4 is a schematic illustration of a beam conditioning assembly, in accordance with an embodiment of the present invention;

FIGS. 5 and 6 are schematic illustrations of slit assemblies, in accordance with embodiments of the present invention;

FIGS. 7A and 7B are schematic illustrations of beam blocking assemblies, in accordance with embodiments of the present invention;

FIG. 8A is a schematic illustration of an image indicative of the intensity of an X-ray beam sensed by a detector without a beam blocker, in accordance with another embodiment of the present invention;

FIG. 8B is a schematic illustration of an image indicative of the intensity of an X-ray beam sensed by a detector in the presence of a beam blocker, in accordance with an embodiment of the present invention;

FIG. 9A is a schematic illustration of an image indicative of the intensity of a scattered X-ray beam sensed by a detector without a beam blocker, in accordance with another embodiment of the present invention;

FIG. 9B is a schematic illustration of an image indicative of the intensity of a scattered X-ray beam sensed by a detector in the presence of beam blocker, in accordance with an embodiment of the present invention;

FIG. 10 is a schematic illustration of a scanning scheme in which an X-ray detector comprising an array of sensors is moved at steps smaller than the inter-distance of the sensors, for improved angular resolution, in accordance with an embodiment of the present invention;

FIG. 13 illustrates a detector and a part of a slit assembly;
FIG. 22 illustrates XRF detectors;
FIG. 23 illustrates a sample, X-ray beam and an XRF detector;
FIG. 24 illustrates a sample and a detector;
FIGS. 47-52 illustrate examples of passage of x-ray beam cross sections and SAXS patterns.

DETAILED DESCRIPTION OF EMBODIMENTS

Overview

Figure 1:
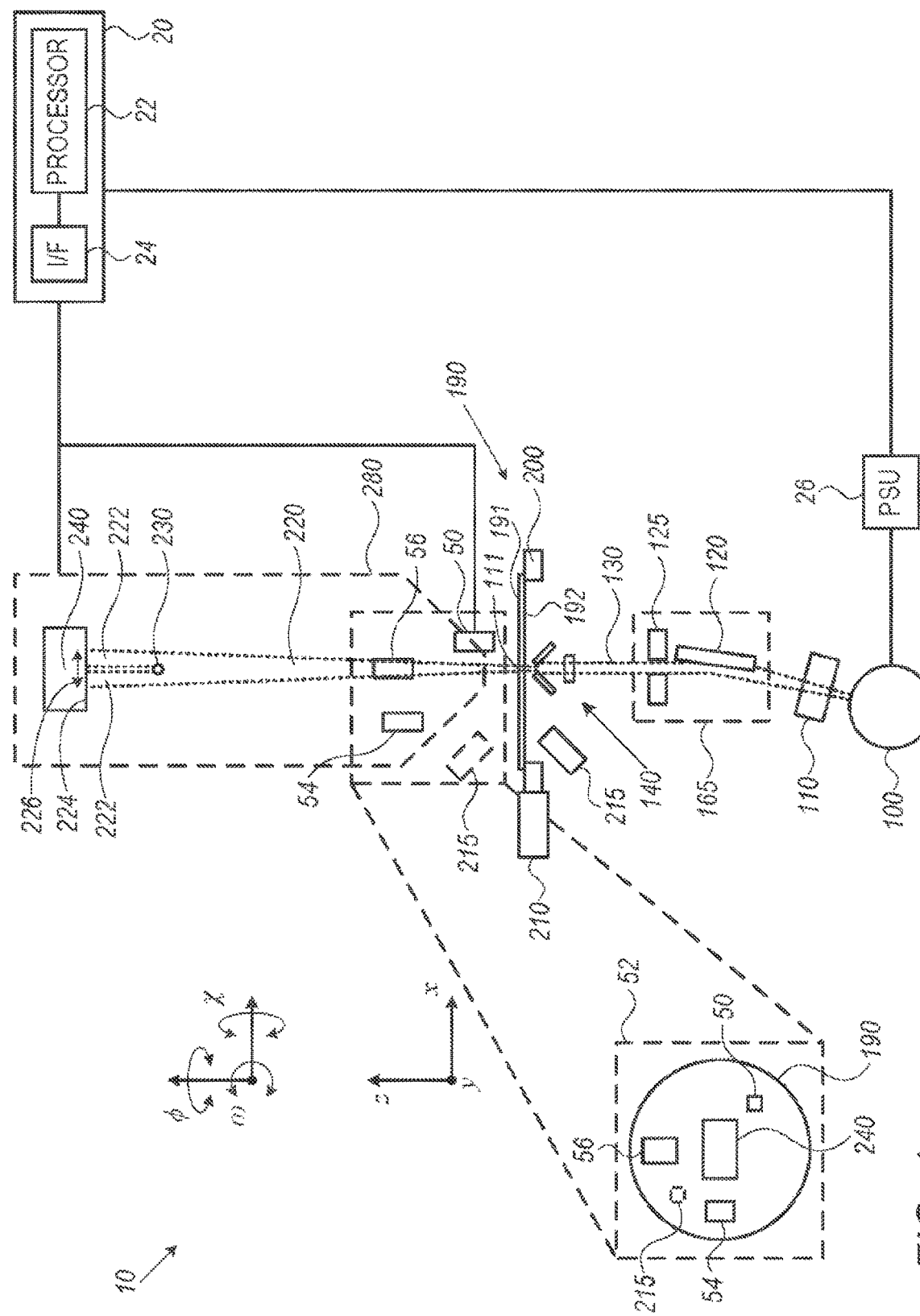
FIGS. 1-3 are schematic illustrations of small-angle X-ray scattering (SAXS) systems, in accordance with embodiments of the present invention.

Embodiments of the present invention that are described hereinbelow provide improved methods and systems for analyzing geometrical features formed in various types of semiconductor devices and test structures. X-ray scatterometry techniques for analyzing features, such as small-angle X-ray scattering (SAXS) methods, typically apply X-rays whose wavelengths are on the order of one angstrom. Such wavelengths are suitable for measuring High Aspect Ratio (HAR) features such as HAR holes or trenches fabricated in semiconductor wafers. Measuring geometrical and other properties of the features is carried out based on analyzing the intensities of the X-rays scattered from the wafer at various angles.

In some embodiments, a SAXS system comprises a motorized stage, that is configured to move a planar sample, such as a wafer having front and back surfaces facing one another, wherein the front surface comprises various types of features, such as HAR features. Additionally or alternatively, the back surface of the wafer may be patterned with similar and/or other types of features.

In some embodiments, the SAXS system comprises an X-ray source, that is configured to direct a beam of X-rays toward the back surface of the wafer. The SAXS system further comprises at least one detector, facing the front surface of the wafer, the detector is configured to sense at least part of the X-rays that have been scattered from and/or transmitted through the wafer. The detector is configured to produce electrical signals indicative of the intensity of the X-rays scattered from HAR features in the front surface of the wafer, and received by the detector.

In some embodiments, the SAXS system comprises a processor, that is configured to measure properties of the HAR features in question, based on the electrical signals received from the detector.

In some embodiments, the SAXS system comprises a beam conditioning assembly, positioned between the X-ray source and the back surface of the wafer, and configured to adjust properties of the X-ray beam. The beam conditioning assembly comprises a crystal containing a v-shaped channel having an entrance aperture, an exit aperture, and opposing internal faces arranged so that the channel tapers from the entrance aperture to the exit aperture. The beam conditioning assembly further comprises an X-ray mirror, having a curved substrate with a multilayer coating. The mirror is configured to collect the beam and direct the collected beam into the entrance aperture of the channel with a first beam diameter, so that the beam that is emitted from the exit aperture has a second beam diameter, smaller than the first beam diameter.

In some embodiments, the SAXS system comprises a first slit, which is positioned between the X-ray source and the back surface of the wafer so as to intercept the beam and to adjust spatial properties of the intercepted beam. The first slit comprises first and second movable blades that are typically not parallel to one another. The edges of the first and second blades are positioned in close proximity to one another so as to define the slit. In some embodiments, the processor is configured to move the edges of the first and second blades so as to control spatial properties of the beam by adjusting the width of the slit.

In alternative embodiments, the SAXS system comprises a second slit, positioned between the X-ray source and the back surface of the wafer. The second slit comprises a movable blade having multiple scatterless-pinholes, each of which having a different width. The processor is configured to position a selected scatterless-pinhole to intercept the beam by moving the movable blade, so as to control the spatial properties of the beam.

In some embodiments, the SAXS system comprises an optical gauge, that is configured to direct a light beam toward the back side of the wafer, to sense the optical radiation reflected therefrom using a detector, and, in response to the sensed optical radiation, to output, by the detector, a signal that is indicative of the position of the wafer. Based on the signal, the processor is configured to estimate position parameters, such as the distance between the wafer and the detector, and the orientation of the wafer relative to the detector. The SAXS system further comprises a motor, which is controlled by the processor so as to align the orientation between the X-ray beam and the wafer in response to the signal.

In some embodiments, the wafer comprises single-crystalline material, and the detector is configured to measure one or more beams diffracted from a lattice plane of the single crystal. The SAXS system further comprises a controller, that is configured to calibrate the position of the optical gauge relative to the lattice plane in response to the measured diffraction. Based on the diffracted X-rays, the controller is further configured to measure the orientation of the wafer relative to the detector, and to drive at least one motor to align the orientation between the wafer and the incident X-ray beam, based on the measured orientation. In other embodiments, the processor may carry out at least some of the operations described above, instead of the controller.

In some embodiments, the SAXS system comprises a detector mounted on one or more actuators, which are configured to move the detector with respect to the scattered X-rays, over a range of positions on the front surface of the wafer, so as to measure the intensities of the transmitted X-rays as a function of scattering angle. This configuration allows to measure the intensities of the transmitted X-rays with increased angular resolution than is possible by the native resolution of the detector elements. In some embodiments, the processor is configured to control the actuator, in response to electrical signals produced by the detector, so that the acquisition time of the detector inversely depends on the intensity of the sensed X-rays.

In some embodiments, the detector comprises a two-dimensional array (also referred to as a matrix) of sensor elements having a predefined pitch along height and width axes of the matrix. The actuator is configured to step the detector across the range of positions at a finer resolution than the predefined pitch along both height and width axes.

In some embodiments, the SAXS system comprises a beam blocker having one or more beam stoppers. The beam blocker comprises a mount made of a material that is transparent to the X-rays. The one or more beam stoppers are held within the mount, and are made from a material at least partially opaque to the X-ray beam. The beam blocker may be positioned so that the one or more beam stoppers block the X-rays in a part of the range of angles, whereas the X-rays at the angles surrounding the blocked part of the beam, pass through the mount to the detector. In an embodiment, at least one of the beam stoppers has an ellipsoidal shape with smooth edge so as to prevent scattering of the beam from the beam stopper.

The disclosed techniques improve the sensitivity of SAXS systems to detect small geometrical changes in HAR features, by improving the angular resolution at which the X-ray beams scattered from HAR features are sensed by the detector. Moreover, the disclosed techniques may be used for reducing the footprint of SAXS systems while maintaining measurements in high sensitivity and resolution.

System Description

FIG. 1 is a schematic illustration of a small-angle X-ray scattering (SAXS) system 10, in accordance with an embodiment of the present invention. In some embodiments, SAXS system 10, also refers to herein as "system 10" for brevity, is configured to measure features on a sample, in the present example, a wafer 190, using scatterometry techniques, as will be described hereinbelow.

In some embodiments, wafer 190 may comprise any suitable microstructure or materials, such as a single-crystal, a poly-crystal, an amorphous microstructure or any suitable combination thereof, such as different microstructures or materials at different locations of wafer 190.

In some embodiments, system 10 comprises an X-ray excitation source, referred to herein as a source 100, driven by a high-voltage power supply unit (PSU) 26. In some embodiments, source 100 is configured to emit an X-ray beam 130, also referred to herein as "incident beam 130" or "beam 130" for brevity, having a suitable energy to pass through wafer 190.

In some embodiments, source 100 is configured to generate an intense X-ray emission having a wavelength equal to or smaller than 0.1 nm with an effective spot-size of about 150 µm or less.

In some embodiments, source 100 may comprise any suitable type of high-brightness X-ray source, such as, but not limited to (a) a fixed solid anode, (b) a rotating solid anode, (c) a liquid metal, or (d) a synchrotron.

In some embodiments, the fixed solid anode-based source comprises a micro-focus X-ray tube in which high-energy electrons (>=50 keV) in a vacuum are incident with a molybdenum (Mo) or silver (Ag) anode or any other suitable metallic element or alloy. Such micro-focus X-ray tubes are provided by multiple suppliers such as, but not limited to, Incoatec GmbH (Hamburg, Germany), or rtw RÖNTGEN-TECHNIK DR. WARRIKHOFF GmbH & Co. (Berlin, Germany).

In some embodiments, the rotating solid anode micro-focus X-ray source may comprise a Mo or Ag anode or any other suitable metallic element or alloy. Suitable rotating anode X-ray sources are provided by multiple suppliers, such as, Bruker AXS GmbH (Karlsruhe, Germany).

In some embodiments, the liquid metal X-ray source comprises an anode in a molten state. The anode may comprise any suitable one or more elements or alloys, such as alloys of gallium (Ga) and indium (In). A suitable liquid metal X-ray source may be selected, for example, from one or more of the MetalJet products offered by eXcillum AB (Kista, Sweden).

In some embodiments, a synchrotron-based source that comprise a compact electron accelerator-based X-ray source, such as the those provided by Lyncean Technologies (Fremont, Calif. 94539, USA) and others being developed by the scientific community.

In some embodiments, wafer 190 may comprise a semiconductor wafer having surfaces 191 and 192. In some embodiments, surface 191 comprises high aspect ratio (HAR) features produced, on surface 191 and/or into the bulk of wafer 190 or materials deposited thereon, using any suitable semiconductor processes, such as deposition, lithography and etching. Note that in these embodiments, surface 192 typically remains flat and smooth and does not comprise HAR structures or another pattern produced by lithography and etching. It will be understood that during the production of features on surface 191, some layers may be deposited as a blanket on some locations of surface 192, e.g., using chemical vapor deposition (CVD) processes, and may cause some unintended topography on surface 192.

In other embodiments, at least part of surface 192 may be patterned with the aforementioned HAR features and/or with any other suitable types of features. In alternative embodiments, only surface 192 may comprise the aforementioned HAR features.

In the context of the present disclosure, and in the claims, the term "aspect ratio" refers to an arithmetic ratio between the depth and width (e.g., diameter in the case of a circular hole), or between the height and width of a given feature formed in wafer 190. Furthermore, the term "high aspect ratio (HAR)" typically refers to an aspect ratio higher than 10. The HAR structures, also referred to herein as HAR features, may comprise various types of three-dimensional (3D) structures formed, for example, on a logic device (e.g., a microprocessor), or a NAND flash memory device, or a dynamic random-access memory (DRAM) device, or on any other device.

In some embodiments, the HAR features may comprise one or more Fin field-effect transistors (FETs), gate-all-around (GAA) FETs, nanowire FETs of a complementary metal-oxide semiconductor (CMOS) device, an access transistor of a DRAM device, one or more channels of a 3D NAND flash device, one or more 3D capacitors of a DRAM device, or any other type of HAR feature.

In some embodiments, system 10 comprises a computer 20, which comprises a processor 22, an interface 24 and a display (not shown). Processor 22 is configured to control various components and assemblies of system 10 described below, and to process electrical signals received from a movable detector assembly, referred to herein as a detector 240. Interface 24 is configured to exchange electrical signals between processor 22 and the respective components and assemblies of system 10.

Typically, processor 22 comprises a general-purpose processor with suitable front end and interface circuits, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, beam 130 is emitted from source 100 and passes through a shutter and slit assembly of system 10, referred to herein as "assembly 110," made from any suitable material opaque to X-rays. In some embodiments, processor 22 is configured to set the position of assembly 110 using one or more controlled actuators, such as motors or piezoelectric-based drives (not shown).

In some embodiments, assembly 110 is configured to improve the user safety of system 10 by blocking any X-ray radiation deflected from the designed optical path of beam 130. In some embodiments, processor 22 is configured to adjust the position and size of the slits, so as to control the divergence and spatial shape of beam 130.

In some embodiments, system 10 comprises additional slits, controlled by processor 22 for adjusting the divergence, intensity and spot-size of beam 130, and for blocking undesired scattered radiation.

In some embodiments, system 10 comprises a beam conditioning assembly, referred to herein as "assembly 165," whose structure is described in detail in FIG. 4 below. In some embodiments, assembly 165 comprises optical elements, such as a mirror 120 and slits 125. Mirror 120 is configured to collect beam 130 from source 100 and assembly 110 and shape the optical properties of beam 130. For example, mirror is configured to produce a collimated beam or a focused beam, or a combination thereof (e.g., collimated in x-direction and focused in y-direction). Slits 125 are configured to adjust the properties of beam 130, such as the divergence angle and the spot-size of the beam exiting mirror 120.

In some embodiments, beam conditioning assembly 165 may comprise a vacuum chamber so as to prevent degradation of one or more of the aforementioned optical elements caused by the interaction between air and ionizing radiation on the surface of the optical elements.

In some embodiments, beam conditioning assembly 165 may have multiple configurations, some of which are described in detail in FIG. 4 below. For example, processor 22 may instruct beam conditioning assembly 165 to shape a first beam 130 as a collimated beam having a small spatial extent (i.e., spot size). Processor 22 may use this beam configuration for measuring features disposed on a small sized test pad, as is the case of logic applications in which metrology is performed on test structures laid out in the scribe line between adjacent dies of wafer 190.

In another example, wafer 190 may comprise a memory device (e.g., DRAM, NAND flash) having large arrays of repeating features (e.g., in the memory blocks), or a logic device having memory sections. In some embodiments, processor 22 may apply to a selected memory block of the die, a second beam 130 having a larger spot size and higher intensity compared to first beam 130. Processor 22 may exchange the mirror 122 to focus beam 130 on the active surface of detector 240 so as to increase the resolution of the respective SAXS system (e.g., system 10, 30, or 40 described above).

In some embodiments, system 10 comprises a beam limiter, also referred to herein as a slit assembly 140, which comprises one or more slits and/or movable blades described in detail in FIGS. 5 and 6 below. Slit assembly 140 is configured to control and/or refine the position and/or spot size and/or shape and/or convergence or divergence angle of incident beam 130 on surface 192 of wafer 190.

In some embodiments, system 10 comprises a motorized rotation stage (not shown) having a rotation axis about the y-axis and centered at surface 191. In some embodiments, source 100, beam conditioning assembly 165, and one or more of slit assemblies 110 and 140 are mounted on the rotation stage, which is controlled by a motion controller and/or by processor 22.

In some embodiments, processor 22 may adjust or calibrate the angle between incident beam 130 and a normal to surface 192 of wafer 190, so as to improve the measurement conditions of system 10.

In some embodiments, system 10 comprises a chuck 200 having wafer 190 mounted thereon. Chuck 200 is configured to mechanically support wafer 190 and to allow directing beam 130 to most of the area (e.g., excluding, at least some part of, the bevel of wafer 190 as shown in FIG. 1), or over the entire area of surface 192.

In some embodiments, chuck 200 may comprise a ring-shaped wafer support, but additionally or alternatively, chuck 200 may comprise any other suitable design, such as a three-point kinematic mount.

In some embodiments, system 10 comprises a mount, for example, a motorized xyz$\chi\delta\varphi$-stage, referred to herein as "a stage 210," having chuck 200 mounted thereon. Stage 210 is controlled by processor 22 in a xyz coordinate system of system 10, and is designed as an open frame (i.e., having no material in the center) so as to allow incident beam 130 to directly impinge on surface 192 of wafer 190.

In some embodiments, stage 210 is configured to move wafer 190 relative to beam 130 in x and y directions, so as to set a desired spatial position of wafer 190 relative to incident beam 130. Stage 210 is further configured to move wafer 190 along z-axis so as to improve the focus of beam 130 at the desired position on surface 192, or at any other suitable position on wafer 190. Stage 210 is further configured to apply rotations $\chi$ and/or $\omega$ to about respective x-axis and y-axis parallel to surface 192 of wafer 190, and to apply azimuthal rotation $\varphi$ about z-axis perpendicular to surface 192 of wafer 190.

In some embodiments, processor 22 is configured to select a predefined azimuth $\varphi$ so to align beam 130 with selected features in the structures to be measured. For example, processor 22 may selected a first azimuth $\varphi 1$ (not shown) so to align beam relative to line structures arranged in a one-dimensional (1D) on wafer 190. Moreover, processor 22 may select a second azimuth $\varphi 2$ (not shown) so to align beam 130 relative to a pattern or arrays of holes or vias arranged in a two-dimensional (2D) pattern, such as rectangular or hexagonal lattice, on wafer 190.

In alternative embodiments, wafer 190 is mounted on a suitable stationary fixture (instead of stage 210), such that processor 22 can move source 100, and the aforementioned assemblies (e.g., slit assembly 110, and assemblies 165 and 140), so that the X-ray beam is directed to any one or more desired positions of wafer 190. In other embodiments, system 10 may comprise any other suitable set of mounts, such as a set of stages (e.g., a $\chi\omega\varphi$-stage for wafer 190, and a xyz-stage for the assemblies described above) and processor 22 is configured to move surfaces 191 and 192 relative to beam 130 by controlling the set of stages.

In some embodiments, incident beam 130 impinges on surface 192, passes through wafer 190 and is scattered from the aforementioned HAR features formed in surface 191 of wafer 190. In an alternative configuration of wafer 190, surface 192 may comprise HAR features, in addition to or instead of the HAR features patterned in surface 191, as described above. In this wafer configuration, incident beam 130 may also be scattered from the HAR features patterned on surface 192. In some embodiments, detector 240 of system 10 is configured to detect X-ray photons scattered from the HAR features of both surfaces 191 and 192, as will be described in detail below.

In some embodiments, incident beam 130 may impinge, at a point 111, perpendicular to surface 192 of wafer 190, or at any other suitable angle relative to wafer 190. In an embodiment, some of incident beam 130 is absorbed as it traverses wafer 190 and a transmitted beam 220 exits surface 191 of wafer 190 in the same direction of incident beam 130. Additional beams 222, scattered from the aforementioned one or more HAR features, exit at different angles to transmitted beam 130 relative to surface 191 of wafer 22.

In some embodiments, detector 240 is configured to detect X-ray photons of beams 222 impinging, at one or more regions 226, on a surface 224 of detector 240. Detector 240 may comprise any suitable type of one or more detectors such as, but are not limited to, charge-coupled devices (CCDs), CMOS cameras provided by a number of suppliers, or array detectors made from a silicon (Si) or a cadmium telluride (CdTe) detection layer manufactured by DECTRIS Ltd. (Baden, Switzerland) supplying the 1D Mythen detectors and the 2D Pilatus and Eiger series of detectors.

In some embodiments, detector 240 may be mounted on a high-precision motorized translation and/or rotation stage (not shown), that is configured to move and/or rotate detector 240 based on predefined motion profiles so as to improve the sensing efficiency thereof. Example implementations of the stage and motion control of detector 240 are described in detail in FIG. 10 below.

In some embodiments, the detectors described above are configured to detect X-rays beams scattered from wafer 190, referred to herein as beams 222, and comprise sensitive elements of sufficiently small size so as to provide the necessary angular resolution for measuring the small-angle scattering intensity distribution from the HAR features of wafer 190.

In some embodiments, system 10 comprises one or more calibration gauges 215, used in calibrating and setting-up system 10, so as to accurately measure properties of the aforementioned features patterned in wafer 190. At least one of calibration gauges 215 is configured to produce electrical signals indicative of the height and inclination of a given position at wafer 190 relative to a predefined reference, as will be described in detail below. The electrical signals are sent, via interface 24, to processor 22 for analysis.

In some embodiments, system 10 may comprise two calibration gauges 215. A first calibration gauge 215, facing surface 192 that is typically flat and has no HAR features or other types of patterns, and a second calibration gauge 215, facing surface 191 that is typically patterned and may also have the HAR features described above. In the example configuration of FIG. 1, the second calibration gauge is optional and therefore is shown as a dashed rectangle.

In other embodiments, system 10 may comprise any other suitable configuration of calibration gauges 215, for example, only the second calibration gauge facing surface 191, or having the aforementioned first and second calibration gauges 215 facing surfaces 192 and 191, respectively.

In some cases, calibration gauge 215 may respond differently to the height and inclination of a patterned surface (e.g., on surface 191) and a flat surface (e.g., non-patterned or blanket surface 192) of wafer 190, and therefore, may require a calibration step before so as to improve the accuracy of the height and inclination measurements.

In some embodiments, processor 22 may receive from the aforementioned second calibration gauge 215, signals indicative of the height and inclination of surface 191, which is patterned. The pattern may affect (e.g., induce shift in) the measurements carried out by the second calibration gauge. In these embodiments, processor 22 is configured to adjust or calibrate the angle between incident beam 130 and a normal to surface 192 of wafer 190, so as to compensate for the pattern induced shift, and therefore, to improve the quality of measurements carried out by system 10.

Note that when calibration gauge 215 measures the height and inclination of surface 192, or of any other non-patterned surface, there is typically no shift in the measurements.

In some embodiments, calibration gauge 215, also referred to herein as an optical gauge, may comprise a light source and a sensor (not shown), or any other suitable configuration. Calibration gauge 215 is configured to measure, at selected coordinates of the x and y axes, the local height (e.g., distance along z-axis) and inclination of surface 192 (e.g., relative to an x-y plane of the xyz coordinate system). In these embodiments, the light source and the sensor are configured to operate in any suitable wavelength, e.g., visible, infrared (IR), or ultraviolet (UV), but typically not in the X-ray range.

In some embodiments, based on the electrical signals received from calibration gauges 215, processor 22 is configured to calculate and display on the display of system 10, a 3D map indicative of the height and inclination of surfaces 191 and 192, or any other selected plane of wafer 10, relative to any suitable reference, such as the x-y plane of the xyz coordinate system. Processor 22 may calculate the 3D map based on locations measured on surface 192, and additional locations calculated between the measured locations, for example, by interpolating the height and inclination between two or more of the measured locations.

In some embodiments, processor 22 is further configured to determine the one or more starting positions for any X-ray-based alignment procedures. The alignments procedures are used to determine zero angles, referred to herein as ω0 and χ0, of beam 130 relative to one or more scattering structures in question by system 10.

In some embodiments, by independently measuring the orientation of (a) surfaces 191 and 192, and (b) scattering features in question (e.g., HAR structures) of wafer 190, relative to incident beam 130, processor 22 is configured to calculate the orientation of the scattering features relative to surface 191 of wafer 190. This calculated orientation is particularly important for measuring HAR structure, such as channel holes of 3D NAND flash memory.

In some embodiments, wafer 190 is typically grown on a crystal having regular arrangement of the atoms comprising the crystal. Subsequently, wafer 190 is sliced from the crystal, such that the surface is aligned in one of several relative directions, referred to herein as the wafer orientation. This is also referred to as the growth plane of the crystalline silicon. The orientation is important for the electrical properties of wafer 190. The different planes have different arrangements of atoms and lattices, which affects the way the electrical current flows in circuit produced in the wafer. The orientations of silicon wafers are typically classified using Miller indices, such as (100), (111), (001) and (110).

In some embodiments, system 10 may comprise an integrated optical microscope 50, which may be used for navigation and pattern recognition, and in various other applications, such as optical inspection and/or metrology, and/or for reviewing pattern and other features on wafer 190.

In some embodiments, optical microscope 50 is electrically coupled to computer 20 and is configured to produce signals indicative of the pattern in question, so that processor 22 could perform the pattern recognition or any other of the aforementioned applications.

Additionally or alternatively, system 10 may comprise other suitable types of integrated sensors (not shown) configured to provide system 10 with complementary metrology or inspection capabilities.

In some embodiments, system 10 comprises one or more X-ray diffraction (XRD) detectors, such as XRD detectors 54 and 56, which are configured to detect X-ray photons diffracted from planes substantially perpendicular to surfaces 191 and 192 of wafer 190.

Reference is now made to an inset 52, which is a top view of system 10. In some embodiments, XRD detectors 54 and 56 are arranged so as to produce diffraction signal that may be used, as will be described below, for wafer alignment based on X-ray photons diffracted from some planes of the crystal lattice. Signals received from at least one of XRD detectors 54 and 56 may also be used for other application.

The configuration of XRD detectors 54 and 56, optical microscope 50 and calibration gauge 215 (optional) as shown in inset 52, is simplified for the sake of conceptual clarity and is provided by way of example. In other embodiments, system 10 may comprise any other suitable configuration and arrangement of sensors, detectors, microscopes and other suitable components and subsystems.

Reference is now made back to the side view of FIG. 1. In some embodiments, processor 22 may receive from XRD detectors 54 and 56 signals indicative of intensity of Laue diffraction from planes substantially perpendicular to surfaces 191 and 192 of wafer 190. For example, crystallographic plane (555) is perpendicular to the surface of a silicon wafer having a Miller index (001), referred to herein as Si (001). Additionally or alternatively, processor 22 may receive from at least one of detectors 54, 56 and 240 signals indicative of the intensity of a first portion of beam 222 diffracted from any other lattice plane of wafer 240. These signals are also referred to herein as diffraction signals.

In some embodiments, processor 22 is configured to use X-rays diffracted from crystal planes substantially normal to surface 191 and sensed by XRD detectors 54 and 56, so as to determine the orientation of the incident beam and/or the direct beam, relative to the lattice planes of a single-crystal wafer.

In other embodiments, detector 240 is further configured to sense the X-ray photons diffracted from the aforementioned Laue diffraction, and to produce signals indicative of the intensity of the sensed X-ray photons. {Although this is not the case here, added this embodiment to block engineering-around using a single detector for detecting all diffracted and scattered X-ray photons}

In some embodiments, processor 22 may receive from detector 240 signals indicative of the intensity of a portion of beam 222 transmitted through surface 192 and scattered from the HAR features of surface 191, also referred to herein as scattered signals.

In alternative embodiments, calibration gauge 215 may comprise one or more X-ray detectors, positioned to measure the Laue diffraction from planes substantially perpendicular to surfaces 191 and 192 of wafer 190, and to produce signals indicative of the intensity of the measured Laue diffraction, referred to herein as alternative diffraction signals.

In some embodiments, based on one or more of the diffraction signals described above, processor 22 is configured to instruct stage 210 to apply to and x rotations to wafer 190. Processor 22 may use a position of wafer 190 corresponding to a maximal intensity of the diffracted X-ray detected by detector 240, for establishing the inclination angles of beam 130 relative to the crystal lattice in wafer 190.

In these embodiments, processor 22 is configured to establish the inclination angle between the crystal lattice plane and the surface of wafer 190, by using measurements at two or more azimuths that satisfy the diffraction condition. Moreover, processor 22 may apply to beam 130 X-ray diffraction (XRD) methods, for determining the orientation of surfaces 191 and 192, as a calibration technique for non-X-ray based gauges. For example, calibration may be performed by measuring a reference wafer, or any suitable reference mark mounted on a carrier wafer or on the tool, with known inclination angles between the crystal lattice and surfaces 191 and 192.

In these embodiments, detector 240 may comprise various suitable types of detection elements, such as but not limited to, (a) arrays of 1D diodes made from silicon, germanium or CdTe or other suitable materials, and (b) 2D X-ray direct or indirect detection cameras that are based on CCD, CMOS sensors, PIN diodes, or hybrid pixel detector technologies.

In alternative embodiments, system 10 may comprise, in addition to calibration gauge 215, an energy dispersive X-ray (EDX) detector assembly (not shown). The EDX detector assembly comprises a silicon-based or a germanium-based solid-state EDX detector, and an electronic analyzer having a single-channel or multiple channels. The EDX detector assembly is configured to measure X-ray fluorescence emitted, for example, from point 111 of wafer 190, or from a predefined location of a reference wafer used for calibrating system 10, and to produce an electrical signal indicative of the intensity of X-ray fluorescence measured at point 11.

Based on the electrical signal, processor 22 is configured to determine a first position of point 111 and an offset between the first position and a second position acquired at the same time, by calibration gauge 215.

In some embodiments, X-ray source 100 and at least some of the x-ray optics between source 100 and wafer 190, are mounted on a first stage, wafer 190 is mounted on a second stage (e.g., stage 210) and at least one of optical microscope 50 and optical gauges 215 is mounted on a third stage. By comparing between the XRF-based and optical-based signals, processor 22 is configured to identify spatial offset, for example, between an optical pattern recognition camera of optical microscope 50, and X-ray beam 130, and to identify any misalignment between the aforementioned stages of system 10.

In some embodiments, processor 22 is configured to estimate, based on the received electrical signals, motion errors in stage 210, such as leadscrew errors and non-orthogonality between the x-axis and y-axis of stage 210. Furthermore, based on the X-ray fluorescence signals, processor 22 is configured to calibrate stage 210, which calibration is also referred to herein as stage mapping, by estimating offsets between one or more points in the coordinate system of system 10, and the actual positions of the respective points on stage 210.

In some embodiments, system 10 may comprise, in addition to or instead of the EDX assembly described above, a calibration scheme based on attenuation of the X-ray beam that passes through a suitable reference wafer (not shown), also referred to herein as a direct beam. The suitable reference wafer may comprise patterned features adapted to attenuate the direct beam intensity by several tens of percent, so that detector 240 could sense photons of the direct beam without being affected (e.g., saturated). In an exemplary embodiment, the reference wafer may comprise various patterns having any suitable thickness, e.g., about 50 μm, of various suitable elements or alloys, such as but not limited to tungsten (W), tantalum (Ta), gold (Au) or silver (Ag).

In some embodiments, processor 22 may use calibration gauge 215 for aligning between beam 130 and wafer 190 during measurements of structures on product wafers, such as wafer 190, or for calibrating system 10, e.g., after performing maintenance operations so as to prepare system 10 for use in production.

In alternative embodiments described above, system 10 may comprise at least one calibration gauge 215 mounted at the opposite side of wafer 190 so as to measure the inclination of wafer 190 based on signals sensed from surface 191. In an embodiment, processor 22 is configured to calibrate an offset between the inclination angles measured on a blanket and the patterned area of a wafer.

In this embodiment, processor 22 positions calibration gauge 215 to direct the optical beam on a first point located adjacent to the edge of surface 191, which is typically blanket (i.e., without pattern), and measures the inclination of the wafer in x and y axes. Subsequently, processor 22 positions calibration gauge 215 to direct the optical beam at a second point on a pattern in the closest proximity (e.g., 10 mm-20 mm) to the first point, and measures the inclination of the wafer in x and y axes.

In some embodiments, based on the inclination measurements at the first and second points, processor 22 calculates the offset between the blanket and patterned surfaces. Note that the wafers are typically rigid, such that the actual inclination angle is not changing within a distance of 10 mm or 20 mm. The offset may be used as a calibration factor between inclination measurements on blanket and patterned surfaces of wafer 190 or any other type of measured wafer. In some embodiments, processor 22 may set the spot size of the optical beam to be sufficiently small to illuminate only the blanket surface near the wafer edge, but sufficiently large to average the inclination measurement over various features of the pattern.

In some embodiments, wafer 190 comprises a single-crystalline material, and at least one of XRD detectors 54 and 56 is configured to measure the diffraction of beam 220 from a lattice plane of the single-crystal material. In some embodiments, in response to the measured diffraction, processor 22 is configured to calibrate suitable parameters (e.g., orientation) of calibration gauge 215 with respect to the lattice plane.

The particular configuration of calibration gauge 215 is shown in FIG. 1 schematically, so as to demonstrate calibration techniques for improving the measurements of features, such as HAR structures, of wafer 190, carried out by system 10. Embodiments of the present invention, however, are by no means limited to this specific sort of example configuration, and the principles of calibration gauge 215 described above, may be implemented using any suitable configuration.

In an embodiment, system 10 comprise a beam-blocking assembly, referred to herein as a beam blocker 230, made from an X-ray opaque or partially-opaque material.

Beam blocker 230 is mounted in system 10 between wafer 190 and detector 240, and is configured to occlude at least part of beam 220 from irradiating detector 240. In some cases at least part of incident beam 130 may be directly transmitted through wafer 190.

In some embodiments, beam blocker 230 may be positioned so as to partially block the directly-transmitted incident beam over an angular range comparable to the spatial extent of incident beam 130.

Example implementations of beam blockers are depicted in detail in FIGS. 7A and 7B below.

In some embodiments, the opaqueness level and shape of beam blocker 230 affect the signals produced by detector 240, as depicted in FIGS. 8A, 8B, 9A and 9B below.

In some embodiments, the detector assembly may comprise a single detector, or an array of detectors arranged around regions 226. The beam detectors may have a 2D configuration (i.e., an area detector), or a 1D configuration (i.e., a linear detector), and are capable of counting X-ray photons. Detector 240 may be flat, or may have any suitable shape such as an arc angled toward beams 222 and 220. Responsively to the captured photons, 240 is configured to generate electrical signals, which are conveyed, via interface 24, to processor 22. One example implementation of detector 240 is depicted in detail in FIG. 10 below.

In some embodiments, system 10 comprises a vacuum chamber 280, mounted between wafer 190 and detector 240 and configured to reduce undesired scattering of beam 220 from air. In some embodiments, vacuum chamber 280 comprises a metal tube with windows transparent to X-ray at each end, so that beams 220 and 222 can pass between wafer 190 and detector 240.

In some embodiments, system 10 comprises a suitable vacuum pump, such as a roughing pump controlled by processor 22, so as to control the vacuum level in vacuum chamber 280, thereby to improve signal-to-background (SBR) ratio of X-ray photons impinging on the active surface of detector 240.

In some embodiments, system 10 is configured to measure structural (e.g., dimensions and shape) as well as morphological parameters on the aforementioned features of wafer 190. For example, based on the electrical signals received from detector 240, processor 22 is configured to measure a large variety of parameters, such as but not limited to height, depth, width and sidewall angle of the patterned structure, and thickness and density of films at any location across wafer 190.

In some embodiments, processor 22 comprises a model-based software for analyzing the electrical signals received from detector 240. Processor 22 uses a single structural model so as to simulate the X-ray scattering for all incidence angles having a common intensity normalization factor. Subsequently, processor 22 compares the correlation between the measured and simulated intensity distributions, e.g., based on a numerical analysis of a goodness-of-fit (GOF) parameter.

In some embodiments, processor 22 is configured to iteratively adjust the parameters of the model, for example by using an algorithm such as Differential Evolution (DE), so as to minimize the GOF parameter and to obtain the best-fit model parameters.

In some embodiments, processor 22 may reduce the correlation between model parameters by introducing into the model parameter values measured by complementary techniques, for example the width at the upper layer of a feature in question measured by a critical dimension scanning electron microscope (CD-SEM).

In some embodiments, system 10 may comprise one or more calibration targets having arrays of periodic features externally characterized using any suitable reference technique other than SAXS, e.g., atomic force microscope (AFM). Processor 22 may use the calibration targets as a reference for calibrating the aforementioned assemblies of system 10 and for alignment between (a) beam 130 and wafer 190, and (b) between beam 222 and detector 240.

In some embodiments, based on the SAXS configuration and the software algorithms described above, system 10 is configured to detect disorder parameters in the features in question across wafer 190. For example, horizontal and vertical roughness of the sidewalls and pitch variation, such as a pitch-walking error that may appear, for example, in multi-patterning lithography processes or tilting and twisting of the channel holes due to the etch process in 3D NAND memory.

The configuration of system 10 is shown by way of example, in order to illustrate certain problems that are addressed by embodiments of the present disclosure and to demonstrate the application of these embodiments in enhancing the performance of such a system. Embodiments of the present invention, however, are by no means limited to this specific sort of example system, and the principles described herein may similarly be applied to other sorts of X-ray systems used for measuring features in any suitable type of electronic devices.

Figure 2:
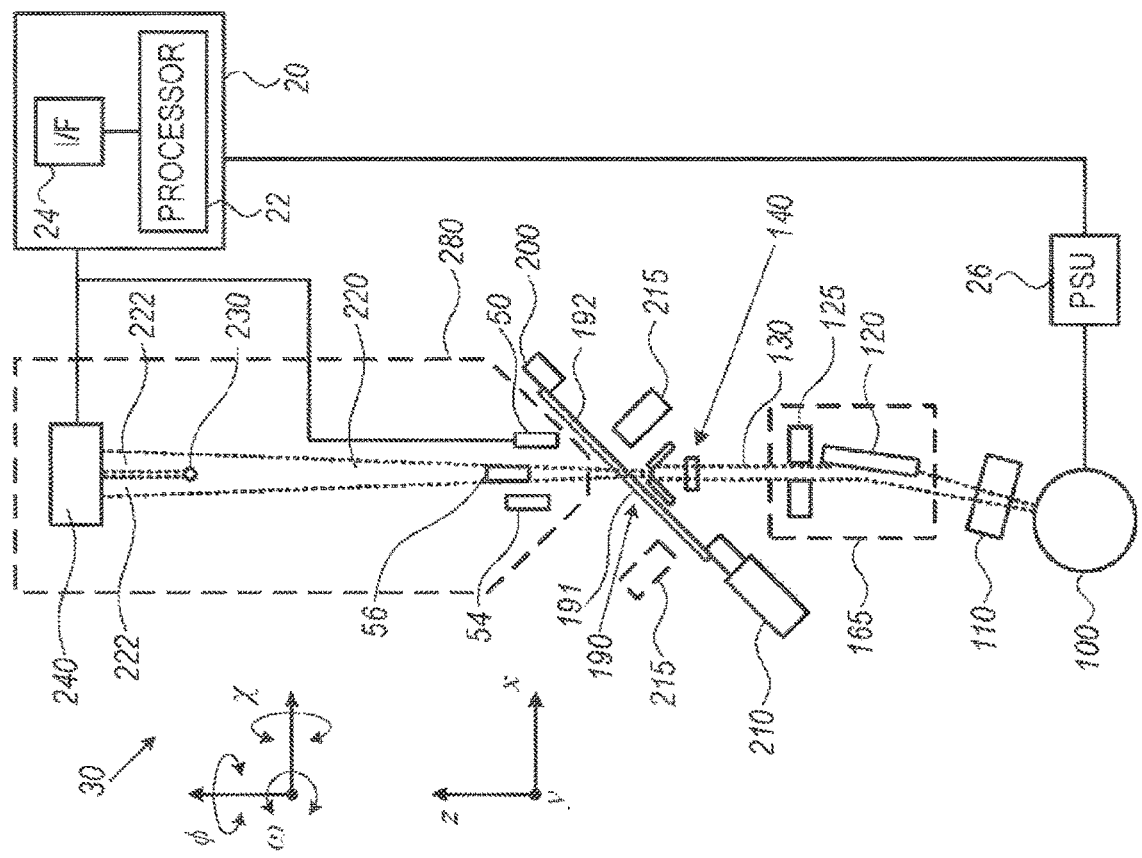

FIG. 2 is a schematic illustration of a SAXS system 30, in accordance with another embodiment of the present invention. In some embodiments, the configuration of SAXS system 30, also refers to herein as "system 30" for brevity, is similar to the configuration of system 10 with wafer 190 tilted, also referred to herein as rotated, at any suitable angle (e.g., 45 degrees) relative to incident beam 130.

In some embodiments, processor 22 is configured to instruct stage 210 to tilt wafer 190 about a tilt axis, such as azimuthal rotation to about y-axis, in a plane of wafer 190, and to orient at least one of the aforementioned slit assemblies parallel to the tilt axis.

In some embodiments, system 30 is configured to measure structures of wafer having a low aspect ratio (e.g., height over width ratio smaller than ten). As described above, processor 22 is configured to rotate wafer 190 relative to incident beam 130, or alternatively, to rotate incident beam 130 relative to wafer 190. Processor is configured to carry out the rotation over a range of several tens of degrees around y-axis, referred to herein as to rotation.

In some embodiments, the range of rotation angles may be symmetric, for example ±50 degrees relative to the surface of wafer 190 shown, for example, in FIG. 1 above. In alternative embodiments, processor 22 may carry out asymmetric rotation (e.g., −10 degrees to +60 degrees), for example by instructing stage 210 to rotate wafer 190 to a desired angle within the aforementioned range.

In some embodiments, processor 22 is configured to measure a profile of a structures in more than one plane, for example, by rotating the azimuth of wafer 190 relative to beam 130. In the context of the present disclosure and in the claims, the term "profile" refers to a shape of a single sidewall of a measured feature, or a change of width between two adjacent sidewalls along the depth or height thereof or shift of the center of the hole as a function of depth. Additional asymmetry of the holes such as elliptical rather than circular cross section will usually require measurements at different azimuth and chi axes.

For example, processor 22 may measure the profile of a feature in a selected xy-plane using a series of intensity measurements carried out at different azimuthal angles. In some embodiments, processor 22 may implement this technique for measuring the diameter of a channel hole in a 3D NAND memory device, or the width of a via and/or metal line of local interconnect structures of a logic device.

In an embodiment, beam blocker 230 is positioned in close proximity to detector 240. In another embodiment, beam blocker 230 may be positioned in close proximity to wafer 190.

Figure 3:
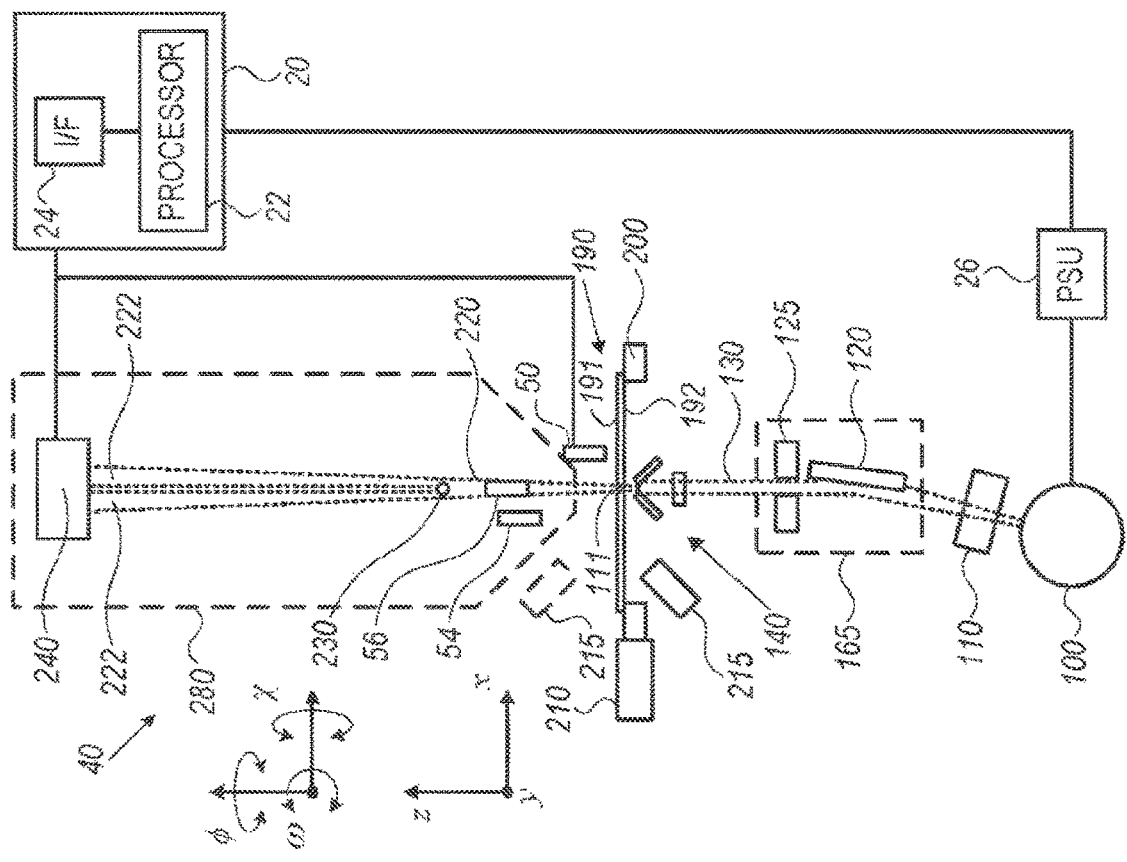

FIG. 3 is a schematic illustration of a SAXS system 40, in accordance with another embodiment of the present invention. In some embodiments, the configuration of SAXS system 40, also refers to herein as "system 40" for brevity, is similar to the configuration of system 10 with beam blocker 230 positioned in close proximity to wafer 190.

In some embodiments, processor 22 is configured to control the position of beam blocker 230 at any suitable position along the path of beam 220, so as to reduce the level of undesired background and stray scattering sensed by detector 240.

In some embodiments, processor 22 may set the position of beam blocker 230 at one or more predefined mounting locations along the path of beam 220. Additionally or alternatively, processor 22 may adjust the position of beam blocker 230 by controlling a motorized stage (not shown) configured to move and hold beam blocker 230 at any suitable position between wafer 190 and detector 240.

The structure of beam blocker 230 and related assemblies, such as the aforementioned stage, are described in detail, for example, in FIG. 7A below. Moreover, embodiments related to the functionality and applications of beam blocker 230 in measuring features in question of wafer 190 are described in detail in FIGS. 8B and 9B below.

The configurations of systems 10, 30 and 40 are provided by way of example. Embodiments of the present invention, however, are by no means limited to this specific sort of example systems, and the principles described herein may similarly be applied to other sorts of metrology systems, such as but not limited to, reflection-based X-ray metrology systems having both the X-ray source and detector assemblies located at the same side of the wafer.

FIG. 4 is a schematic illustration of beam conditioning assembly 165, in accordance with an embodiment of the present invention. Beam conditioning assembly 165 may be used in any of systems 10, 30 and 40 described above, or in any other suitable configuration of a metrology system that applies X-ray beams for measuring features produced in wafer 190 or any other type of wafer.

In some embodiments, beam conditioning assembly 165 comprises multiple sets of slit assemblies, referred to herein as assemblies 110, 300 and 320. Note that as shown in FIGS. 1-3, assembly 110 may be external to beam conditioning assembly 165, or incorporated therein as shown in FIG. 4. Similarly, assembly 320 may be part of, or external to, beam conditioning assembly 165.

As described in FIG. 1 above, the slit assemblies of beam conditioning assembly 165 are configured to block undesired scattered X-ray radiation deflected from the designed optical path of beam 130, and/or to adjust the divergence, intensity and spot-size of beam 130.

In some embodiments, beam conditioning assembly 165 comprises mirror 120, that is configured to shape the optical properties of beam 130 after the beam passes through assembly 110, as described in FIG. 1 above.

In some embodiments, mirror 120 comprises a curved substrate 122 coated with multiple layers 124, for example, alternating thin (e.g., an order of one micron) layers of a heavy element, such as W, Mo or nickel (Ni), with a light element, such as carbon or silicon. Such mirrors for X-ray optics are provided by several suppliers, such as Incoatec GmbH (Hamburg, Germany), AXO DRESDEN GmbH (Dresden, Germany) or Xenocs (Sassenage, France). In some embodiments, the configuration of mirror 120 is adapted to provide a collimated beam in two directions (x,y). In other embodiments, mirror 120 is configured to collimate beam 130 in one direction (e.g., x-direction) and to focus beam 130 in an orthogonal direction (e.g., y-direction).

In some embodiments, mirror 120 is configured to focus beam 130 on surface 191, so as to obtain the smallest spot-size. In other embodiments, focusing the X-ray beam on detector 240 may provide system 10 with improved angular resolution of the X-ray beam sensed by detector 240, e.g., in imaging of the HAR structures.

In case of a 2D collimated beam, beam conditioning assembly 165 may comprise two optics, e.g., two mirrors 120, facing one another so as to increase the solid angle (i.e., a two-dimensional angle) collected from source 100 and to increase the X-ray flux of beam 130.

In some embodiments, beam conditioning assembly 165 may comprise any suitable configuration of multiple multi-layered mirrors, such as mirror 120, mounted on one or more motorized actuators controlled by processor 22. Processor 22 may arrange the configuration of each mirror 120 of beam conditioning assembly 165, so as obtain the most suitable measurement conditions by adjusting the optical properties of beam 130.

In some embodiments, beam conditioning assembly 165 comprises a crystal 310, made from a single crystal of germanium (Ge) or any other suitable material. Crystal 310 has a v-shaped channel 312 comprising an entrance aperture 316, an exit aperture 318, and opposing internal faces 314 and 315 arranged so that channel 312 tapers from entrance aperture 316 to exit aperture 318, which is smaller than aperture 316.

In some embodiments, beam 130 passes through slit assembly 110 into mirror 120 and subsequently passes through slits assembly 300 and entrance aperture 316. Subsequently, beam 130 impinges on internal face 314 and thereafter on internal face 316 and exits crystal 310 through exit aperture 318.

In some embodiments, beam conditioning assembly 165 serves as a dispersing element, and additionally as beam compressing optic configured to reduce the spot size of beam 130 after exiting slit assembly 320 of assembly 165. The configuration of beam conditioning assembly 165 enables the beam compressing, and yet, reduces the loss of flux compared to alternative techniques, such as a crystal with a channel having parallel faces or using one or more slits having one or more narrow apertures.

In the example configuration of FIG. 4, slit assemblies 110, 300 and 320 are mounted before and after mirror 120 and crystal 310 so as to improve the shaping of beam 130 along the optical path described above. In other embodiments, beam conditioning assembly 165 may comprise any other suitable configuration of slit assemblies interposing between source 100 and mirror 120, and/or between mirror 120 and crystal 310, and/or between crystal 310 and slit assembly 140 or any other component or assembly of any of systems 10, 30 and 40. For example, slit assembly may be removed from the configuration of assembly 165 and may be excluded from the configuration of any of systems 10, 30 and 40.

FIG. 5 is a schematic illustration of slit assembly 140, in accordance with an embodiment of the present invention. As shown in FIGS. 1-3, slit assembly 140, also referred to herein as a beam limiter, is positioned between source 100 and surface 192 of wafer 190, so as to intercept beam 130.

In some embodiments, slit assembly 140 comprises two or more movable plates 520 positioned along a translation axis 522 in a predefined distance from one another so as to define a slit 512. The distance between plates 520 may be controllable by processor 22, for example using one or more actuators (not shown) for moving one or more plates 520 along translation axis 522. Alternatively, the distance between plates may be constant, e.g., by not moving plates 520 relative to one another, or by selecting a suitable type of slit 512 having static plates positioned at a desired distance from one another.

In some embodiments, slit assembly 140 comprises two or more movable blades 510A and MOB, which are not parallel to one another and have respective edges 514A and 514B positioned in close proximity to one another, so as to define a micro-slit 515.

In some embodiments, micro-slit 515 is configured to block part of beam 130 that impinges on blades 510A and 510B without producing scattered beams, thus blades 510A and 510B are also referred to herein as "anti-scatter blades." In some embodiments, blades 510A and 510B are made from single-crystal materials such as tantalum (Ta), Ge, indium-phosphide (InP), or from polycrystalline materials such as tungsten-carbide, and have a thickness of about 1 mm or any other suitable thickness.

In the context of the present disclosure, and in the claims, the terms "single-crystal" and "mono-crystal" are used interchangeably and refer to materials having a structure made from one crystal.

In some embodiments, slit assembly 140 comprises actuators 500A and 500B, configured to move respective blades 510A and 510B along respective translation axes 516A and 516B, so as to adjust the width of micro-slit 515. In an embodiment, at least one of translation axes 516A and 516B is substantially orthogonal to translation axis 522 in the x-y plane.

In some embodiments, actuators 500A and 500B comprise one or more piezoelectric linear motors, for example the Piezo LEGS Linear 6G series provided by PiezoMotor (Uppsala, Sweden) or similar products from other vendors such as Physik Instrumente (Karlsruhe, Germany). These motors can be supplied with integrated high-resolution position sensors.

In some embodiments, processor 22 is configured to position slit assembly 140 in any suitable proximity to surface 192 of wafer 190. The design of micro-slit 515 allows processor 22 to position slit assembly 140 such that at least one of edges 514A and 514B is positioned at a distance smaller than ten millimeters (10 mm) from surface 192. In other embodiments, processor 22 may position micro-slit 515 at any selected distance, e.g., between 100 mm and a few millimeters, from surface 192.

In some embodiments, the configuration of micro-slit 515 allows processor 22 to position slit assembly 140 in close proximity (e.g., down to a few millimeters) to surface 192 even when wafer 190 is tilted, as shown in FIG. 2 above.

In some embodiments, processor 22 is configured to set the distances between (a) micro-slit 515 and surface 192, (b) edges 514A and 514B, and (c) plates 520, so as to obtain the desired optical properties of beam 130 before impinging on surface 192 and interacting with the structures and bulk of wafer 190.

Reference is now made to an inset 502, which is a top view of the interception between slit assembly 140 and beam 130. In the example of inset 502, processor 22 is configured to change the spatial shape of beam 130 from a round shape of a circle 524, to a rectangular shape shown by a dashed rectangle 526, by moving (a) blades 510A and 510B along respective translation axes 516A and 516B, and (b) plates 520 along translation axis 522. Note that in this example, only the portion of beam 130 within the area of dashed rectangle 526 impinges on surface 192, whereas the remaining part of beam 130, located between the edges of circle 524 and dashed rectangle 526, is blocked by slit assembly 140. As described above and shown in inset 502, at least one of translation axes 516A and 516B is orthogonal to translation axis 522.

The configuration of slit assembly 140 is simplified for the sake of conceptual clarity and is provided by way of example. In other embodiments, slit assembly 140 may comprise more than two blades 510A and 510B, and/or more than two plates 520. Moreover, the edge of plates 520 and/or edges 514A and 514B may have any suitable shape, for example, both plates 520 and edges 514A and 514B may have an arc intruding into the area of the respective plates 520 and blades 510A and 510B, so as to form a round shape, rather than the aforementioned rectangular shape, of beam 130 exiting from slit assembly 140.

In other embodiments, translation axes 516A and 516B may be parallel or not-parallel to one another, and at least one of translation axes 516A and 516B may not be orthogonal to translation axis 522.

Figure 6:
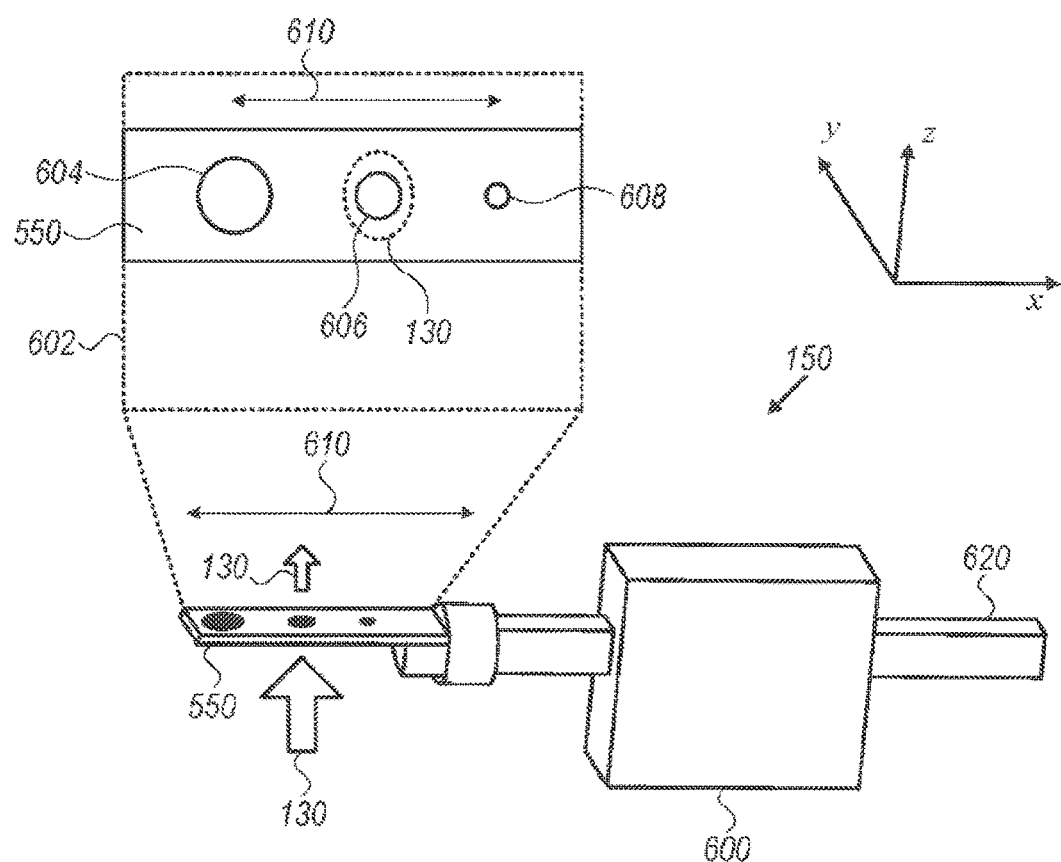

FIG. 6 is a schematic illustration of a slit assembly 150, in accordance with another embodiment of the present invention. Slit assembly 150 may replace, for example, slit assembly 140 shown in FIGS. 1-3.

In some embodiments, slit assembly 150 comprises a 3-pinhole collimation system, also referred to herein as apertures 604, 606 and 608, arranged along a translation axis 610 of a movable blade 550.

In some embodiments, slit assembly 150 comprises an actuator 600, configured to move blade 550 along translation axis 610.

Reference is now made to an inset 602, which is a top view of an interception between beam 130 and blade 550.

In some embodiments, each aperture 604, 606 and 608 comprises a fixed size aperture, such as a SCATEX scatterless pinhole produced by Incoatec GmbH (Hamburg, Germany) In the example of blade 550, apertures 604, 606 and 608 have a round shape and each aperture has a different diameter, e.g., between about 20 μm and 500 μm.

In some embodiments, blade 550, which serves as a frame of the scatterless pinholes, is made from Ge for X-ray beams having low energy of photons, or from Ta for beams having photons with higher energies.

In some embodiments, the configuration of apertures 604, 606 and 608 is adapted to reduce undesired parasitic scattering typically occurs when an X-ray beam passes through other types of apertures.

In some embodiments, actuator 600 may comprise any suitable type of motor coupled to a drive rod 620, that is configured to move blade 55 along translation axis 610.

In other embodiments, the configuration of actuator 600 may be similar to the configuration of actuators 500A and 500B described in FIG. 5 above.

In some embodiments, processor 22 is configured to determine the optical properties of beam 130 by instructing actuator 600 to position a selected aperture of blade 550 to intercept beam 130. In the example of FIG. 6, actuator 600 positions aperture 606 so that beam 130 passes therethrough, and the portion of beam 130 that exceeds the area within aperture 606 will be blocked.

FIG. 7A is a schematic illustration of beam blocker 230, in accordance with an embodiment of the present invention. In some cases, at least part of incident beam 130 that impinges on surface 192 is transmitted directly through wafer 190 and exits from surface 191, as part of beam 220, without being scattered. The directly transmitted part of beam 220 is referred to herein as a "direct beam."

In some embodiments, beam blocker 230 is positioned so as to attenuate the X-ray radiation of the direct beam, typically at the center of beam 220. This attenuation is necessary, for example, to prevent damage to detector 240 and/or to prevent the detector from saturation and from operating in a non-linear region. On the other hand, too large attenuation would eliminate the detection of essential signals that may be used by processor 22 for tracking the angular position and intensity of the center of beam 220. Thus, the attenuation of beam blocker 230 is typically selected so that the intensity of the transmitted beam is attenuated to a few hundreds or thousands of photons per second at detector 240.

In some embodiments, beam blocker 230 comprises one or more beam blocking elements, such as a beam stopper 232, typically having an ellipsoidal-shape or any other suitable shape. In some embodiments, beam stopper 232 is made from an X-ray partially-opaque material, also referred to as high-Z materials, typically comprising metal elements, such as tantalum or tungsten, and/or any suitable metal alloys.

As described above, the attenuation of beam stopper 232 is selected to enable reliable measurement of the angular position and intensity of beam 220, and at the same time prevent damage and non-linear distortion in the sensing of detector 240.

In some embodiments, beam stopper 232 is further configured to minimize background intensity from sources such as scattering with air or fluorescence and other scattering from the electronics behind the active region or surface of detector 240. Note that the active region of detector 240 may be partially illuminated due to the limited thickness or low absorption of the detector material, e.g. 450 µm of silicon, with high energy X-rays having an energy of 10 keV or higher.

In some embodiments, beam stopper 232 has a curvy and/or smooth edge so as to reduce the scattering intensity of the direct beam.

In some embodiments, beam blocker 230 comprises a matrix 236, also referred to herein as a mount. Matrix 236 is made from a block of material adapted not to scatter X-rays, such as, but not limited to, diamond or polymers such as thin-sheets of biaxially-oriented polyethylene terephthalate (BoPET) polyester, also referred to herein as Mylar™, or poly (4,4'-oxydiphenylene-pyromellitimide) polyimide, also referred to herein as Kapton®.

In some embodiments, beam stopper 232 is mounted in a recess (not shown) formed in a matrix 236, and is mechanically supported by the matrix material without using an adhesive that may scatter X-rays, and therefore, may increase the level background signals to the measurements. Since adhesives may degrade under X-ray irradiation with time, absorbing features can be fabricated using techniques used for electronics manufacturing such as depositing thin adhesion and seed layers with appropriate metallization and then electroplating a thick X-ray absorbing material such as gold (Au), or by using of additive printing techniques using inks incorporating a high concentration of metallic nanoparticles followed by an annealing process.

In other embodiments, beam stopper 232 may be coupled to matrix 236 using any other suitable technique, such as an adhesive that does not scatter X-rays. Note that beam stopper 232 is adapted to attenuate the direct beam, such that the surrounding scattered beam, shown in FIG. 1 as beam 222, is not attenuated since the support structure is transparent to the scattered X-rays of beam 222.

In some embodiments, the material of beam stopper 232 allows sufficient intensity of the direct beam to be partially transmitted, so that processor 22 may determine the intensity and position of the direct beam sensed by detector 240 without moving beam stopper 232 away from the direct beam.

In some embodiments, beam blocker 230 comprises a mount, also referred to herein as a high-precision motorized stage 233, which is controlled by processor 22 and is configured to move along one or more axes. For example translation x-axis and y-axis in the configuration of systems 10 and 30 shown, respectively, in FIGS. 1 and 2 above.

In some embodiments, matrix 236 is mounted on stage 233 so that processor 22 sets the position of beam stopper 232 relative to the direct beam transmitted through wafer 190. In other embodiments, stage 233 may comprise rotational axes (not shown) so as to improve the alignment of beam stopper 232 with beam 220, and particularly with the direct beam thereof. In another embodiment, stage 233 is also configured to move in z-axis so as to enable the configuration of system 40, shown in FIG. 3 above, or to further improve the attenuation level of the direct beam.

In some cases, the attenuation of the direct beam may be sufficiently high by wafer 190 or by any other element of system 10. Thus, in other embodiments, processor 22 is configured to move beam blocker 230 away from the path of beam 220. In these embodiments, beam stopper 232 is not intercepting beam 220, so that processor 22 may monitor the intensity and position of the direct X-ray beam, based on the direction and intensity of the direct beam sensed by detector 240.

The configuration of beam blocker 230 is simplified for the sake of conceptual clarity and is provided by way of example. In other embodiments, beam blocker 230 may comprise any other suitable components and/or assemblies arranged in any other suitable configuration for attenuating the intensity of the direct beam and/or for managing the sensing of one or more beams 222 scattered from wafer 190. For example, the beam-blocker may comprise multiple beam stoppers 232, or two narrow wires whose separation can be adjusted so as to change the effective width of the blocker.

FIG. 7B is a schematic illustration of beam blocker 330, in accordance with an embodiment of the present invention. Beam blocker may replace, for example, beam blocker 230 of FIG. 1 above. In some embodiments, beam blocker 330 comprises a matrix 333 made from a synthetic diamond, or the materials of matrix 236 described above, or any other suitable material adapted not to scatter X-rays of beam 220.

In some embodiments, beam blocker 330 comprises multiple types of beam stoppers, each of which made from a suitable material. For example, a gold-based beam stopper having a thickness of about 50 μm, or any other suitable thickness, or a tungsten-based beam stopper having a typical thickness between 50 μm and 100 μm, or any other suitable thickness. The tungsten-based beam stopper may be produced, for example, by laser cutting of a suitable tungsten foil.

In some embodiments, the beam stoppers are coupled to matrix 333, using any suitable technique, such as recessing the matrix and disposing the beam stopper into the recessed pattern, or any other suitable method, such as those described in FIG. 7A above. For example, gold may be deposited into the recessed pattern, and the laser-cut tungsten pieces, described above, may be attached to the recessed pattern.

In some embodiments, beam blocker 330 comprises multiple geometric shapes and arrangements of beam stoppers. In the example of FIG. 7B, beam blocker 330 comprises five bar-shaped beam stoppers arranged in a row along X-axis, at a 5 mm distance from one another, and having a similar length (measured along Y-axis) of about 10 mm. The bar-shaped beam stoppers have different width, e.g., between 0.1 mm and 0.5 mm. For example, beam stoppers 332 and 334 have a width (measured along X-axis) of about 0.5 mm and 0.3 mm, respectively, and the bar between beam stoppers 332 and 334 has a width of about 0.4 mm.

In some embodiments, beam blocker 330 comprises five square-shaped beam stoppers having the same arrangement along X-axis (e.g., width and distance) of the bar-shaped beam stoppers described above. For example, beam stoppers 336 and 338 have widths of 0.4 mm and 0.2 mm, respectively, and the square-shaped beam stopper laid out therebetween has a width of 0.3 mm.

In some embodiments, beam blocker 330 may comprise other shapes of beam stoppers. For example, T-shaped beam stoppers 335 and 339, and L-shaped beam stoppers 337, all arranged in any suitable orientation and having any suitable width, length and distance from one another. In the example of FIG. 7B, the T-shaped and L-shaped beam stoppers have a typical width of 0.2 mm, length between 1 mm and 2 mm, and distance of about 5 mm between adjacent beam stoppers. Additionally or alternatively, the T-shaped and L-shaped beam stoppers may be used as alignment marks for accurately positioning a selected beam stopper to block the beam described above.

The configuration of beam blocker 330 is provided by way of example. In other embodiments, beam blocker 330 may comprise any other set of beam stoppers, having any suitable shape and dimensions and arranged in any suitable layout.

FIG. 8A is a schematic illustration of an image 402 indicative of the intensity of beam 220 sensed by detector 240 in the absence of beam blocker 230, in accordance with another embodiment of the present invention. In the example of FIG. 8A, incident beam 130, which is collimated in both x-axis and y-axis, impinges on wafer 190 comprising a hexagonal array of features, such as HAR capacitors of a DRAM device.

In some embodiments, image 402 comprises a spot 420, indicative of the intensity of the direct beam sensed by detector 240. Image 402 further comprises multiple spots 410, indicative of respective beams 222 scattered from the hexagonal array of the DRAM device. In some embodiments, the gray level of spots 410 and 420 is indicative of the intensity of beam 220 (e.g., flux of photons and respective energy thereof) sensed by detector 240. In the present example, white color is indicative of high intensity, and darker colors indicative of lower intensities sensed by detector 240.

In some embodiments, image 402 comprises locations 404 positioned between spots 410 and spot 420, within region 226 of detector 240, also shown in FIG. 1 above. Image 402 further comprises a region 400, referred to herein as a background, located out of region 226 of detector 240.

In some embodiments, processor 22 is configured to set the properties of beam 130, such that (a) spots 410 have coherent scattering, and therefore appear bright, (b) locations 404 between spots 410 have incoherent scattering, and therefore appear darker than spots 410 located within a virtual circle 405 surrounding an area in close proximity to spot 420, and (c) region 400 has no scattering, or a scattering level below a predefined threshold, and therefore appears in black.

In some embodiments, in the absence of beam blocker 230, the high intensity of the direct beam causes saturation of detector 240 at the area of spot 420, and therefore, non-linear sensing across region 226. Therefore, spot 420 appears in white color and the area within circle 405 appears substantially brighter than the peripheral area of region 226.

As described above, due to the coherent scattering, spots 410 appear brighter than locations 404 within the area of circle 405. However, due to the increase in the incoherent background from detector 240, spots 410 appear darker than locations 404 at the periphery of region 226. Thus, the reliable sensing area of detector 240 is limited to the area within circle 405, subject to the limited contrast caused by the increased background (incoherently X-ray intensity) from detector 240.

FIG. 8B is a schematic illustration of an image 406 indicative of the intensity of beam 220 sensed by detector 240 in the presence of beam blocker 230, in accordance with an embodiment of the present invention. Similar to the example of FIG. 8A, incident beam 130, which is collimated in both x-axis and y-axis, impinges on wafer 190 comprising the hexagonal array HAR capacitors of the aforementioned DRAM device.

In some embodiments, image 406 comprises a spot 430, indicative of the intensity of the direct beam sensed by detector 240. Image 406 further comprises multiple spots 440, indicative of respective beams 222 scattered from the hexagonal array of the DRAM device.

In some embodiments, beam blocker 230 attenuates the intensity of the direct beam sensed by detector 240, therefore, spot 430 appears in a dark gray color and detector 240 does not introduce a significant background intensity shown, for example, in FIG. 8A above.

In some embodiments, the sensed intensity of the coherent scattering from the HAR features appears stronger within circle 405 compared to the periphery of region 226. Yet, the linear sensing of detector 240 reduces the intensity detected from locations 404 to the background level of region 400. Thus within region 226, the contrast between all spots 440 and regions 404 is sufficiently high to conduct measurements at high accuracy and precision. The term "accuracy" refers to measuring the actual size of the feature in question, and the term "precision" refers to the repeatability of multiple measurements carried out on a given feature in question.

In some embodiments, the presence of beam blocker 230 allows processor 22 to monitor the partially attenuated direct beam (e.g., during the measurements of the HAR structures) so as to control parameters indicative of the properties of beams 130 220, such as the incident flux of both beams 130 and 220 at respective positions on wafer 190 and detector 240.

FIG. 9A is a schematic illustration of an image 502 indicative of the intensity of beam 220 sensed by detector 240 in the absence of beam blocker 230, in accordance with another embodiment of the present invention. In the example of FIG. 9A, incident beam 130, which is collimated in x-axis and focused on wafer 190 (e.g., on surface 191) in y-axis, impinges on wafer 190 comprising an array of 1D (lines) or long and narrow 2D features, such as lines or trenches in a device or dedicated metrology pad in the scribe-line or elsewhere on die.

In some embodiments, image 502 comprises a spot 526, indicative of the intensity of the direct beam sensed by detector 240. Image 502 further comprises multiple features 510, indicative of respective beams 222 scattered from the array. In some embodiments, the gray level of features 510 and spot 526 is indicative of the intensity of beam 220 sensed by detector 240. As described in FIG. 8A above, white color is indicative of high intensity, and darker colors indicative of lower intensities sensed by detector 240.

In some embodiments, image 502 comprises locations 504 positioned between features 510 and spot 526, within region 226 of detector 240. Image 502 further comprises region 400, located out of region 226 of detector 240.

In some embodiments, processor 22 is configured to set the properties of beam 130, such that features 510 have coherent scattering, locations 504 have incoherent scattering, and region 400 has no scattering.

In some embodiments, in the absence of beam blocker 230, the high intensity of the direct beam causes sufficiently high background intensity and loss of contrast across region 226. Therefore, spot 526 appears in white color and the area within a virtual rectangle 505 appears substantially brighter than the peripheral area of region 226.

As described above, due to the coherent scattering, features 410 appear brighter than locations 504 within the area of circle 405. However, the increased background from detector 240, results in loss of contrast at the periphery of region 226. Thus, the reliable sensing area of detector 240 is limited to the area within rectangle 505. Note that in the absence of beam blocker 230, the shape and size of the reliable sensing area of detector 240 depends on the type (e.g., geometry) of the measured features (e.g., round in FIG. 8A and linear in FIG. 9A), the properties of beam 130, and other parameters of the system, such as the tilt angle of wafer 190 shown, for example, in system 30 of FIG. 2 above.

FIG. 9B is a schematic illustration of an image 506 indicative of the intensity of beam 220 sensed by detector 240 in the presence of beam blocker 230, in accordance with an embodiment of the present invention. In some embodiments, processor 22 sets incident beam 130 in a like manner to the setting described in FIG. 9A above. Therefore, beam 130, which is collimated in x-axis and focused in y-axis, impinges on wafer 190 comprising the aforementioned layout of the lines or trenches.

In some embodiments, image 506 comprises a spot 530, indicative of the intensity of the direct beam sensed by detector 240. Image 506 further comprises multiple features 540, indicative of respective beams 222 scattered from the array of the NAND flash memory device.

In some embodiments, beam blocker 230 attenuates the intensity of the direct beam sensed by detector 240, therefore, spot 530 appears in a dark gray color and detector 240 is not saturated by excess intensity.

In some embodiments, the sensed intensity of the coherent scattering from the lines or trenches, appears stronger within rectangle 505 compared to the periphery of region 226. Yet, the linear sensing of detector 240 reduces the intensity detected from locations 504 to the background level of region 400. Thus within region 226, the contrast between all features 540 and regions 504 is sufficiently high to conduct measurements at high accuracy and precision.

As described in FIG. 8B above, the presence of beam blocker 230 allows processor 22 to monitor the partially attenuated direct beam so as to control parameters indicative of the properties of beams 130 220.

FIG. 10 is a schematic illustration of a scanning scheme in which detector 240 comprising an array of sensors 243 is moved at steps smaller than the inter-distance of the sensors, for improved angular resolution, in accordance with an embodiment of the present invention. In some embodiments, detector 240 comprises an array of 1D or 2D sensor elements, referred to herein as sensors 243. In the example of FIG. 10 detector 240 comprises 2D sensors 243, each of which has a predefined pitch in x-axis and in y-axis, referred to herein as Px and Py, respectively.

In the context of the present disclosure, and in the claims, the terms "Px" and "width axis" are used interchangeably, and the terms "Py" and "height axis" are also used interchangeably. In some embodiments, each sensor 243 is configured to produce electrical signals indicative of the intensity of the direct beam and of beam 222 impinging on the active surface thereof. In some embodiments, processor 22 is configured to produce an image, referred to herein as a pixel, based on the electrical signals received from each sensor 243. Thus, the size of each pixel in x and y axes is typically on an order of Px and Py, respectively.

In some embodiments, detector 240 is mounted on a motorized stage 246 comprising translation and rotation motors (not shown). In some embodiments, the translation motors are configured to move detector 240 in x-axis and y-axis for scanning in the x-y plane, and in z-axis for improving the focus of beam 222 on the active surface of sensors 243. In some embodiments, the translation motors are configured to rotate detector 240, for example about z-axis, for aligning sensors 243 with the direction of the scattered X-ray photons of beam 222.

In some embodiments, stage 246 comprises high-precision encoders and/or interferometers (not shown) configured to measure the translation and rotation positions of the respective axes of stage 246 at a predefined frequency.

In some embodiments, system 10 may comprise a motion control assembly (not shown), which is controlled by processor 22. The motion control assembly comprises a controller (not shown) configured to determine, for each motor, a respective motion profile (e.g., speed, acceleration and deceleration). The motion control assembly further comprises one or more drivers, which are controlled by the aforementioned controller and are configured to drive the motors of stage 246 to move in accordance with the respective motion profile and based on the current position measured by the respective encoder or interferometer of each axis.

In other embodiments, processor 22 is further configured to control the motion of stage 246, and may be used for this purpose, in addition to or instead of the controller.

In some embodiments, stage 246 is configured to move detector 240 along x-axis and y-axis in selected respective step sizes, referred to herein as Dx and Dy, which are typically substantially smaller than respective Px and Py.

Thus, stage 246 is configured to move detector 240 in steps equal to a fraction of the pixel size described above.

Equations 1 and 2 below provide explicit expressions for estimating the size of Dx and Dy, respectively:

$$Dx = \rho_x/m \tag{1}$$

$$Dy = \rho_y/n \tag{2}$$

where n and m are typically integer numbers indicative of the selected step size in x-axis and y-axis, respectively.

In some embodiments, processor 22 is configured to receive the electrical signals produced by a given sensor 243, and to set the rotation speed of wafer 190 in response to the received signals. Note that the acquisition time of sensor 243 inversely depends on the intensity of the sensed X-rays. For example, if the electrical signals received at a given area of wafer 190 are indicative of a relatively low intensity of the sensed X-rays, processor 22 may instruct the controller to decelerate the motion of detector 240 at the given area so as to increase the flux of photons and thereby to increase the SBR sensed at the given area.

Similarly, in case of a relatively high intensity of the sensed X-rays at different rotation angles of wafer 190, processor 22 may instruct the controller to accelerate the motion of detector 240 at the different area so as to increase the measurement throughput.

In some embodiments, processor 22 or a controller of detector 240 is configured to control the acquisition time so that detector 240 received a predefined intensity range across the measured positions on wafer 190. The predefined intensity range enables sufficient intensity to obtain high SBR, and yet, prevents saturation and non-linear sensing in the respective sensors of detector 240.

In some embodiments, processor 22 is configured to acquire, from a given sensor 243, an image based on the intensity of the scattered photons of beam 222, at an acquisition time, t. Therefore, in an array of an n-by-m sub-pixels, processor 22 allocates for each sub-pixel a uniform time interval of t/(m×n), so as to acquire n-by-m sub-images within the acquisition time t.

In some embodiments, processor 22 is configured to move detector 240 in a raster pattern along the x and y axes using respective step sizes Dx and Dy, so as to measure the intensity distribution of each time interval at a different position of detector 240 spanning the total area of a single pixel.

In some embodiments, processor 22 is configured to combine the n-by-m sub-images received from the respective sensor 243, into a single pixel. Processor 22 may apply to the received sub-images any suitable method, such as but not limited to, a simple arithmetic interpolation, or any suitable image processing algorithms, so as to increase the resolution (e.g., angular resolution) of the combined image.

In some embodiments, by applying the sub-pixel stepping and combining the n·m sub-images to form a single image having improved angular resolution, processor 22 overcomes a resolution limitation of SAXS systems caused by the available pixel size of the respective detector assembly.

Equation (3) below provides an expression for calculating the angular resolution Δθ of a detector having a pixel size p, positioned at a distance d from the wafer in question:

$$\Delta\theta = p/d \tag{3}$$

Based on a typical pixel size of 172 um a distance of about 5-6 meters is required to obtain an angular resolution on an order of 0.3 mrad-0.5 mrad.

In some embodiments, by using the sub-pixel stepping and combining the n×m sub-images, as described above, the designed distance between detector 240 and wafer 190 may be reduced, for example by a factor of three, e.g., to less than two meters, while maintaining the required angular resolution.

In some embodiments, processor 22 is configured to reduce the overall cycle time of measuring the features in question of wafer 190 by increasing the speed of detector 240 to the maximal level that enables acquiring the sub-images at sufficiently-high SBR as will be described in detail hereinbelow.

The intensity of scattered beam 222 typically depends on the Fourier transform of the electron density distribution ρ(r) of the scattering objects. For weak scattering, the scattered amplitude "A" may be calculated using equation (4):

$$A(Q) \propto \int_V \rho_e(r) \exp(-iQ \cdot r) dr \tag{4}$$

where Q is the scattering vector and is determined by X-ray wavelength λ and the respective angles of incident beam 130 and scattered beam 222 relative to wafer 190.

Equation (5) below provides a well-known expression for calculating the scattered intensity in the kinematical approximation:

$$I(Q) = (|A(Q)|)^2 + Ib(Q) \tag{5}$$

where Ib(Q) is an incoherent "background" intensity contribution system of any origin such as fluorescence or scattering from structures in the wafer beyond the coherence length of the radiation or parts of the tool, i.e. slits or beam blocker.

The electron density $\rho_e$ is related to a refractive index "n" of the scattering objects of wafer 190. Equation (6) below provides an expression for calculating the refractive index n:

$$n = 1 - \delta - i\beta \tag{6}$$

Where δ and β are, respectively, the dispersive and absorptive components of the wave-matter interaction.

Note that the value of the refractive index is close to unity for all materials in the range of hard X-rays, where the value of δ is on the order of $10^{-6}$.

Therefore, equation (7) below may be used for calculating the electron density $\rho_e$:

$$\rho_e = \frac{2\pi}{\lambda^2 r_e} \delta \tag{7}$$

where $r_e$ is the value of a classical electron radius, equals to $2.818 \times 10^{-15}$ meters.

In some embodiments, processor 22 is configured to calculate a physical model comprising the topography and the materials of the features in question described above. Processor 22 is configured to compare between the calculated and measured intensities using any suitable parameters, such as a numerical goodness-of-fit (GOP), and to adjust the model parameters so as to minimize the different between the calculated and measured data.

The dataset fitted by processor 22 may comprise one or more 1D datasets, such as the intensity distribution integrated along or across the diffraction peaks for different orientations of beam 130 and/or detector 240 relative to wafer 190, or a series of 2D images of the scattered intensity patterns or a combination thereof.

As described above, processor 22 is configured to reduce the measurement time of the features in question by acquiring data using different acquisition times at different locations across wafer 190. In some embodiments, processor 22 may apply the different acquisition time by detector 240 in various conditions. For example, when measuring different type of features (e.g., geometrical structure and/or materials), and/or layout (e.g., a single feature, or a dense array of features), and/or the angle between beam 130 and surface 192 of wafer 190, and/or the angle between beam 222 and the active surface of detector 240.

In some embodiments, processor 22 is configured to adjust the signal acquisition time so as to obtain sufficient intensity that enables sufficiently high SBR of the electrical signals received from detector 240. The measurement uncertainty of scattered X-ray having an average intensity based on N counts is typically dictated by Poisson counting statistics such that the standard error is given by IN and the fractional error is given by VON). Therefore, processor 22 may reduce the measurement uncertainty by increasing the number of counts.

As described above, processor 22 may reduce the acquisition time at some locations, where the intensity of beam 222 sensed by detector 240 is high, and increase the acquisition time at other locations, where the intensity of the sensed X-rays is lower, so as to obtain sufficient, but not excess, of X-ray photon counting statistics.

In alternative embodiments, processor 22 may apply pre-processing, such as down-sampling and principal component analysis (PCA), to raw electrical signals received from detector 240, such as 1D intensity profiles and/or 2D images for one or more rotation angles. Subsequently, processor 22 may apply one or more machine learning algorithms to the pre-processed data and to complementary data that can be used for assessing the value of the data, such as electrical test data of (e.g., of the features in question).

In these embodiments, processor 22 may use any suitable types of machine learning algorithms, such as the TensorFlow open-source machine learning framework initially developed by Google (Mountain View, Calif.), as training decks for deep learning using neural networks.

Processor 22 may subsequently apply the trained model obtained based on a preceding dataset, to data measured on subsequent wafers 190, so as to predict the electrical performance of the respective device under test, or to provide a user of systems 10, 30 and 40, other useful attributes based on the data measured on the subsequent wafers 190. Note that using the embodiments of such machine learning algorithms may require high sampling so as to develop reliable regression-based models.

In some embodiments, detector 240 comprises electronic circuitries (not shown) configured to discriminate between low-energy and high-energy photons of beam 220. In some embodiments, processor 22 is configured to reduce the background intensity caused, for example, by X-ray fluorescence and high-energy cosmic rays.

In other embodiments, processor 22 is configured to remove many of the high-energy cosmic rays using software-based filters in combination with the sub-pixel resolution enhancement described above. In these embodiments, detector 240 may not include the hardware-based cosmic ray discrimination described above.

Detection of x-Ray Beam Before Impinging on the Sample

It has been found that the intensity of the direct beam passing through a semiconductor wafer in a SAXS system may not be an accurate measure of the intensity of the x-ray beam before incident on the semiconductor wafer. Accurate measurement of the incident beam intensity improves the quality of the measurements (such as critical dimensions) of microscopic structures of a semiconductor sample.

For example—when high aspect ratio (HAR) holes of a semiconductor wafer are illuminated at zero (or small) tilt angle then the scattering from the HAR holes may be significant. HAR means a ratio between depth and width, whereas aspect ratio that exceeds 10:1 is regarded as a high aspect ratio.

In such cases, an estimate of the direct beam intensity can be made by rotating the sample through some known tilt angle and correcting the intensity according to I(omega) =I0*exp[−mu*t/cos(omega)] where mu is the linear attenuation coefficient of the substrate, normally Si, at the incident X-ray energy and t is the thickness of the substrate. The rotation of the sample require large and complex hardware and is time consuming.

Rotating the sample effectively reduces the strength of the scattered X-rays more strongly than the reduction of the direct beam from attenuation if the scattering is not negligibly small (say <1%).

There is provided a system, computer program product and a method that selectively positions a sensor (x-ray intensity detector) in the path of the x-ray beam in order to measure the intensity of the x-ray beam before the x-ray beam reaches the semiconductor sample.

The sensor may be positioned in the path of the x-ray beam during a beam intensity monitoring period and may be positioned outside the path of the x-ray beam during a semiconductor sample measurement period. The relatively weak intensity of the SAXS pattern may require removing the sensor from the path of the x-ray so as not to significantly reduce the intensity of the beam.

The sensor may be inserted in the path of the x-ray beam and may be removed from said path using any type of movement—linear movement, non-linear movement (such as but not limited to rotational movement) or a combination of a non-linear and linear movements.

The linear movement may be in any direction and the rotational movement may be about any axis of rotation.

FIGS. 11-14 illustrates various non-limiting examples of rotations. In these figures the sensor 702 may be held and moved by a mechanical mechanism (not shown in some of the figures). The mechanical mechanism may be an arm attached to an actuator. The sensor 702 may be held and/or moved by any other holding and/or movement mechanism.

Figure 11:
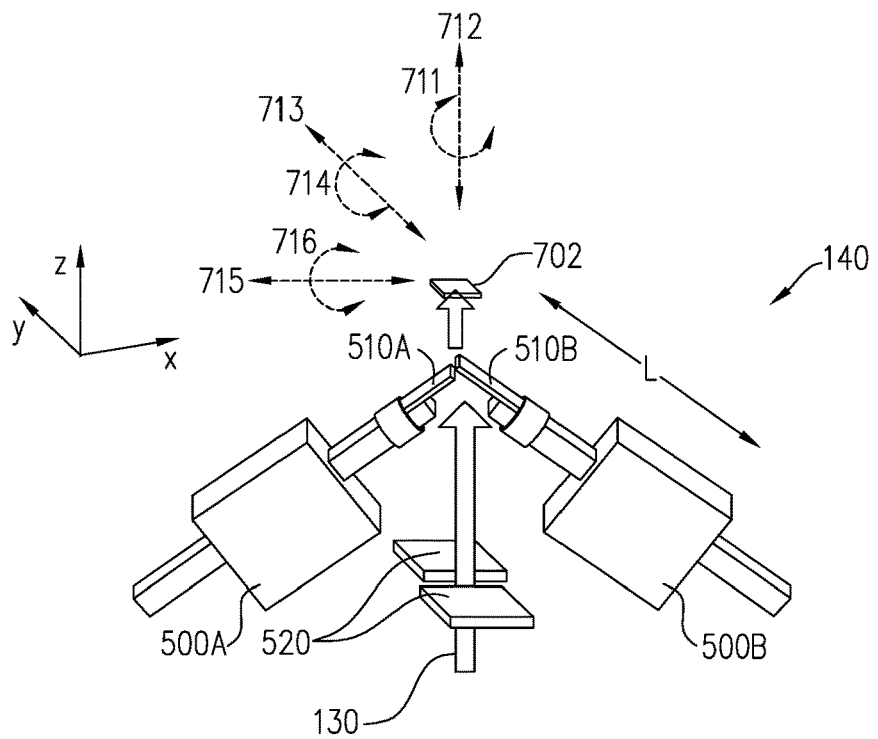
FIG. 11 illustrates a detector and a part of a slit assembly.

The upper part of FIG. 11 illustrates x-axis movement 715, a y-axis movement 715, a linear movement along an axis 713 that is oriented to both x-axis and y-axis, and various rotations 711, 714 and 715. It should be noted that the rotations are about a support element that supports the sensor. Rotating the sensor itself about a center of the sensor may be used only when such a rotation removes the sensor from the path of the x-ray beam.

Figure 12:
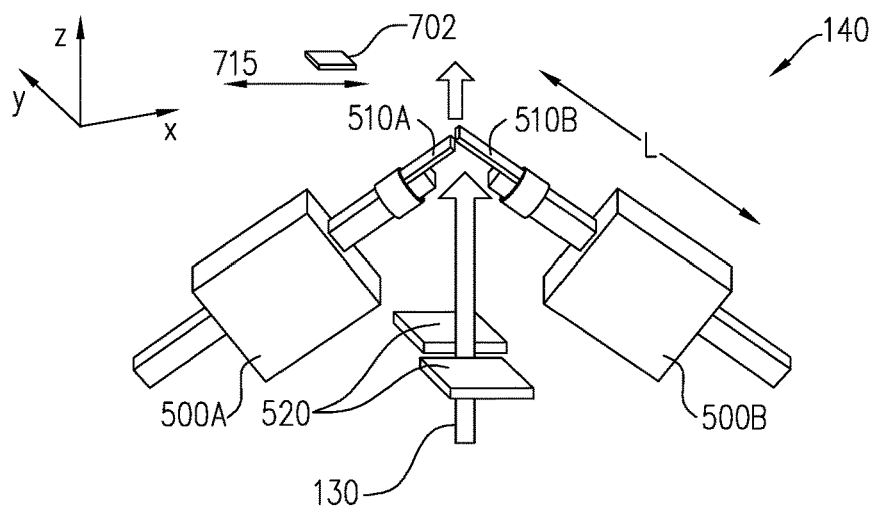
FIG. 12 illustrates a detector and a part of a slit assembly.

FIG. 12 illustrates the sensor 702 outside the path of the x-ray beam (in an "outside location").

FIG. 13 illustrates various rotations of the sensor 702 to be within the path x-ray beam (above an aperture or micro slit formed by plates 520 movable along blades 510A and 510B movable along respective translation axes 516A and 516B.

At the upper part of FIG. 13, the sensor 702 is located above the aperture—and is in a measurement position.

The middle part and the lower part of FIG. 13 illustrates the sensor 702 at an outside position and the paths (717 and 718 respectively) between the outside position and the measurement position.

In the middle part of FIG. 13 the sensor 702 is rotated in a plane that is parallel to the plane of plates 520 while in the lower part of FIG. 13 the sensor 702 is rotated in a plane that is normal to the plane of plates 520.

The rotation can be made in any plane having any spatial relationship to the plane of plates 520.

The upper and middle parts of FIG. 13 are top views while the bottom part of FIG. 13 is a side view.

Figure 14:
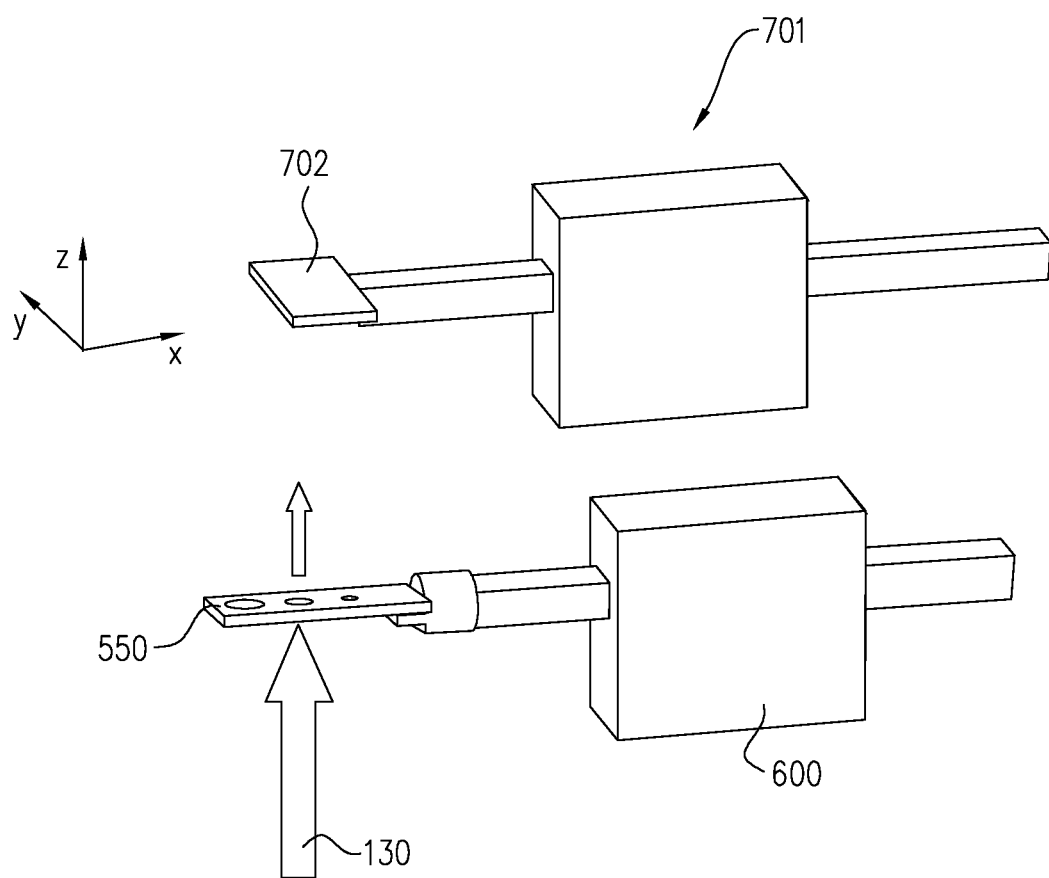
FIG. 14 illustrates a detector and a part of a slit assembly.
Figure 15:
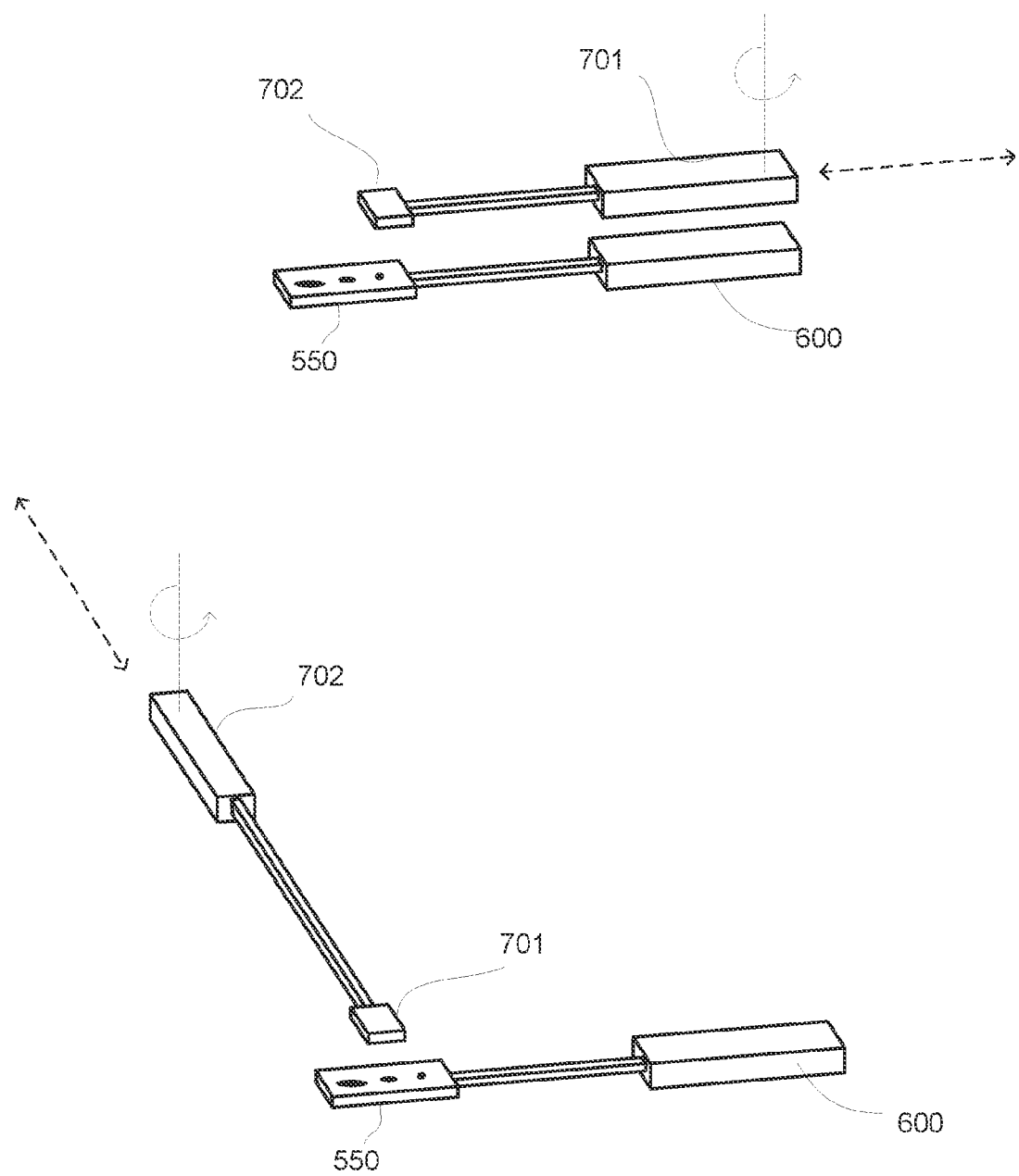
FIG. 15 illustrates a detector and a part of a slit assembly.
Figure 16:
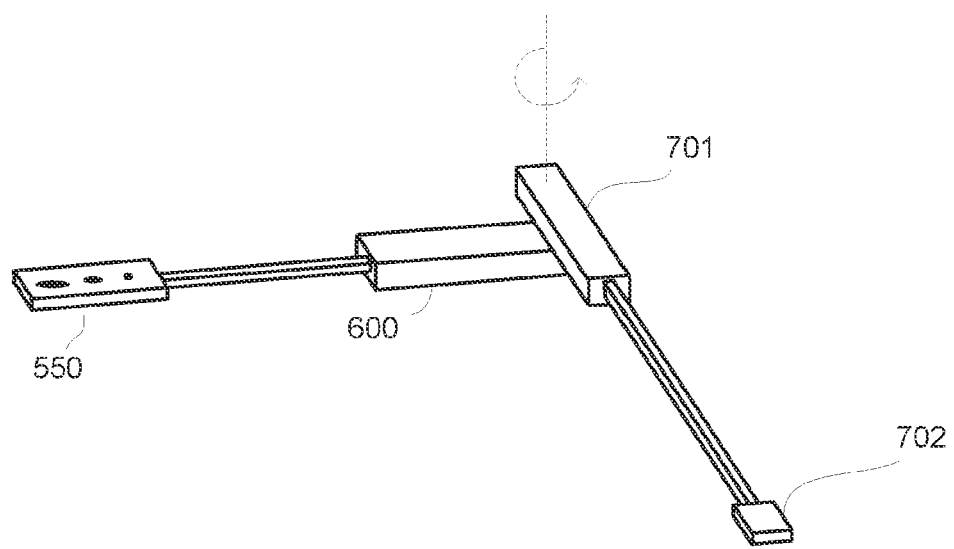
FIG. 16 illustrates a detector and a part of a slit assembly.

FIG. 14-16 illustrates different spatial relationships between (a) the sensor 702 and the actuator 701 and (b) micro-slit assembly 140 that includes actuator 600 that moves a blade 550 that includes a series of fixed size apertures made using "scatterless pinhole" technology. These figures illustrate various examples of movements that position the sensor 702 in the path (measurement position) and outside the path of the x-ray beam (outside position).

FIGS. 15 and 16 also illustrates the path of the x-ray beam when the sensor is removed from the path. When positioned in the path of the x-ray beam (measurement position), the distance between the sensor 702 and the closest beam shaping element may be, for example, millimetric (1 mm, few millimeters or below 1 mm). Other distances may be used. Similarly, smaller rotation angles to that shown in FIG. 16 may be used so as to move the sensor 702 away from the beam shaping elements by a millimetric distance to reduce the overall size of the mechanism.

Figure 17:
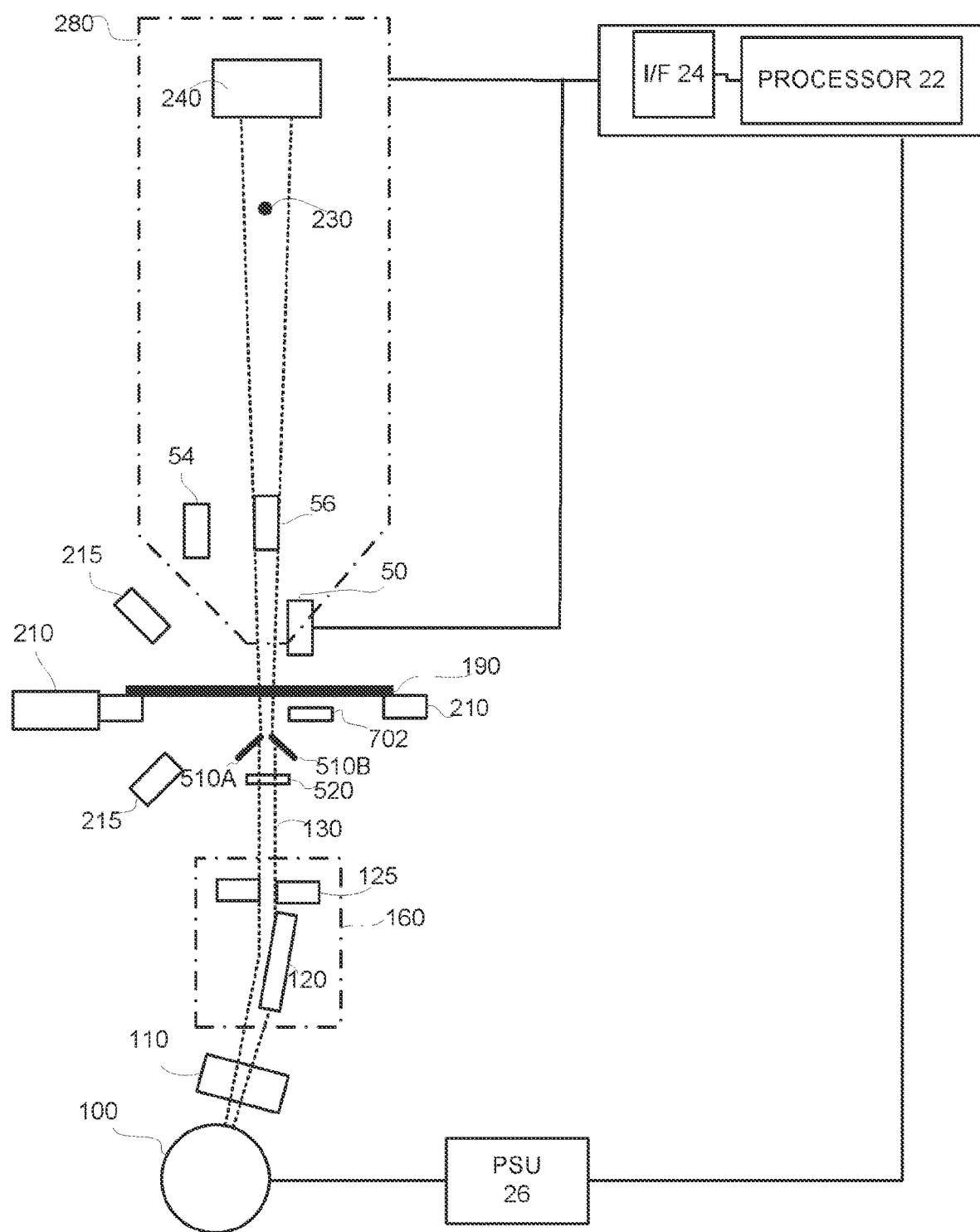
FIG. 17 illustrates a system and a detector.
Figure 18:
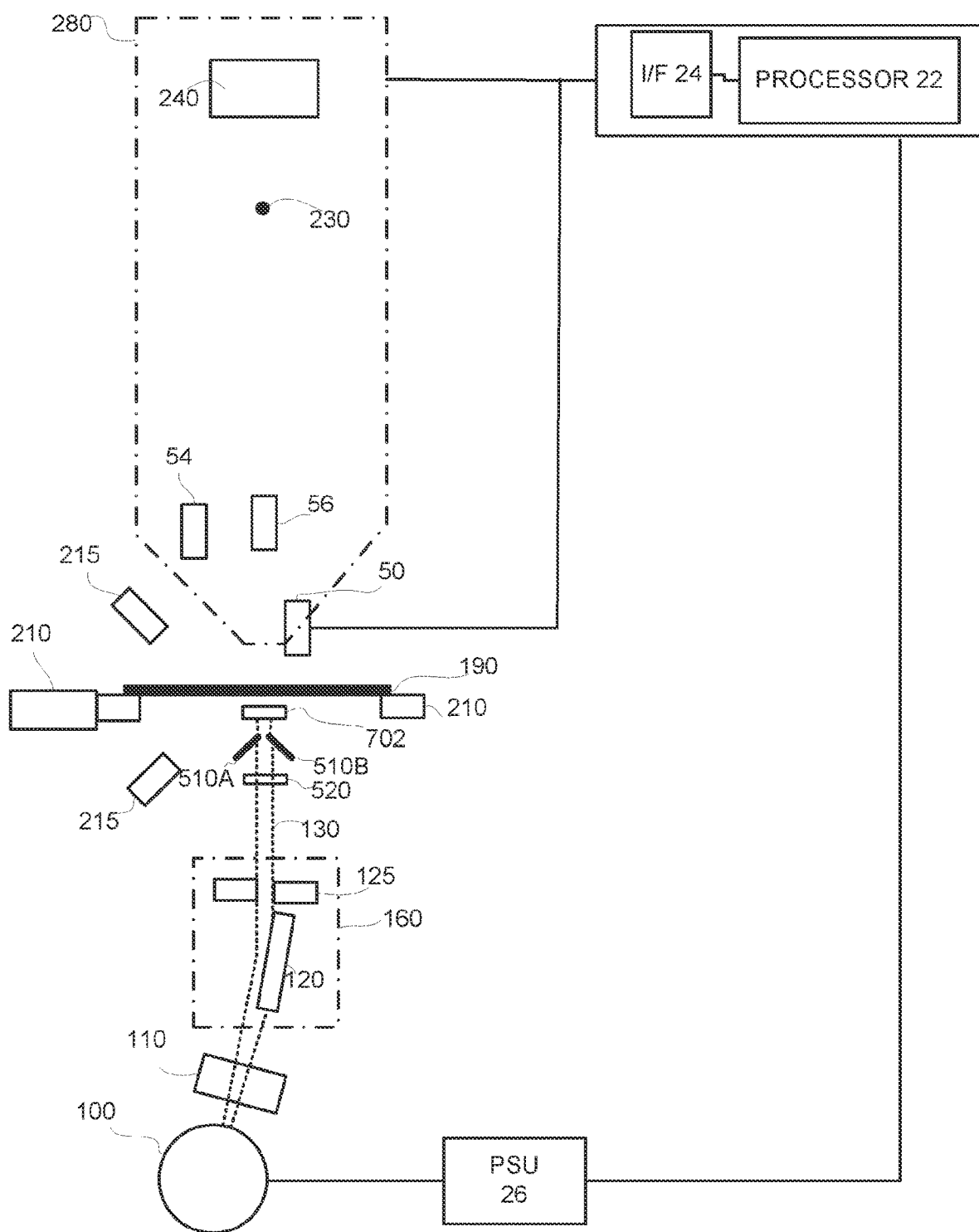
FIG. 18 illustrates a system and a detector.

FIGS. 17-18 illustrate system 10 of FIG. 1 which also includes sensor 702.

FIGS. 17 and 18 provide examples of the relative position of the sensor 702—after the beam is shaped—in the path of the x-ray beam (FIG. 18) and outside the path of the x-beam (FIG. 17).

Figure 19:
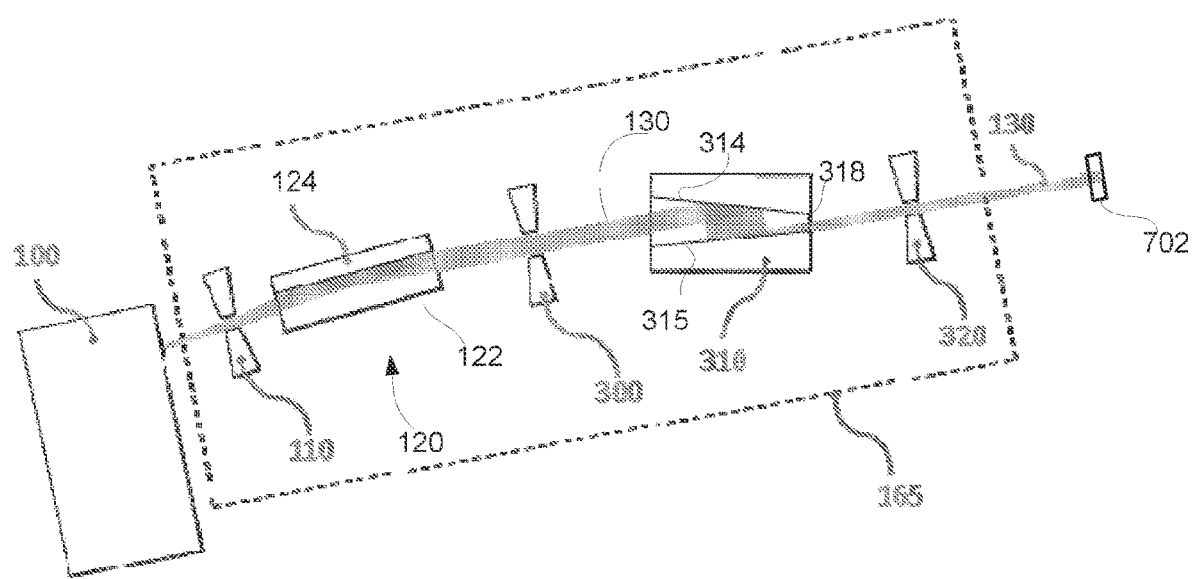
FIG. 19 illustrates a part of a system.

FIG. 19 illustrates an example of sensor 701 positioned after the beam conditioning assembly 165 of FIG. 4.

The sensor 702 may be any type of sensor capable of measuring the intensity of the x-ray beam. For example—the sensor may be a silicon sensor, a gallium arsenide sensor, a CdTe sensor, a pin diode, and the like. The sensor 702 may output an output current or other physical property that is indicative of the intensity of the x-ray beam. Yet according to another example—the sensor may be a metal foil that emits strong X-ray fluorescence, whereas the intensity of the fluorescent X-rays reflect the intensity of the x-ray beam.

Figure 20:
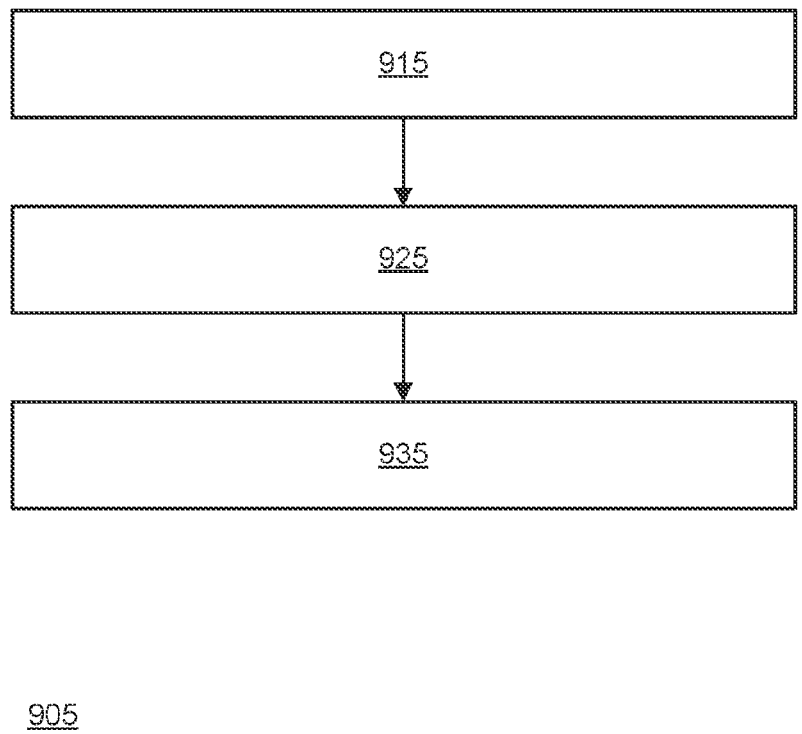
FIG. 20 illustrates a method.

FIG. 20 illustrates a method 905.

Method 905 includes:
a. Step 915 of measuring an intensity of an x-ray beam by a sensor that is positioned in a path of the x-ray beam and before a semiconductor sample. Step 915 occurs during a beam intensity period. Step 915 may include or may be preceded by positioning the sensor in the path of the x-ray beam.
b. Step 925 of illuminating the semiconductor sample with the x-ray beam while the sensor is not in the path of the x-ray beam, and detecting signals (such as a SAXS pattern) from the semiconductor sample. Step 915 occurs during a semiconductor sample measurement period. Step 925 may include or may be preceded by positioning the sensor outside the path of the x-ray beam.
c. Step 935 of processing the signals detected during step 935 to provide an indication about the semiconductor sample—for example measurements of the semiconductor sample.

Multiple iterations of steps 915, 925 and 935 may be executed.

For example—iterations of these steps may be done several times during the measurement of a wafer. For example, after each sample tilt. The intensity can then be used to normalize the measure data or be included in a parametric model to scale the intensity to compensate for long-term drifts due, for example to temperature variations.

It has been found that blocking the direct beam improves the quality of measurements of scattered radiation. When the intensity of the x-ray beam is measured before reaching the semiconductor sample the direct beam may be attenuated and blocked, or partially blocked, by a static beam-blocker. This simplifies the system as the beam blocker is not required to move between (a) a first position in which it blocks the direct beam, and (b) a second position in which it does not block the direct beam or any part of the SAXS pattern.

Any of the apparatuses may not require a beam-blocker, for example when using a detector with a highly absorbing sensor such as thick CdTe or GaAs.

In any of the apparatuses the beam blocker may be removed to measure the direct beam intensity with a short measurement and then inserted to measure the scattering from the structures which takes much more time—thereby protecting the detector from damage by avoiding long exposures with the most intense parts of the beam.

System with XRF Sensor

Figure 21:
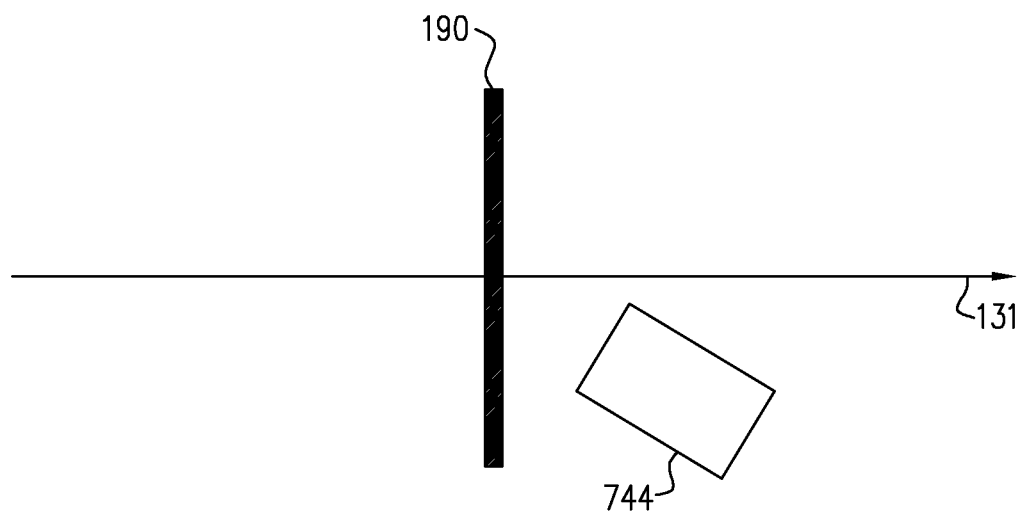
FIG. 21 illustrates a sample, X-ray beam and a prior art XRF detector.

Semiconductor metrology tools involving more than one X-ray based analytical technique are generally known in the art such as Vu et al (U.S. Pat. No. 6,381,303) who combined XRF and XRR and specifically SAXS+XRF combinations are known from Yokhin et al (U.S. Pat. No. 7,551,719), Paris et al (2007), or Beckman et al U.S. Pat. No. 9,778,213. The apparatus can be used to measure with more than one technique either sequentially or simultaneously using one, or more, X-rays beams and detectors. In previous SAXS+XRF tools the detectors have been comprised of discrete or arrays of X-ray detectors off to the side of the incident X-ray beam such as shown in FIG. 21 (x-ray 131 propagates along a certain axis that is normal to sample 190 while the X-ray detector 744 is positioned at one side of the x-ray beam, relatively distant from the sample and oriented at a certain angle).

While this is convenient to implement using off the shelf components, the performance of such systems in terms of measurement precision in a given time is compromised because of the need to move the detector out of the path of the incoming X-ray beam which limits the possible solid angle of collection.

There may be provided an x-ray fluorescence (XRF) detector within a transmission geometry SAXS tool that addresses the limitations of performance due to the limited solid angle of collection of the detector. The XRF detector may include one or more silicon drift detectors (SDDs) monolithically manufactured on a single module containing an aperture that allows a beam to pass through.

FIG. 22 illustrates an XRF detector 750 that includes an aperture 7501 and one or more SSD that form a single detection region 7502.

FIG. 22 also illustrates an XRF detector 750' that includes an aperture 7501 and one or more SSD that form multiple detection regions 7502A, 7502B, 7502C and 7502D.

The number of independent detection regions, the shape and/or size of the independent regions may differ from those illustrated in FIG. 22.

The aperture allows an x-ram beam to pass through the XRF detector before impinging on the sample.

Since the detector is not positioned off to the side of the incident X-ray beam it can be placed very close to the surface of the sample (1-2 mm) and collect a much larger solid angle of fluorescent X-rays emitted from a sample.

Quantification of the emitted X-rays can be direct extraction, such as counting the number of X-ray photons within a specific energy region of interest (ROI) or from fitting in order to separate overlapping peaks.

Such a setup can be used in two main ways within a combined transmission SAXS and XRF tool as disclosed below:
1) Placed near (for example at a distance smaller than 5 mm from) the backside of a wafer to measure the fluorescent X-rays such as Si Kα radiation from Si wafers in order to monitor the intensity of the incident beam with increased precision than setups known in the prior art
2) Placed near (for example at a distance smaller than 5 mm from) the front-side of the wafer to measure the X-rays emitted from structures patterned on or within the substrate such as logic or memory structures, including but not limited to FinFETs and gate-all around (GAA) transistors, DRAM, NAND or novel technologies such as phase change or magnetic memories. The XRF and SAXS signals can be measured sequentially or simultaneously and the uXRF signal can be used in a number of ways including independent use to monitor the volume of a material within structures containing W metal to quantify and monitor voiding.

In both setups the XRF detector is sufficiently small so that it can (optionally) rotate with the sample if needed to maintain close proximity with the surface of the sample. An example of such a detector by means of example is the Rococo series manufactured by PNDetector (Munich, Germany).

Since the X-ray beam in a transmission SAXS system has a relatively high energy typically greater than 15 keV then only relatively high Z materials such as W can be excited by this incident X-ray beam. Therefore, in another embodiment it is envisaged that a second X-ray beam may be incident on the front size of the sample with a different energy from that of the SAXS X-ray beam. The properties of this beam including energy, size and angular divergence may be different to the SAXS beam and separately optimized to excite fluoresce from elements that are not efficiently excited by the SAXS beam. Possible excitations include, but are not limited to, X-ray emissions from common X-ray tubes such as Cu, Rh, Mo.

FIGS. 23 and 24 illustrate XRF detector 750 positioned upstream to sample 190 and allowing x-ray 130 to pass through XRF detector 750 and impinge on sample 190. In FIG. 23 the x-ray is normal to sample 190 and to the XRF detector 750, while in FIG. 24 the x-ray is not normal to the sample and the XRF detector 750.

The XRF detector is small and so close to the sample 190 that it may rotate with the sample.

The proximity of the XRF detector to the sample 190 and the aperture allowing the x-ray to pass therethrough enable the XRF detector to collect fluorescent x-rays emitted over a large solid angle range. The large solid angle range may exceed 0.5 sr, may be about 1 sr, or may exceed 1 sr.

Figure 25:
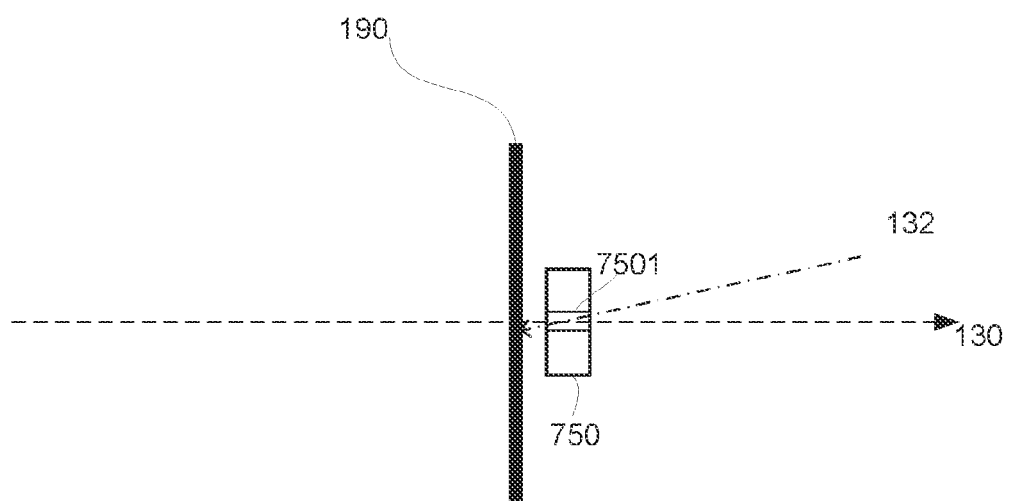
FIG. 25 illustrates a sample and a detector.

FIG. 25 illustrates an example of a sample 190, x-ray beam 130 and XRF detector 750 (having aperture 7501) and a second x-ray 132 that illuminates the second side of the sample 190 (while passing through aperture 7501). In this case the XRF detector 750 may detect fluorescent x-rays emitted from structure on or within the second side of the sample 190. The second x-ray beam 132 may be optimized to excite X-ray fluorescence of certain elements of interest.

Figure 26:
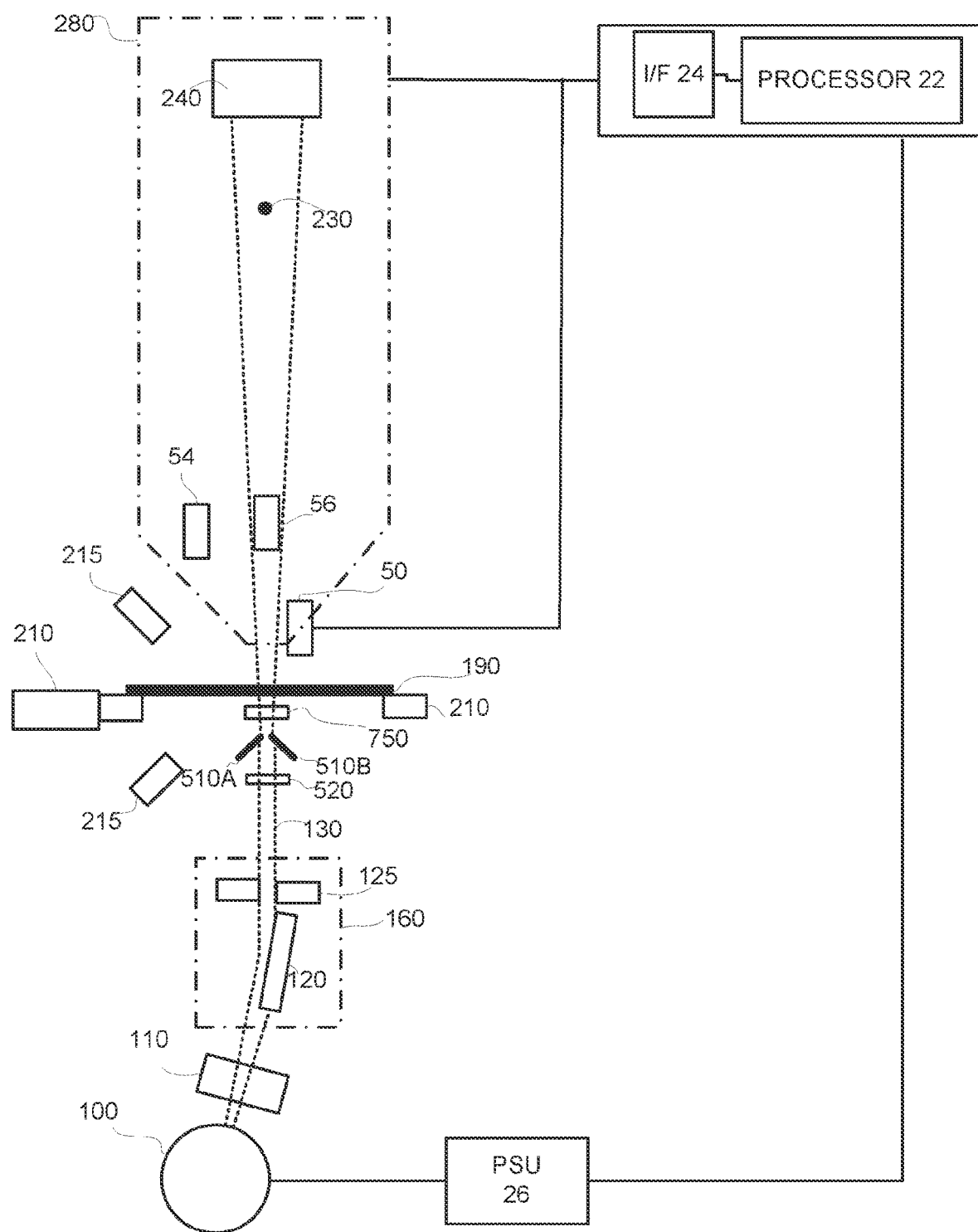
FIG. 26 illustrates a system and a detector.
Figure 27:
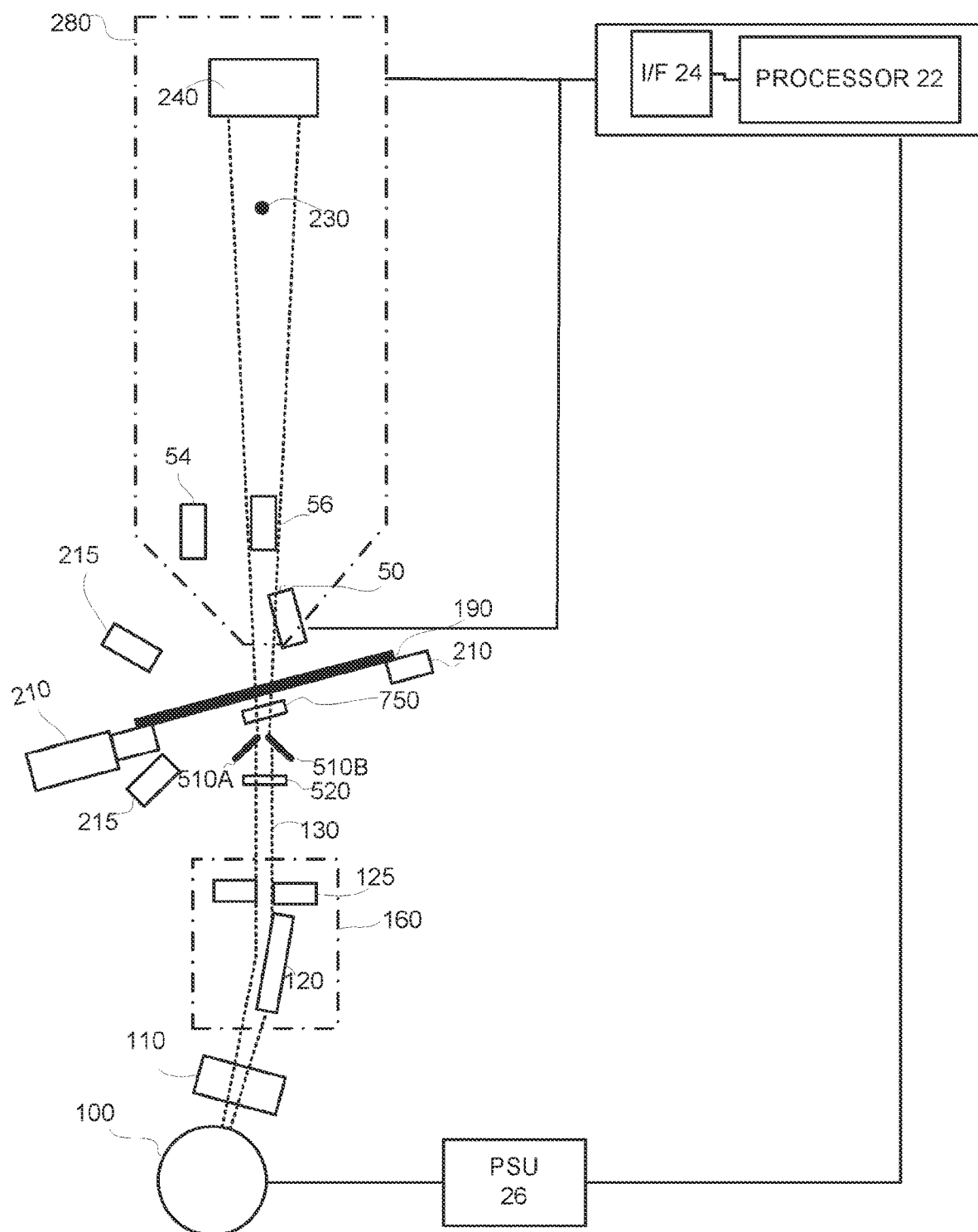
FIG. 27 illustrates a system and a detector.

FIGS. 26 and 27 illustrates system 10 with XRF detector 750 positioned upstream to the sample 190—at different sample tilt angles.

Figure 28:
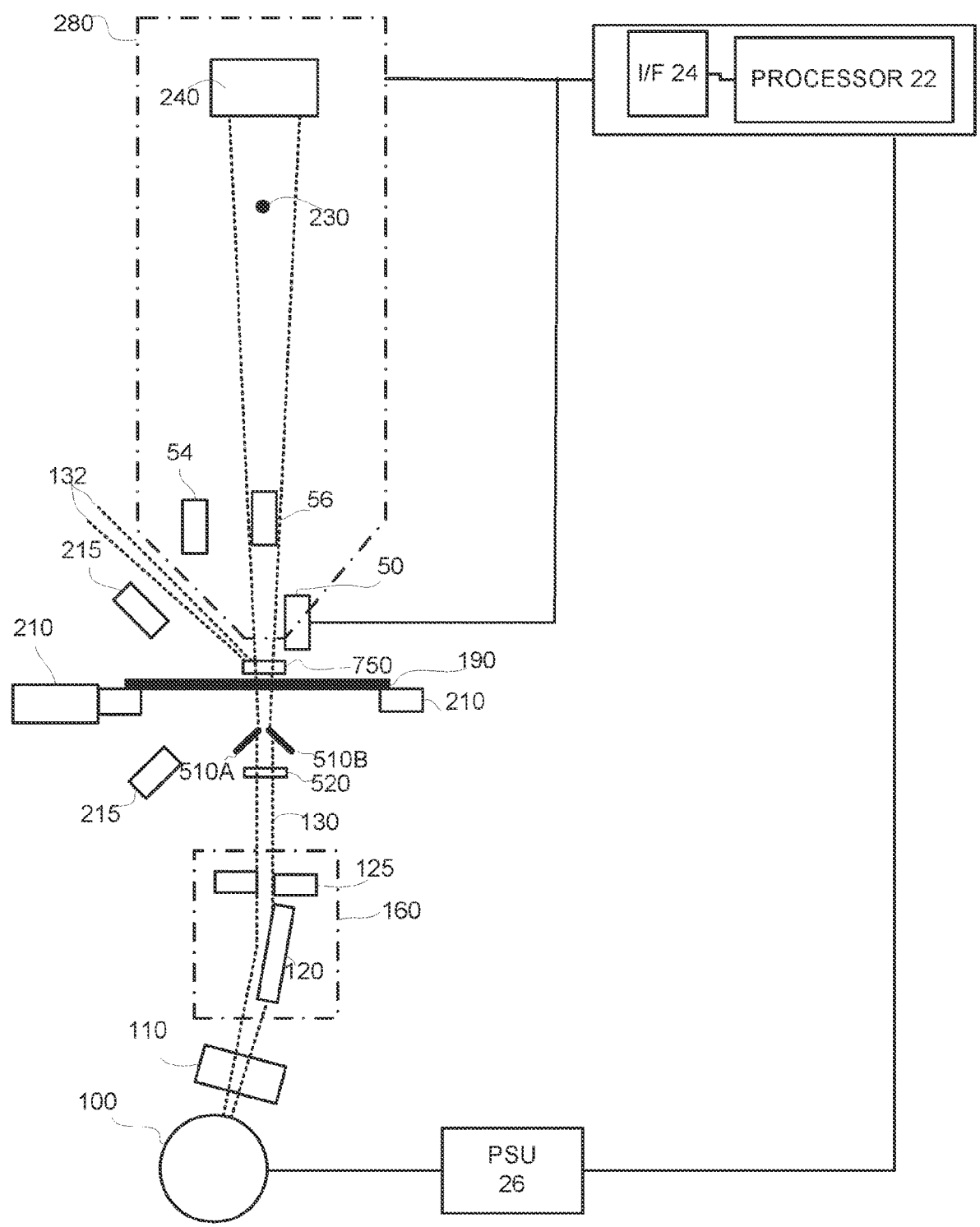
FIG. 28 illustrates a system and a detector.

FIG. 28 illustrates system 10 with XRF detector 750 positioned downstream to the sample 190 and having a second x-ray 132 illuminate the sample though an aperture of XRF detector 750.

Figure 29:
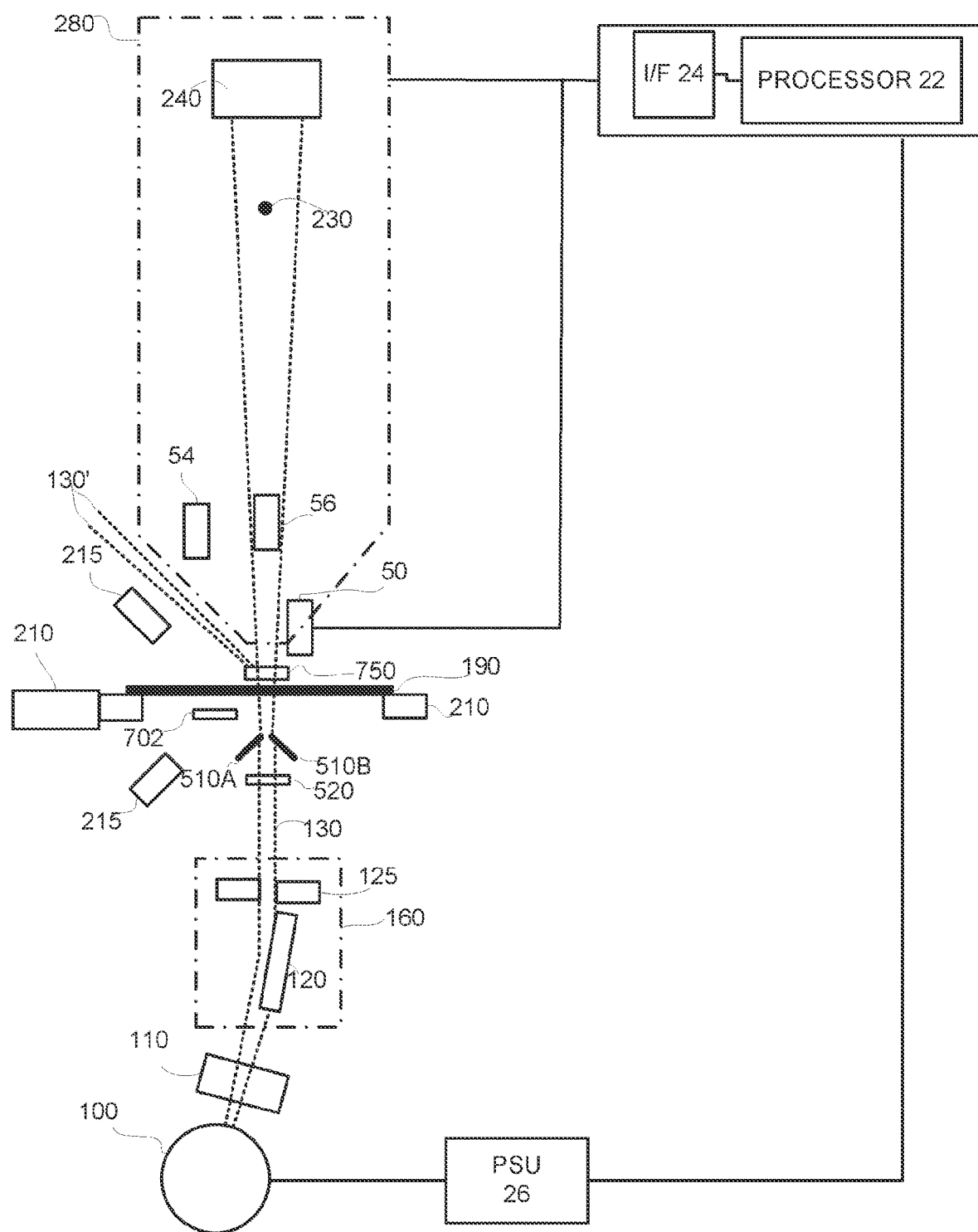
FIG. 29 illustrates a system and a detector.
Figure 30:
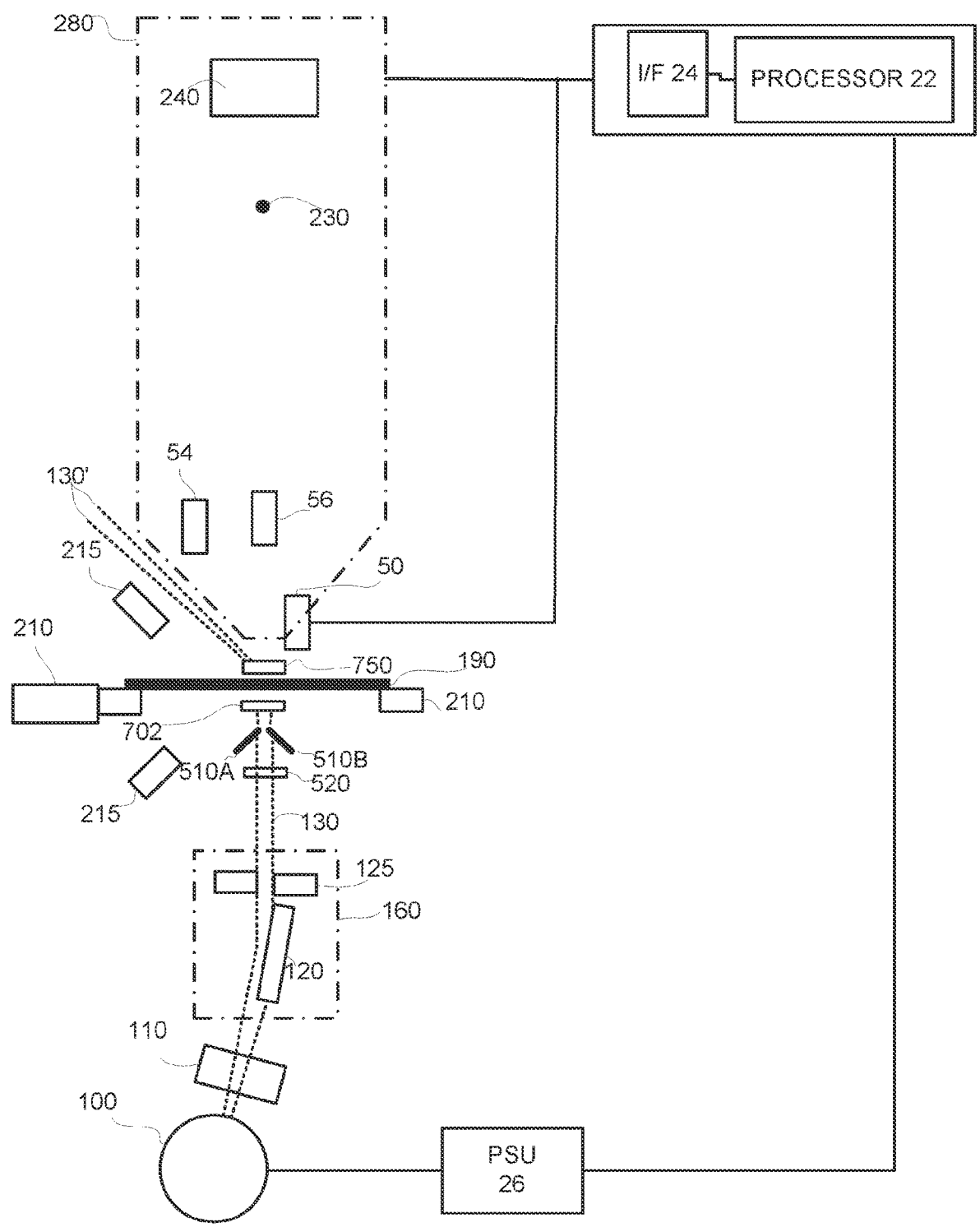
FIG. 30 illustrates a system and a detector.

FIGS. 29 and 30 illustrates system 10 with detector 702 (x-ray intensity detector) located upstream to the sample and XRF detector 750 positioned downstream to the sample 190, and having a second x-ray beam 130' illuminate the sample though an aperture of XRF detector 750. In FIG. 29 the detector 702 is located at an outside position and in FIG. 30 the detector 702 is in a measurement position.

Detecting the entirety of the x-ray beam may be more accurate than sampling a part of the x-ray beam.

Figure 31:
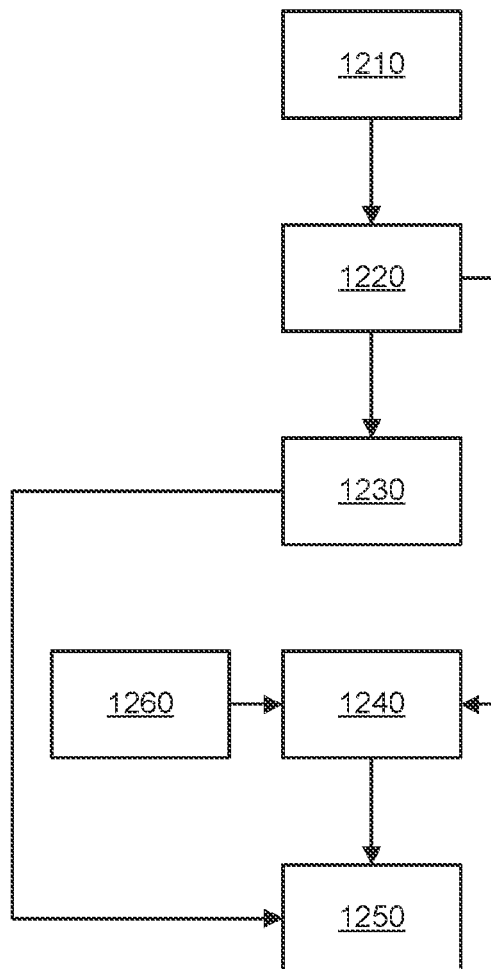
FIG. 31 illustrates a method.

FIG. 31 illustrates method 1200.

Method 1200 may include steps 1210, 1220, 1230, 1240, 1250 and 1260.

Step 1210 may include holding a sample by a mount.

Step 1220 may include directing an x-ray beam toward a first side of the sample.

Step 1210 may include or may be followed by positioning the XRF detector within less than five millimeters from the first side of the sample.

Step 1210 may include or may be followed by positioning the XRF sensor downstream to the second side of the sample.

Step 1230 may include detecting, by a small angle x-ray scattering (SAXS) detector that is positioned downstream to a second side of the sample, at least a part of a SAXS pattern formed by x-rays that have been transmitted through the sample and exited through the second side.

Step 1210 may include or may be followed by positioning the XRF sensor downstream to the second side, wherein step 1230 may include detecting the at least part of the SAXS pattern that passes through the aperture of the XRF sensor.

It should be noted that the XRF sensor may be moved by a movement mechanism between a measurement position (in which it performs an XRF measurement) and an outside position.

Step 1240 may include detecting, by an x-ray fluorescence (XRF) detector, fluorescent x-rays emitted from the sample.

Step 1250 may include responding to the detection. The responding may include evaluating the sample, evaluating an x-ray beam property, and the like.

Method 1200 may also include positioning the XRF upstream to the sample and determining an intensity of the x-ray beam based on the fluorescent x-rays that were detected by the XRF detector.

The XRF detector may include an aperture. The x-ray beam may pass through the aperture.

The XRF sensor may be positioned upstream to the first side of the sample.

Step 1220 may include directing the x-ray to pass through the aperture.

Method 1200 may also include positioning the XRF downstream to the sample (for example facing the second side of the sample) and illuminating the sample with another x-ray beam (1260) that may pass through the aperture of the XRF sensor. Step 1260 may be followed by step 1220.

The sample may be illuminated by the x-ray beam and the other x-ray beam concurrently, during different points of time or during partially overlapping periods of time.

The XRF detector may be shaped and positioned to detect fluorescent x-rays emitted from the sample over a large solid angle range. The large solid angle range may exceed 0.5 sr, may be about 1 sr, or may exceed 1 sr.

Step 1240 may be including detecting, by one or more radiation sensing elements of the XRF detector, fluorescent x-rays emitted from the sample.

Determining Orientations of HAR Holes

There may be provided a method for determining the orientation of HAR holes of an array of stacks of HAR holes. The determining may include generating orientation information that is indicative of the orientation of HAR holes of an array of stacks of HAR holes.

It is assumed that the array includes substantially identical stacks of HAR holes—and that a small-angle X-ray scattering (SAXS) pattern obtained by illuminating the array is indicative of the orientation of HAR holes of each stack.

The method may include determining the orientation of one or more HAR holes of a stack in relation to a surface of the wafer. The method may include determining the misalignment between HAR holes of the stack.

Figure 32:
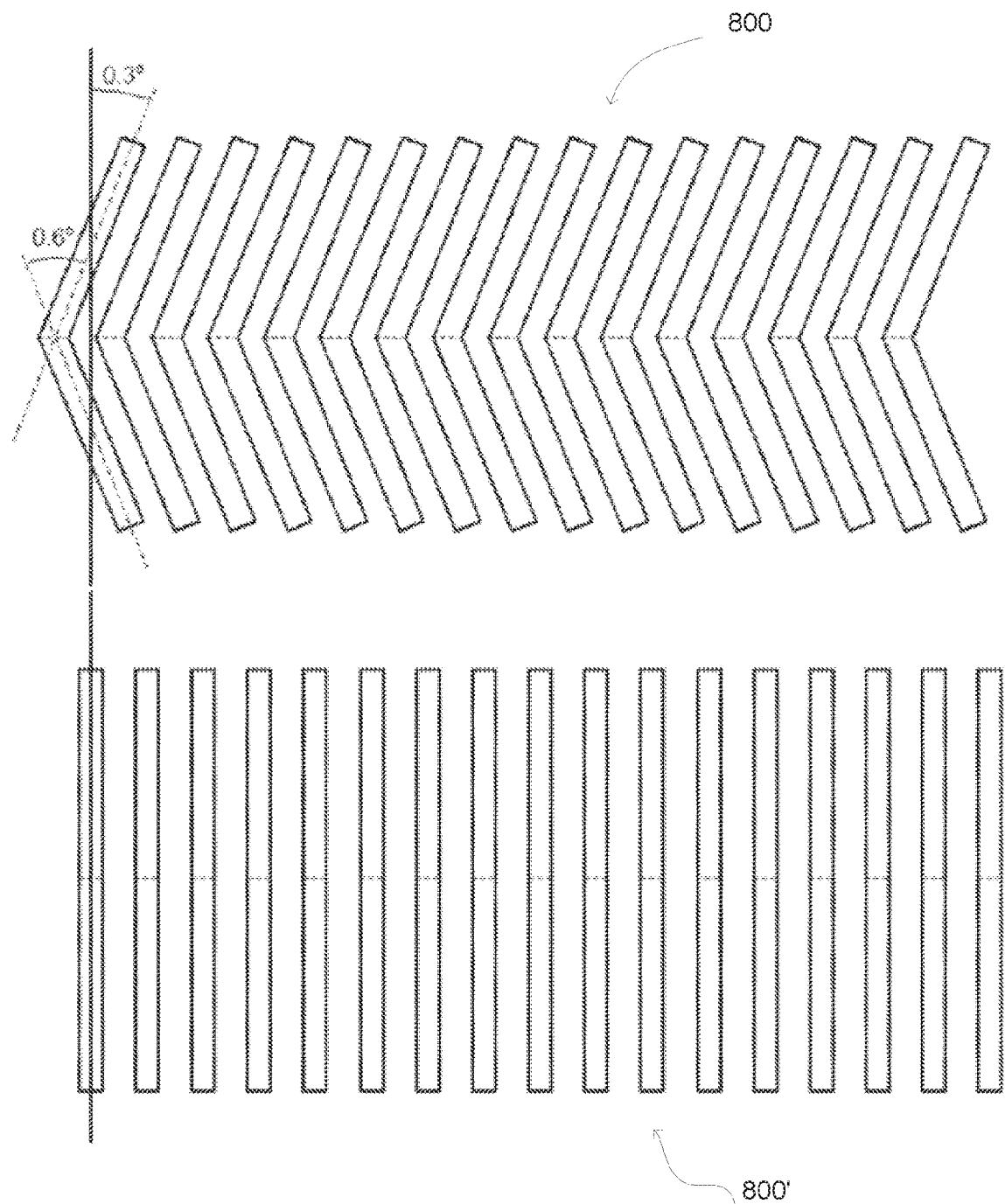
FIG. 32 illustrates an array of aligned stacks of HAR holes and an array of misaligned stacks of HAR holes.

The lower part of FIG. 32 illustrates an array of aligned stacks 800 of HAR holes. The upper part of FIG. 32 illustrates an array of misaligned 800' stacks of HAR holes.

Figure 33:
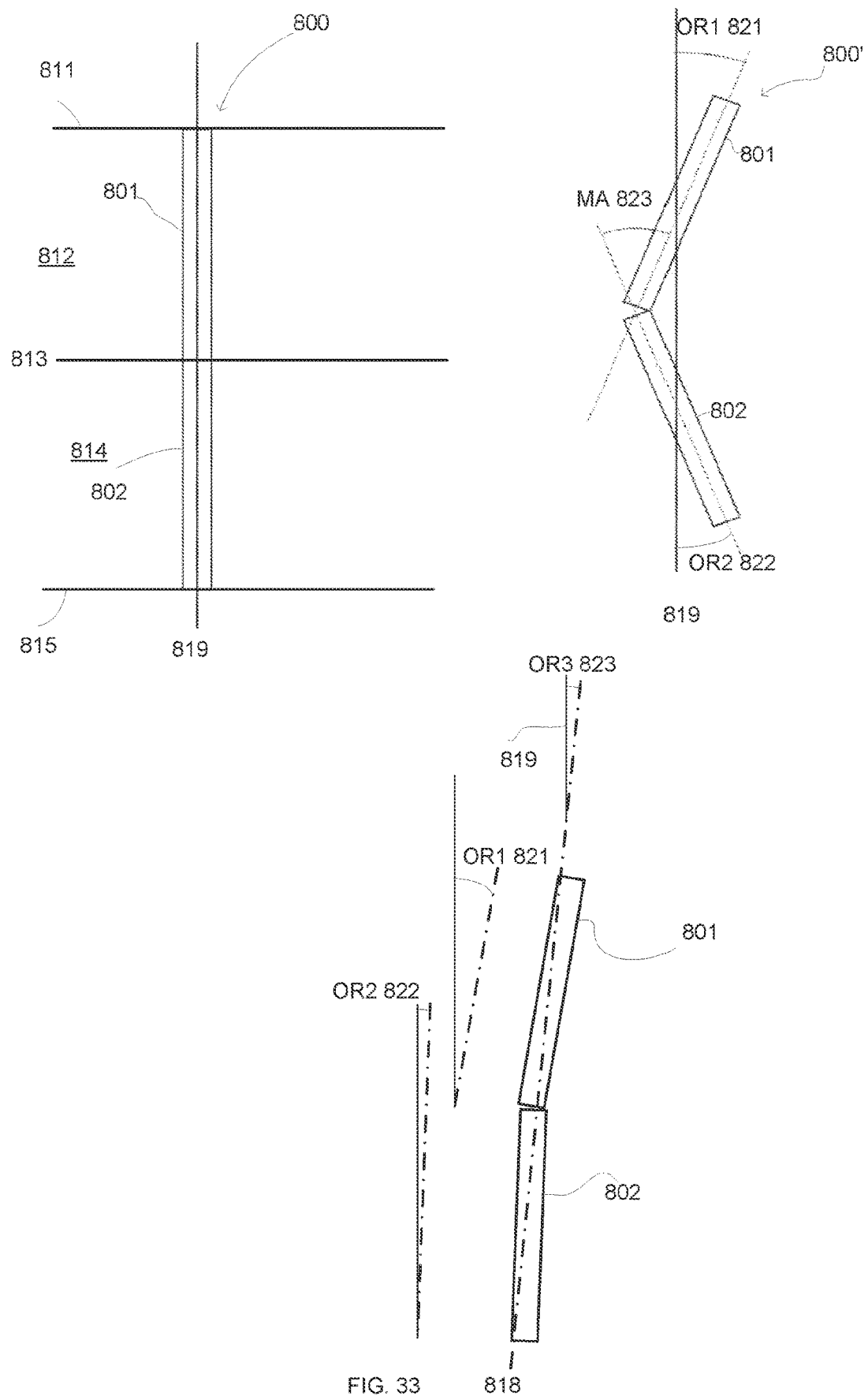
FIG. 33 illustrates an example of an aligned stack of HAR holes and a misaligned stack of HAR holes.

The left side of FIG. 33 illustrates an aligned stack 800 that includes a first HAR hole 801 and a second HAR hole 802.

First HAR hole 801 is formed in a first layer 812 of a wafer.

Second HAR hole 802 is formed in a second layer 814 of a wafer.

The upper surface of first layer 812 is denoted 811. The bottom surface of the second layer 814 is denoted 818. The lower surface of first layer 812 and the upper surface of the second layer are denoted 813.

Both HAR holes are mutually aligned and are perpendicular to the upper surface 811 of first layer 812 of the wafer.

The right side of FIG. 33 illustrates a misaligned stack 800' that includes a first HAR hole 801 and a second HAR hole 802. Both holes are not perpendicular to the upper surface 811 of first layer 812 and are also mutually misaligned (by misalignment angle MA 823).

First HAR hole 801 is oriented by first angle OR1 821 in relation to normal 819. Second HAR hole 802 is oriented by second angle OR2 822 in relation to normal 819. In this example OR1 differs from OR2.

The bottom of FIG. 33 illustrates a misaligned stack 800" that includes a first HAR hole 801 and a second HAR hole 802. Both HAR holes are not perpendicular to the upper surface 811 of first layer 812 and are also mutually misaligned. First HAR hole 801 is oriented by first angle OR1 821 in relation to normal 819. Second HAR hole 802 is oriented by second angle OR2 822 in relation to normal 819. In this example OR1 differs from OR2. The bottom of FIG. 32 also illustrates a straight pass-through path 818 that passes straight through both holes. Path 818 is oriented by OR3 824 from normal 819.

It should be noted that one HAR hole may be normal to the first surface while another HAR hole may be oriented in relation to normal 819. Yet for another example—one HAR hole of the stack may be spatially offset from another HAR hole of the stack—have center of one HAR hole spaced apart from a center of another HAR hole of the stack.

It should be noted that each stack may include more than two HAR holes.

Figure 34:
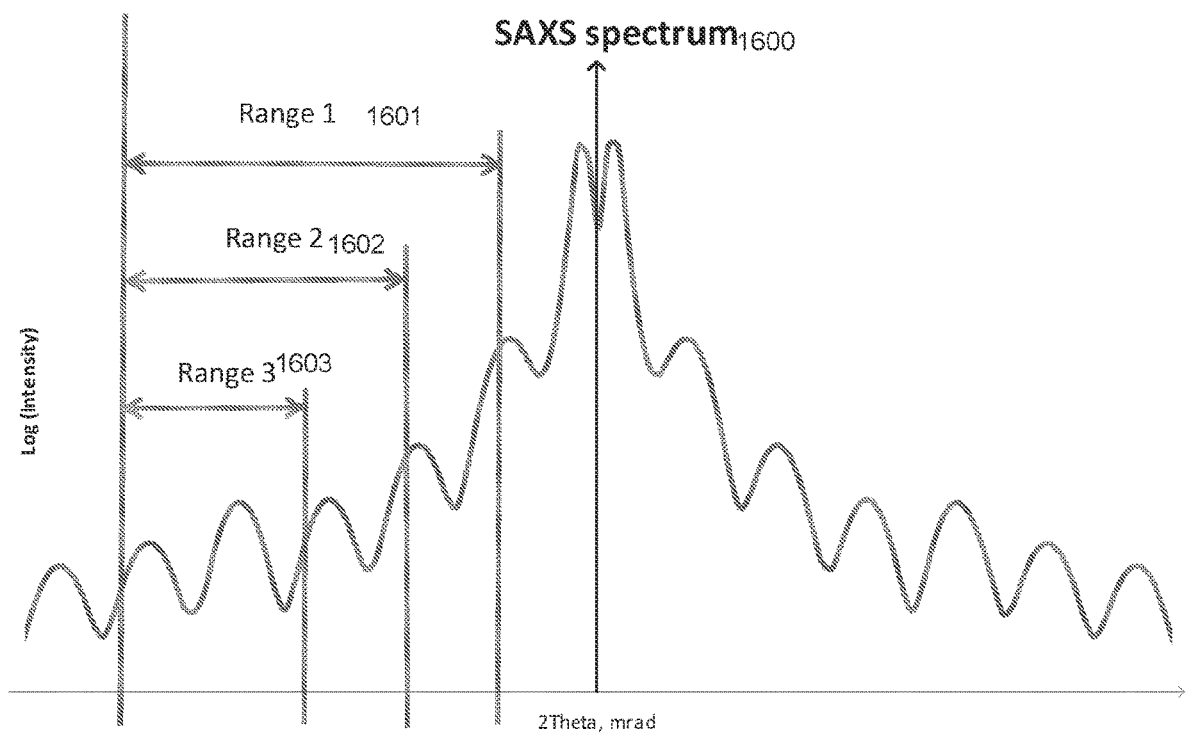
FIG. 34 illustrates an example of a 1D small-angle X-ray scattering (SAXS) pattern obtained when illuminating an array of stacks of HAR holes.

FIG. 34 illustrates a SAXS pattern 1600 that represents the intensity of radiation versus collection angles of a sensor. The center of the SAXS pattern corresponds to a zero collection angle.

One or more angular ranges of the pattern are defined. The one or more angular ranges may be defined in any manner and/or by any entity.

The one or more angular ranges may be fixed, may change over time, may be defined using machine learning, or may be defined in any other manner. The angular ranges may be selected in order to provide orientation information.

Different SAXS patterns are obtained for different angular relationships between the array and the illuminating X-ray. The different angular relationships may be obtained by rotating the array and/or by rotating the X-ray about a rotation axis.

Figure 53:
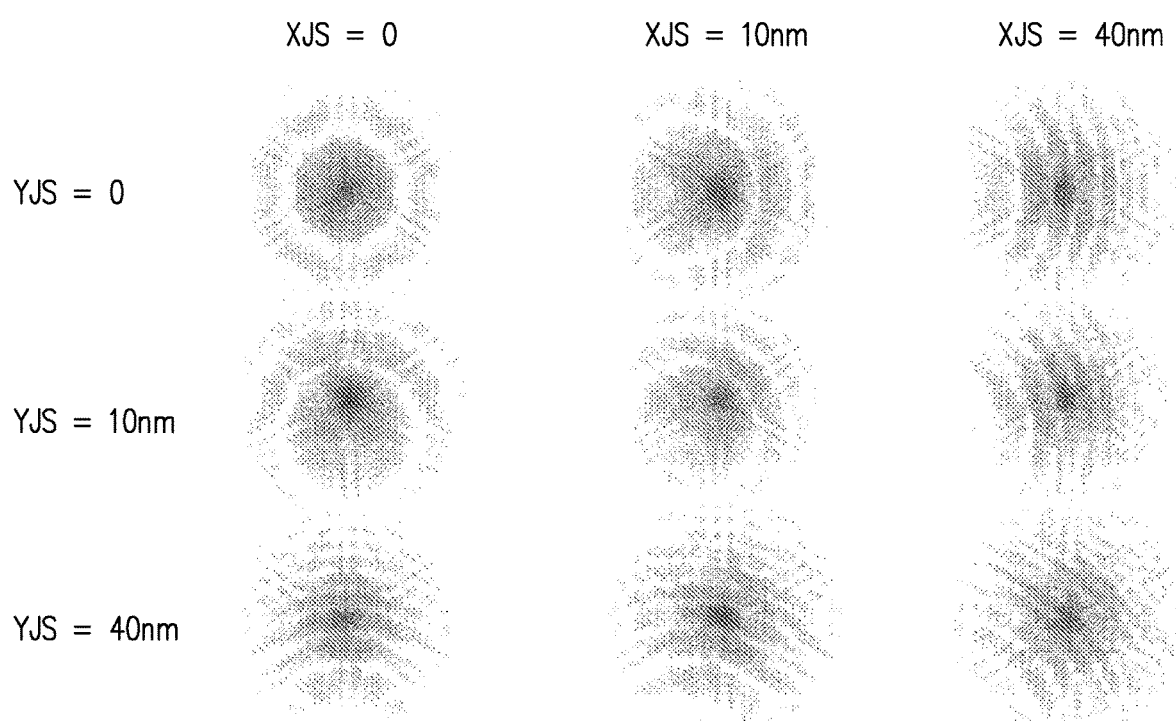
FIG. 53 illustrates an example of a 2D small-angle X-ray scattering (SAXS) pattern obtained when illuminating an array of two levels of HAR holes.

FIG. 53 illustrates an example of a 2D small-angle X-ray scattering (SAXS) pattern obtained when illuminating an array of two levels of HAR holes showing the interference pattern due to in-plane spatial shifts between the top and bottom levels of holes. The shift values in the x and y directions are denoted X JS and Y JS, respectively.

The method may include calculating, for each one of the different SAXS patterns—sum of intensities within each of the one or more angular ranges.

The method may also include calculating one or more relationships (angle-intensity sum relationships) between (ii) one or more sums of intensities related of one or more angular ranges of the different SAXS patterns (related to different angular relationships), and (ii) the different angular relationships between the illuminating x-ray and the sample.

These one or more angle-intensity sum relationships may be processed in order to provide the orientation and n-plane shift information.

The strength of the X-ray scattering is proportional to the electron density difference of the scattering structures with respect to their surrounding environment. Accordingly—the sum of relationships may have a first peak that corresponds to the orientation of the first HAR hole, and a second peak that corresponds to the orientation of the second HAR hole.

There may be a third peak (not shown—located between the first and second peaks) that represents a passage of the x-ray via the straight pass-through path.

It should be noted that in some cases different peaks may be merged (for example—when the peaks are not distant enough from each other).

The processing of the angle-intensity sum relationships may include comparing an angle-intensity sum relationship to one or more reference angle-intensity sum relationships (of known stacks of HAR holes), may include applying neural network/deep learning/machine learning on the angle-intensity sum relationships to provide the orientation and/or spatial shift information or extracting the orientation information from the angle-intensity sum relationships in any other manner. The processing may include physical modelling with limited subset of tilt angles not just different peaks but also interference patterns at the two arrays of holes are illuminated coherently.

Angle-intensity sum relationships of different arrays may be compared to each other.

Figure 35:
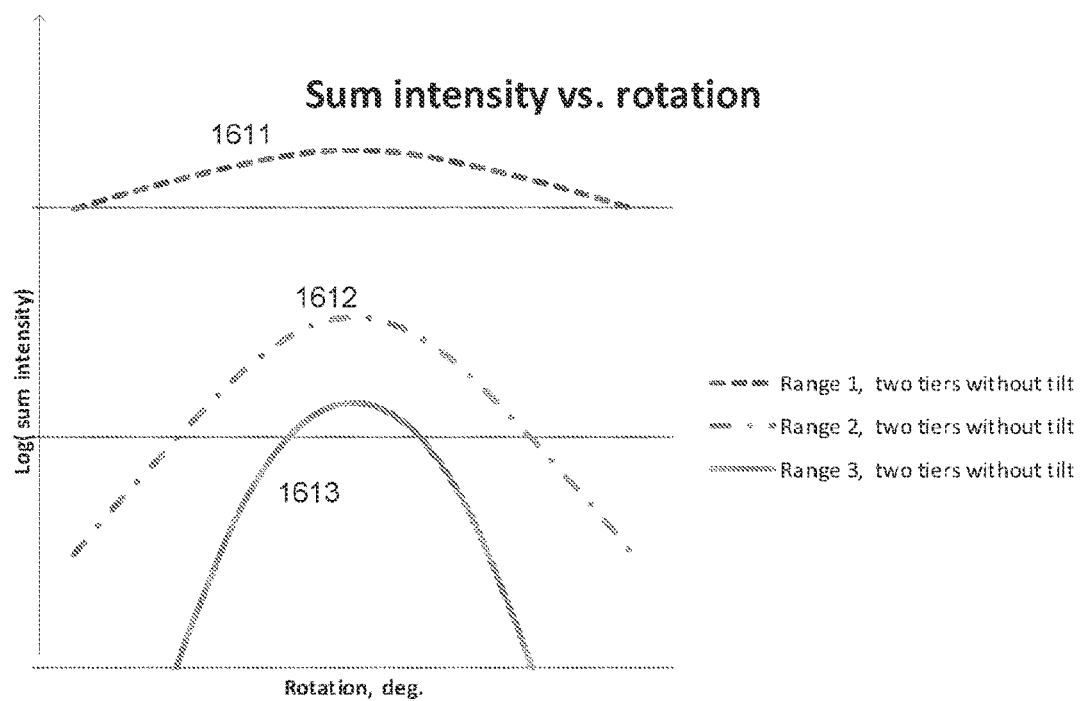
FIG. 35 illustrates examples of relationships between rotations and intensity sum of different ranges of the SAXS pattern of an array of aligned stacks of HAR holes.

FIG. 35 illustrates (from top to bottom) three angle-intensity sum relationships:

First angle-intensity sum relationship 1611—obtained for an aligned stack—and for first angular range 1601.

Second angle-intensity sum relationship 1612—obtained for an aligned stack—and for second angular range 1602.

Third angle-intensity sum relationship 1613—obtained for an aligned stack—and for third angular range 1603.

Figure 36:
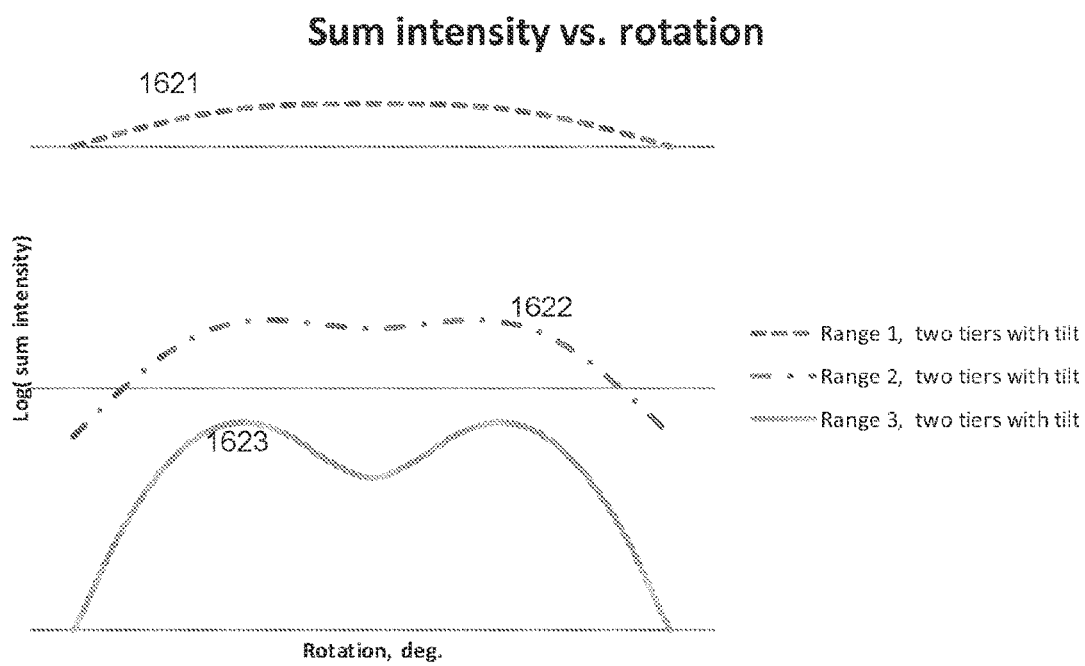
FIG. 36 illustrates examples of relationships between rotations and intensity sum of different ranges of the SAXS pattern of an array of misaligned stacks of HAR holes.

FIG. 36 illustrates (from top to bottom) three angle-intensity sum relationships:

Fourth angle-intensity sum relationship 1621—obtained for a misaligned stack (without a straight pass-through path)—and for first angular range 1601.

Fifth angle-intensity sum relationship 1622—obtained for a misaligned stack (without a straight pass-through path)—and for second angular range 1602.

Sixth angle-intensity sum relationship 1623—obtained for a misaligned stack (without a straight pass-through path)—and for third angular range 1603.

The fifth and sixth angle-intensity sum relationships include two distinct peaks—and thus convey more orientation information that the fourth angle-intensity sum relationship.

Figure 37:
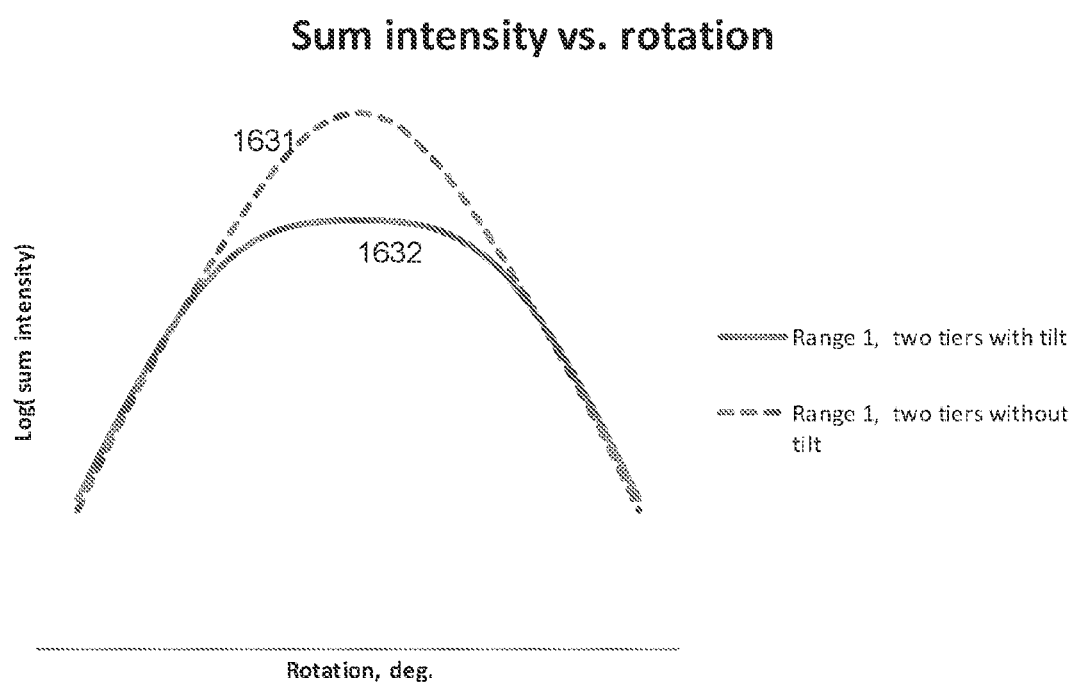
FIG. 37 illustrates examples of relationships between rotations and intensity sum of a first range of SAXS patterns of an array of misaligned stacks of HAR holes and of an array of aligned stacks of HAR holes.

FIG. 37 illustrates two angle-intensity sum relationships:

Seventh angle-intensity sum relationship 1631—obtained for an aligned stack—and for first angular range 1601.

Eighth angle-intensity sum relationship 1632—obtained for a misaligned stack (without a straight pass-through path)—and for first angular range 1601.

Both seventh and eighth angle-intensity sum relationships have a single peak—but differ from each other—and may provide an indication whether the stack is aligned or misaligned.

More detailed orientation information may be obtained from the seventh and eighth angle-intensity sum relationships by further processing—for example—comparing these angle-intensity sum relationships to reference angle-intensity sum relationships of known stacks.

The orientation information may be obtained from may include physical modelling with limited subset of tilt angles not just different peaks but also interference patterns at the two arrays of holes are illuminated coherently.

Figure 38:
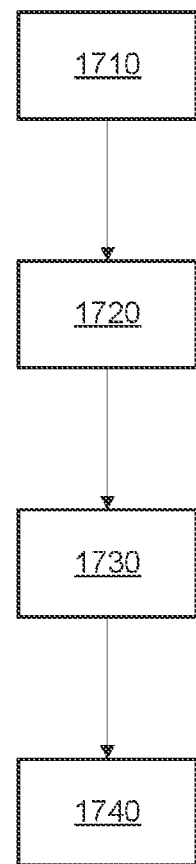
FIG. 38 illustrates an example of a method.

FIG. 38 illustrates method 1700.

Method 18 may include steps 1710, 1720, 1730 and 1740. Step 1710 is followed by step 1720. Step 1720 is followed by step 1730. Step 1730 is followed by step 1740.

Step 1710 of obtaining different SAXS patterns for different angular relationships between the wafer and the illuminating X-ray. The different angular relationships may be obtained by rotating the array and/or by rotating the X-ray about a rotation axis.

Step 1720 of calculating, for each one of the different SAXS patterns, sum of intensities within each of the one or more angular range are calculated.

Step 1730 of calculating one or more relationships (angle-intensity sum relationships) between (i) one or more sums of intensities related of one or more angular ranges of the different SAXS patterns (related to different angular relationships) and (ii) the different angular relationships between the illuminating x-ray and the sample.

Step 1740 of processing the one or more angle-intensity sum relationships to provide the orientation information.

Method 1700 may be executed by the apparatus that obtained the SAXS patterns or may be calculated by a computer that does not belong to said apparatus.

Extracting Information Related to an Array of HAR Holes.

There may be provided an apparatus, method and computer program product for extracting information about the array of HAR holes.

There may be provided an apparatus, method and computer program product that may substantially remove from the SAXS pattern the contribution of the scattering of the x-ray beam by other structures that differ from the array of HAR holes (the other structures may be, for example, structures that have vastly different pitches from the HAR holes of the HAR array, structures that may have vastly different heights than the HAR holes of the array, the other structures may form be non-repetitive structures, may be one or more additional repetitive structures)—so that the SAXS pattern is more representative of the scattering by the array of HAR holes. For simplicity of explanation it is assumed that these other structures are one or more additional repetitive structures. HAR holes are non-limiting example of HAR structures.

The method may be used to substantially remove from the SAXS pattern other noises—such as but not limited to scattering from electronics of the detector that are positioned behind the active region. At least a part of the scattered pattern that reaches the active region passes through the active region, reaches the electronics, and may be back scattered (by the electronics) towards the active region.

The scattering from the electronics is merely a non-limiting example of noise that can be removed from the SAXS pattern. Such scattering may be insignificant, and the method, system and computer program product can be applied mutatis mutandis to other noises and/or may be applied even when such scattering is insignificant.

There may be provided an apparatus, method and computer program product that may analyze complex structures (such as HAR holes) by treating other scattering elements of the semiconductor sample (such as the one or more additional repetitive structures) as a source of "background" radiation. In the simplified model the intensity is assumed to be an incoherent sum of the intensity from the HAR holes and the intensity from one or more additional repetitive structures (referred to as underlayers), i.e. $I\_total(q)=I\_HAR(q)+I\_underlayers(q)+I\_system(q)=I\_HAR(q)+I\_effective-Background(q)$ The analysis of the HAR holes may require a reliable model (may not be possible due to complexity of underlayers or just unknown) or an estimate of $I\_underlayers(q)+I\_system(q)$ In order to estimate this "background" intensity distribution a relative tilt may be introduced between the x-ray beam and the semiconductor sample (for example by rotating the semiconductor sample about an omega-axis) so that it is sufficiently high that $I\_HAR(q)\sim 0$ which is typically somewhere in the range of 5-10 deg (not a hard range but an example).

These data are then either used directly or fitted using non-linear regression to give a parametric model involving peak functions such as encountered in X-ray analysis, for example sum of Gaussian, Lorentzian, Pseudo-Voigt or Pearson-VII. Directly using an empirical background may be advantageous when it cannot be modelled well using common peak functions which can, for example be the case for scattered intensity from slits in the system.

Once the parameters of this "effective background" mode are determined then they are held constant, or varied only slightly, and the intensity contribution is added to $I\_HAR(q)$ at low tilt angles so as to model the total scattered intensity distribution.

By accounting for the intensity from the underlayers then we get more accurate results for the HAR hole analysis.

Figure 39:
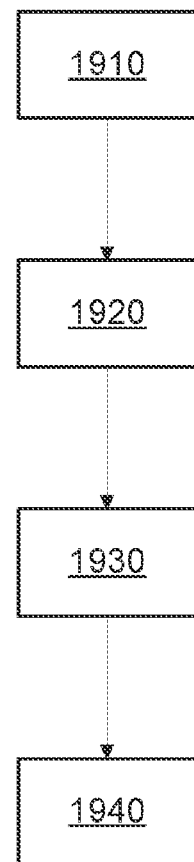
FIG. 39 illustrates an example of a method.

FIG. 39 illustrates method 1900.

Method 1900 may start by step 1910 of introducing a first angular relationship between a semiconductor element and an x-ray beam.

Step 1910 may be followed by step 1920 of illuminating the semiconductor object with the x-ray beam, while the first angular relationship is maintained and detecting a first SAXS pattern by a sensor.

While the first spatial relationship is maintained the x-ray beam (before impinging on the semiconductor element) is aligned (or substantially aligned) with the HAR holes and is normal (or substantially normal) to the longitudinal axis of the one or more additional repetitive structures.

While the first spatial relationship is maintained the sensor senses a first SAXS pattern that has a backscattered radiation component (back scattered from the electronics), and also includes a scattered pattern that is highly affected by the array of the HAR holes, and by the one or more additional repetitive structures.

Step 1920 may be followed by step 1930 of introducing a second angular relationship between the semiconductor element and the x-ray beam.

Step 1930 may be followed by step 1940 of illuminating the semiconductor object with the x-ray beam, while the second angular relationship is maintained, and detecting a second SAXS pattern the sensor.

While the second spatial relationship is maintained the x-ray beam (before impinging on the semiconductor element) is misaligned (or substantially aligned) with the HAR holes and is oblique (or substantially oblique) to the longitudinal axis of the one or more additional repetitive structures.

While the second angular relationship is maintained second spatial relationship is maintained the sensor senses a second SAXS pattern that has a backscattered radiation component (back scattered from the electronics), and also includes a scattered pattern that is still highly affected by the one or more additional repetitive structures but is less affected by the array of the HAR holes.

Step 1940 is followed by step 1950 of comparing between the first SAXS pattern and the second SAXS pattern to generate information about the array of HAR holes.

Especially—step 1950 may include subtracting the first SAXS pattern from the second SAXS pattern to provide a SAXS pattern that represents the scattering of the x-ray beam by the array of HAR holes.

The changing of the angular relationship may be executed by rotating at least one out of the x-ray beam and the semiconductor object.

The maintaining of the first spatial relationship may be associated with a first angular range between the x-ray beam and the semiconductor object. It has been found that when the aspect ratio of the HAR holes exceeds 10:1 (for example may be 40:1) the first angular range may range between plus two degrees and minus two degrees from a perfect alignment.

The maintaining of the second spatial relationship may be associated with a second angular range between the x-ray beam and the semiconductor object. It has been found that when the aspect ratio of the HAR holes exceeds 10:1 (for example may be 40:1) the second angular range may include deviations of at least two or three degrees from perfect alignment.

Alternatively or additionally, the method may include translating the sample to part of the sample that does not contain the HAR holes such as a scribe line test pad and obtaining an additional SAXS pattern that is less affected by the array of the HAR holes.

The second SAXS pattern and/or the additional SAXS pattern can be used to provide a SAXS pattern that can be a background SAXS pattern that can be used (with the first SAXS pattern) to isolate the contribution of the array of HAR holes to the SAXS pattern.

Figure 40:
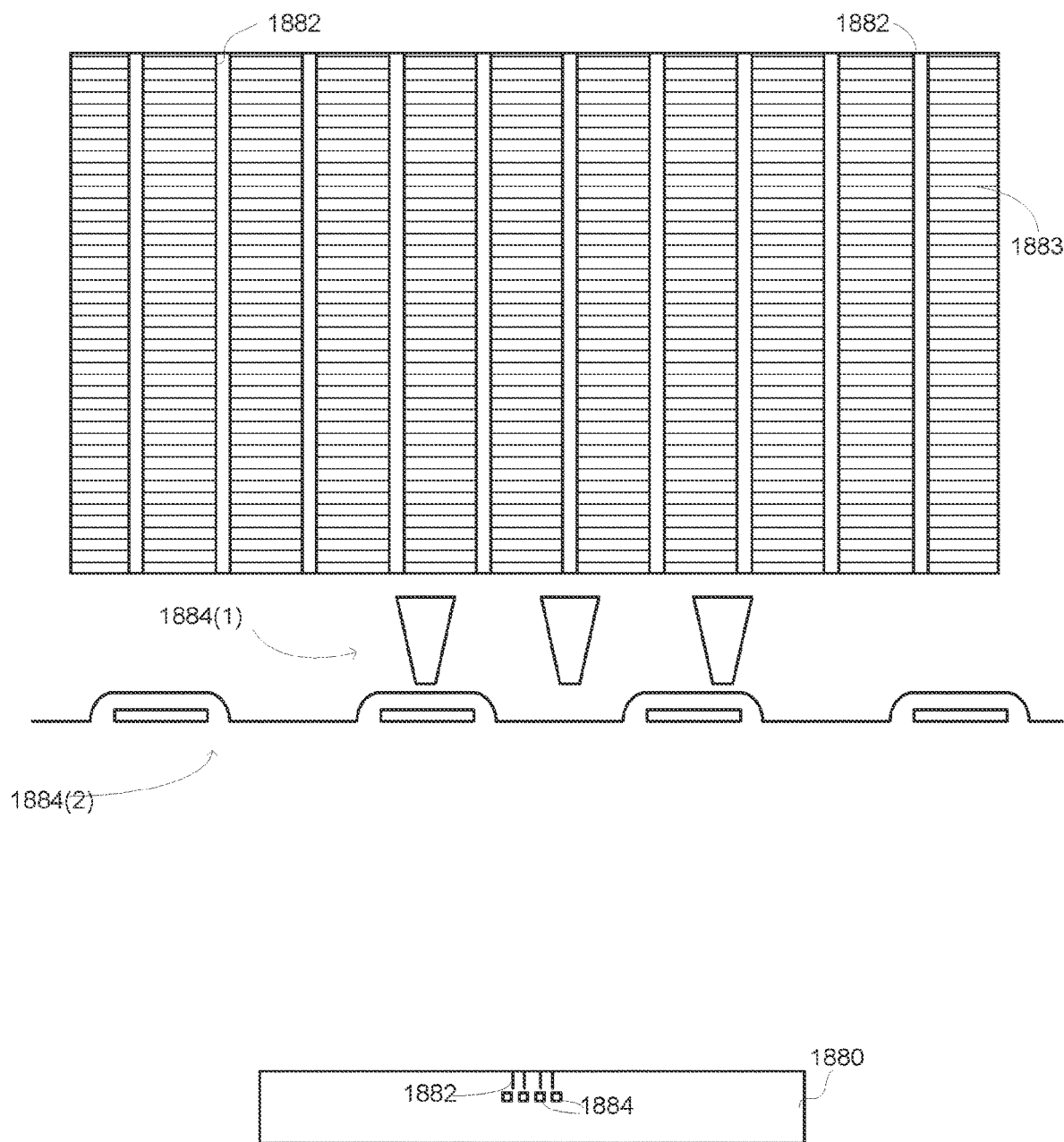
FIG. 40 illustrates an example of semiconductor object.

FIG. 40 illustrates an example of sample such as a semiconductor object.

The semiconductor object includes an array of HAR holes 1882 and one or more additional repetitive structures such as transistors 1884(2) and interconnects 1884(1). The HAR holes 1882 may be positioned between multiple layers within a vertical NAND (or 3D NAND) memory array.

The aspect ratio of the structural elements that form the one or more additional repetitive structures is much smaller than the aspect ratio of the HAR holes. These structural elements may be much thinner (along the x-axis) than the HAR holes. Accordingly—the scattering attributed to the HAR holes is much more sensitive to rotation that the scattering attributed to the one or more additional repetitive structures.

Figure 41:
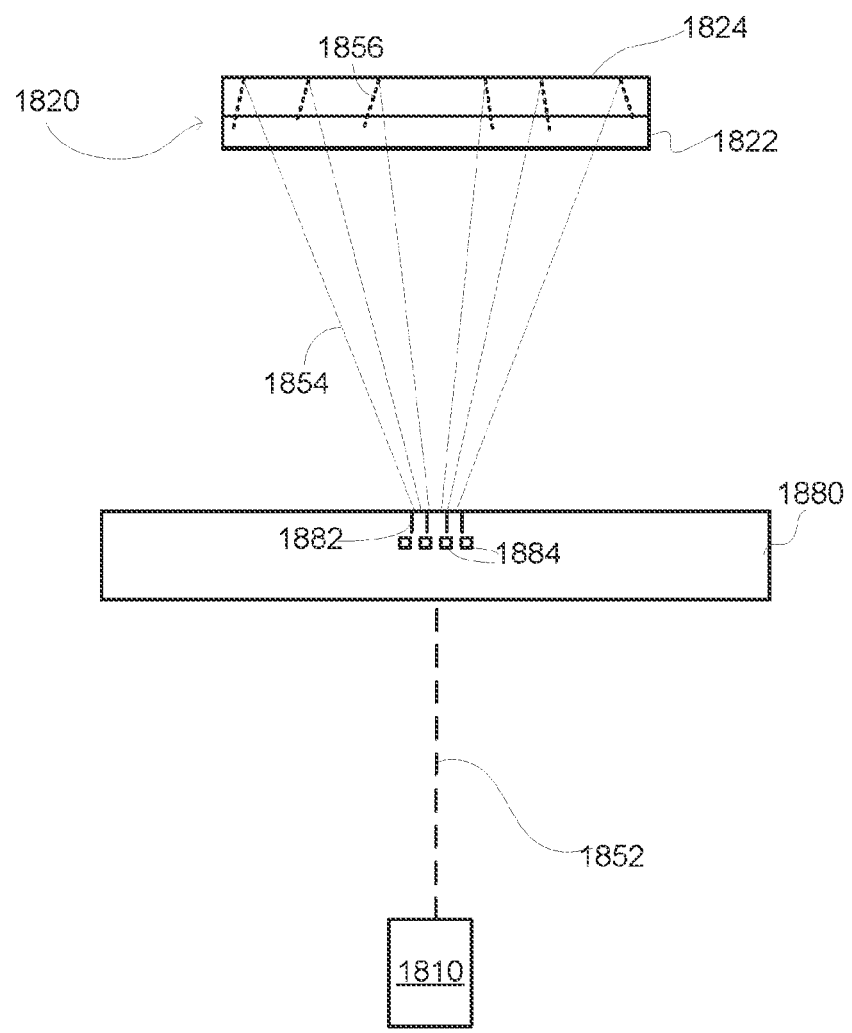
FIG. 41 illustrates an example of semiconductor object and of some parts of an X-ray scatterometry apparatus.

FIG. 41 illustrates an example of semiconductor object and of some parts of an X-ray scatterometry apparatus. In this figure the first angular relationship is maintained between x-ray 1852 and semiconductor object 1880.

In FIG. 41 the HAR holes 1882 and the one or more additional repetitive structures (collectively denoted 1884) scatter the x-ray to provide a scattered pattern that is generated due to scattering of the x-ray beam by the array of the HAR holes, and by the one or more additional repetitive structures.

The sensor 1820 has an active region 1822 and electronics 1824. The electronics backscatter radiation to provide backscattered radiation 1856.

The sensor 1820 senses a first SAXS pattern that has a backscattered radiation component (back scattered from the electronics), and also includes a scattered pattern that is generated due to scattering of the x-ray beam by the array of the HAR holes, and by the one or more additional repetitive structures.

Figure 42:
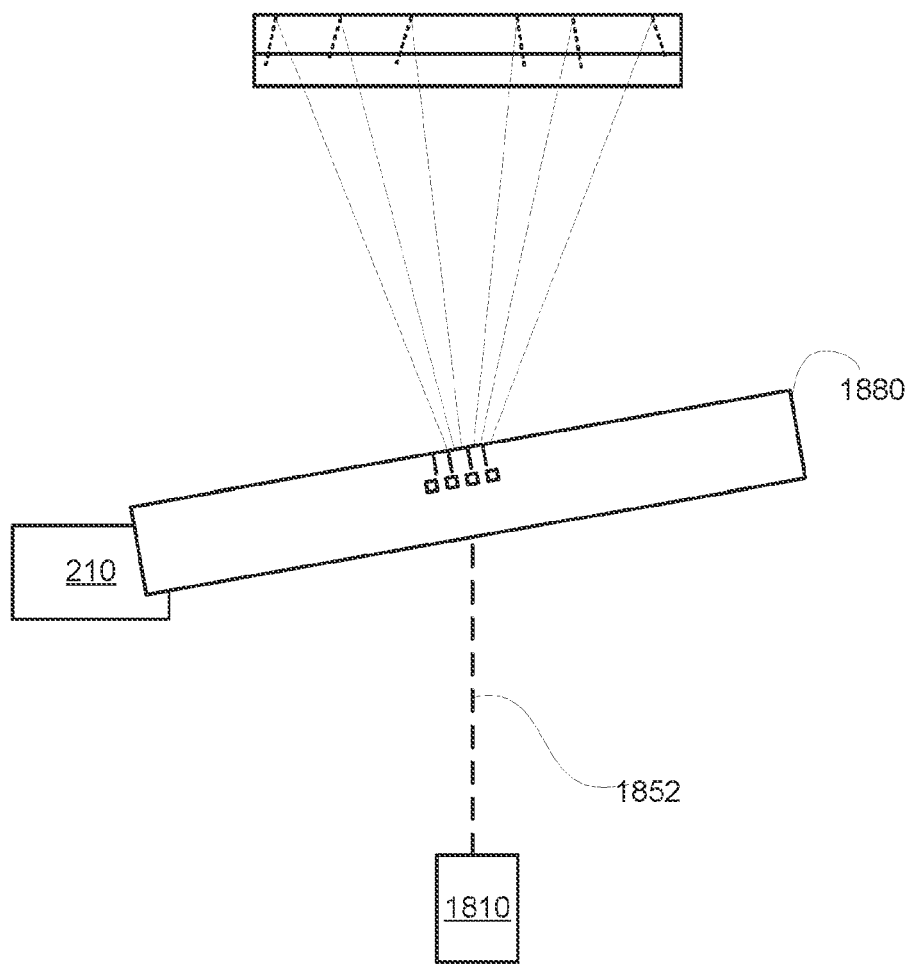
FIG. 42 illustrates an example of semiconductor object and of some parts of an X-ray scatterometry apparatus.

FIG. 42 illustrates an example of semiconductor object and of some parts of an X-ray scatterometry apparatus. In this figure the second angular relationship is maintained between x-ray 1852 and semiconductor object 1880.

In FIG. 42 the HAR holes 1882 almost to not affect the second SAXS pattern while the one or more additional repetitive structures (collectively denoted 1884) scatter the x-ray to provide a scattered pattern 1854 that is generated due to scattering of the x-ray beam by the one or more additional repetitive structures.

The electronics 1824 backscatter radiation to provide backscattered radiation 1856.

The sensor 1820 senses a second SAXS pattern that has a backscattered radiation component (back scattered from the electronics), and also includes a scattered pattern that is generated due to scattering of the x-ray beam by one or more additional repetitive structures.

Evaluating an Object from Different Angles

There may be provided an apparatus, method and computer program product for inspecting a semiconductor object from different angles.

The semiconductor object includes an array of structural elements. These structural elements have an electron density that substantially differs from the electron density of their surroundings. These structural elements have a longitudinal axis of a certain direction, and exhibit a high aspect ratio (HAR).

Non-limiting example of the structural elements are HAR holes—either filled HAR holes or unfilled HAR holes. It is noted that the structural elements may differ from HAR holes. For simplicity of explanation it is assumed that the structural elements are HAR holes.

The most intense scattering (strongest SAXS pattern) occurs when the X-rays are aligned with structure is because this is the direction that minimizes the net path, and hence, phase differences between the objects in the array and hence minimizes the reduction in intensity from destructive interference. In this "forward" direction there are the highest number of diffraction peaks visible because of the high intensity and it may be beneficial to obtain good angular resolution in two directions—both along the x-axis and the y-axis.

Angular deviation from this setup (before hitting the semiconductor object) provides lower quality SAXS patterns.

According to an embodiment of the invention there may be provided a method that determines one or more x-ray beam parameters (such as x-ray beam shape and/or size) as a function of the angular relationship between the x-ray beam and the semiconductor object.

For example—when the x-ray beam is aligned (before hitting the semiconductor object) with the HAR holes (assuming that the sensor and the semiconductor object are parallel to each other)—the x-ray beam may be collimated in both x-axis and in y-axis. This will result, for example, of a circular cross section of the x-ray beam at the plane of the sensor, at the plane of the semiconductor object and at the output of the x-ray source—for example at a plane of micro-slits that shape the cross section of the beam.

The suggested system and method may change the range of angles illuminating the sample without changing the area of illumination (on the sample). At a certain spatial relationship there may be a low range of incident angles (collimated beam) in the vicinity of the beam being normal to the features/sample and at another spatial relationship (for example a larger tilt) the angular range may be increased. In both cases the spot (on the sample) may be maintained at a relatively small area—for example by focusing the x-ray beam on the spot. Slits (apertures) are positioned before the optics and before the sample towards the source may be increased to increase the range of angles. Additionally, the suggested system and method may change the area of illumination without changing the range of angles illuminating the sample by changing the sizes of the aperture of the slits before the optic and before the sample.

Assuming that the semiconductor object is rotated in relation to the detector and to the x-ray beam then the x-ray beam may be collimated along the x-axis while be non-collimated along the y-axis at the plane of the sensor and at the output of the x-ray source—and have an elliptical shape. At the plane of the semiconductor object the x-ray beam is circular.

The eccentricity of the ellipse changes with the angular misalignment.

Larger range of incident angles may increase the strength of the SAXS patterns—but may increase the overlap between diffraction orders of the SAXS patterns. The overlaps as the tilt angle is increased may be tolerated and beneficial—at is may be compensated by using SAXS patterns that were acquire using less overlapping or even non-overlapping SAXS patterns—obtained at lower angular misalignments.

A gain in intensity may be beneficial over the loss in angular resolution for higher tilt angles since there are fewer diffraction peaks and they have relatively low intensity compared to case of low tilt angles of the sample.

The change in the range of angular illumination at the sample may be performed in various manners—for by using an aperture of an adjustable shape and/or size, by selecting between apertures that differ from each other by shape and/or size, by using different reflective and/or diffractive optics optimized for collimated and focused beams and the like.

The parameters of the x-ray beam (for example a size and/or eccentricity of an elliptical cross section of the x-ray beam) may be a set based on at least one out of:

The deviation angle between the x-ray beam and a certain direction in which the HAR holes and the x-ray beam are aligned. For example, the size of the beam may be reduced as the angle of the sample is increased so as to maintain a constant illuminated area on the sample, which can be important for small test pad structures. Also, the divergence of the X-ray beam may be reduced (increased resolution) when the X-ray beam is substantially parallel to the axis of the HAR holes so as to clearly resolve the individual diffraction orders and increase the sensitivity to disorder within the array that is not accessible with higher divergences used to assess the average shape of the HAR holes. As an example, for HAR holes with an in-plane spacing of ~150 nm then a typical high-resolution divergence may be ~0.2 mrad whereas a high-flux divergence used to assess average shape may be around 0.4-0.5 mrad.

Any measured and/or estimated parameter of the sensed SAXS pattern (such as but not limited to a measured and/or estimated SNR of the SAXS pattern). For example, the divergence angle of the X-ray beam may be adjusted in one direction to increase the incident flux substantially and accuracy/precision or throughput when measuring 2D structures, such as HAR trenches, that do not require high resolution in both directions in the plane of the sample in order to determine the shape of the structure.

The expected overlap between different lobes of the SAXS pattern depends on the pitch of the structure relative to the divergence of the incident X-ray beam with smaller pitch structures having larger spacing between adjacent diffraction orders and, as such, can benefit from a higher divergence beam with higher flux than a large pitch structure. For example, scattering from dynamic random-access memory (DRAM) capacitor structures with pitch <100 nm can be advantageously measured with a higher divergence (>0.5 mrad for example) beam for 3D NAND channel holes with pitch ~150 nm where a divergence >0.5 mrad would cause significant overlap between adjacent diffraction orders which would degrade the accuracy and precision of the profile from the later structures.

Information already obtained in previous measurements—especially when one or more different angular relationships existed between the x-ray beam and the semiconductor object during the previous measurements. information The importance and/or priority of structures of the semiconductor object or the relevance of information that may exist in overlap areas between lobes of the SAXS pattern. For example, in the case of a vertical stack of two arrays of HAR holes then the information concerning the in-plane offset between the arrays can be determined using a beam with increased divergence and higher flux and at higher throughput than if accurate shapes of the holes is required due to the rather low frequency of the interference pattern as compared to the spacing between adjacent diffraction orders (see FIG. 53).

It should be noted that the shape of the x-ray beam may be elliptical or non-elliptical, may be a polygon, a curved shape, and the like.

It should be noted that the x-ray beam energy density may be changed from one measurement to another.

Figure 43:
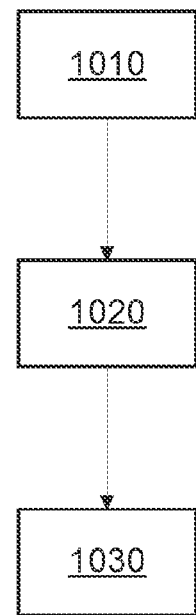
FIG. 43 illustrates an example of a method.

FIG. 43 illustrates method 1000.

Method 1000 may start by step 1010 of receiving or determining parameters (such as but not limited to at least one out of intensity, divergence, shape and size) of an x-ray beam and determining an angular relationship between a semiconductor element and the x-ray beam.

Step 1010 may be followed by step 1020 of introducing the angular relationship between the semiconductor element and the x-ray beam.

Step 1020 may be followed by step 1030 of illuminating the semiconductor object by an x-ray beam that has the parameters, while the angular relationship is maintained, and detecting a SAXS pattern (or any other signal) by a sensor.

Step 1030 maybe followed by step 1010—during which the method may change at least one out of (a) one or more parameters of the x-ray beam, and (b) the angular relationship.

Multiple iterations of steps 1010-1030 may be executed.

The determining of step 1010 may be responsive to an outcome of step 1030. For example—a SAXS pattern (or any other signal) may be processed and/or analyzed to determine one or more parameters of the SAXS pattern (or any other signal).

Step 1010 may include determining the parameters of the x-ray beam (for example a size and/or eccentricity of an elliptical cross section) based on at least one out of:

a. The deviation angle.
b. Any measured and/or estimated parameter of the sensed SAXS pattern (such as but not limited to a measured and/or estimated SNR of the SAXS pattern).
c. The expected overlap between different lobes of the SAXS pattern.
d. Information already obtained in previous measurements—when one or more different angular relationships existed between the x-ray beam and the semiconductor object.
e. The importance and/or priority of structures of the semiconductor object.
f. The relevance of information that may exist in overlap areas between lobes of the SAXS pattern.

For example—

The deviation angle between the x-ray beam and a certain direction in which the HAR holes and the x-ray beam are aligned. For example, the size of the beam may be reduced as the angle of the sample is increased so as to maintain a constant illuminated area on the sample, which can be important for small test pad structures. Also, the divergence of the X-ray beam may be reduced (increased resolution) when the X-ray beam is substantially parallel to the axis of the HAR holes so as to clearly resolve the individual diffraction orders and increase the sensitivity to disorder within the array that is not accessible with higher divergences used to assess the average shape of the HAR holes. As an example, for HAR holes with an in-plane spacing of ~150 nm then a typical high-resolution divergence may be ~0.2 mrad whereas a high-flux divergence used to assess average shape may be around 0.4-0.5 mrad.

Any measured and/or estimated parameter of the sensed SAXS pattern (such as but not limited to a measured and/or estimated SNR of the SAXS pattern). For example, the divergence angle of the X-ray beam may be adjusted in one direction to increase the incident flux substantially and accuracy/precision or throughput when measuring 2D structures, such as HAR trenches, that do not require high resolution in both directions in the plane of the sample in order to determine the shape of the structure.

The expected overlap between different lobes of the SAXS pattern depends on the pitch of the structure relative to the divergence of the incident X-ray beam with smaller pitch structures having larger spacing between adjacent diffraction orders and, as such, can benefit from a higher divergence beam with higher flux than a large pitch structure. For example, scattering from dynamic random-access memory (DRAM) capacitor structures with pitch <100 nm can be advantageously measured with a higher divergence (>0.5 mrad for example) beam for 3D NAND channel holes with pitch ~150 nm where a divergence >0.5 mrad would cause significant overlap between adjacent diffraction orders which would degrade the accuracy and precision of the profile from the later structures.

Information already obtained in previous measurements—especially when one or more different angular relationships existed between the x-ray beam and the semiconductor object during the previous measurements. information The importance and/or priority of structures of the semiconductor object or the relevance of information that may exist in overlap areas between lobes of the SAXS pattern. For example, in the case of a vertical stack of two arrays of HAR holes then the information concerning the in-plane offset between the arrays can be determined using a beam with increased divergence and higher flux and at higher throughput than if accurate shapes of the holes is required due to the rather low frequency of the interference pattern as compared to the spacing between adjacent diffraction orders (see FIG. 53).

It should be noted that during one of more iteration of steps 1010-1030 the semiconductor object may be illuminated with an x-ray propagates at the certain direction.

Figure 44:
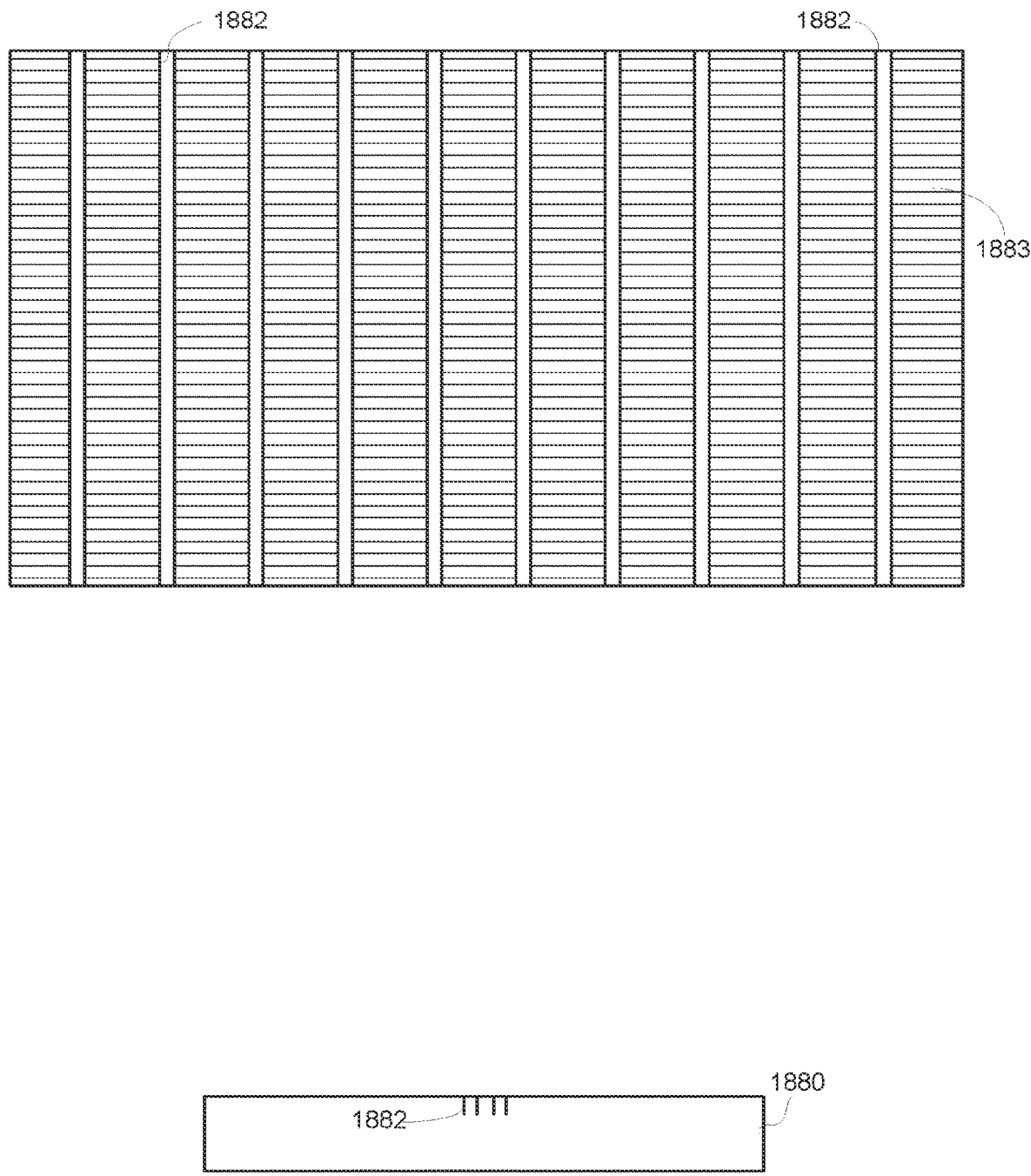
FIG. 44 illustrates an example of semiconductor object.

FIG. 44 illustrates an example of a semiconductor object.

The semiconductor object includes an array of HAR holes 1882. The HAR holes may be positioned between multiple layers within a vertical NAND (or 3D NAND) memory array or test structure.

Figure 45:
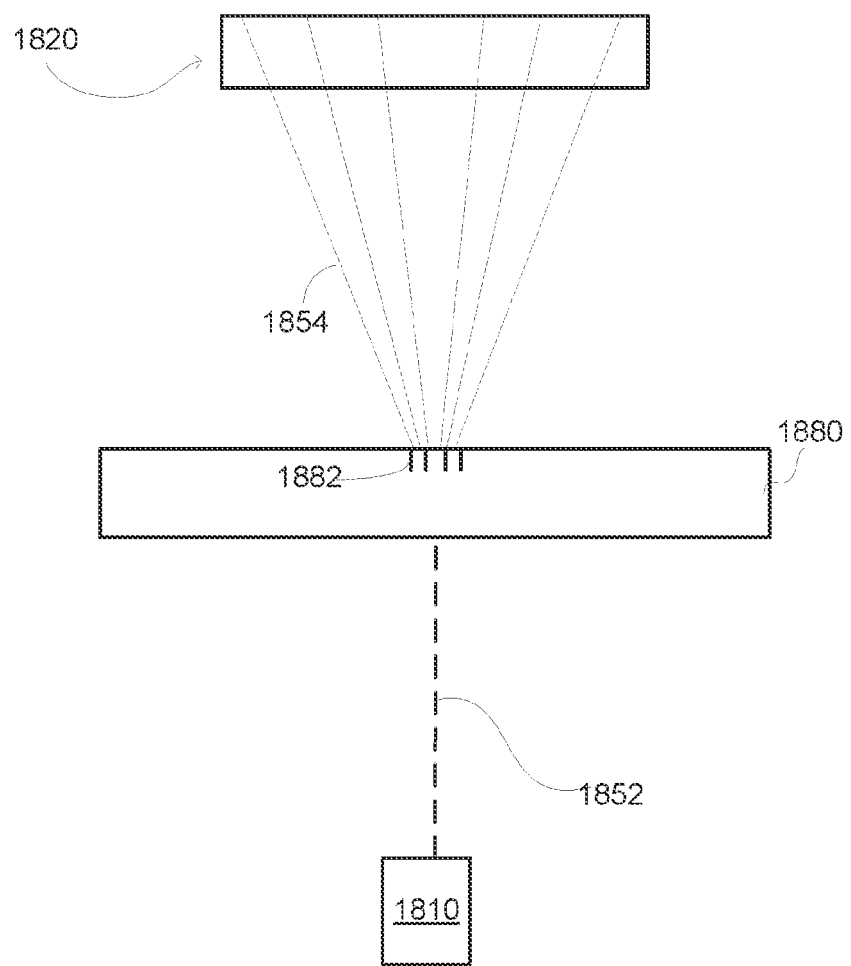
FIG. 45 illustrates an example of semiconductor object and of some parts of an X-ray scatterometry apparatus.

FIG. 45 illustrates an example of semiconductor object and of some parts of an X-ray scatterometry apparatus. In this figure the first angular relationship is maintained between x-ray 1852 and semiconductor object 1880.

In FIG. 45 the HAR holes 1882 scatter the x-ray to provide a scattered pattern 854 that is generated due to scattering of the x-ray beam by the array of the HAR holes.

Figure 46:
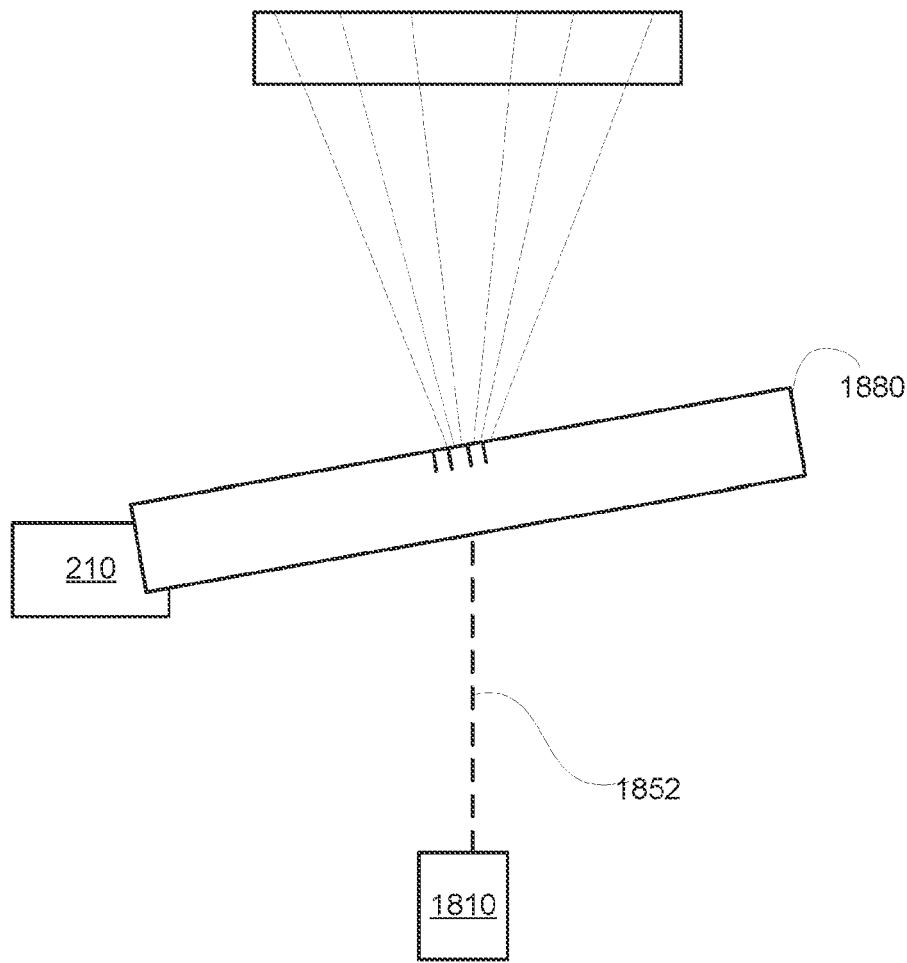
FIG. 46 illustrates an example of semiconductor object and of some parts of an X-ray scatterometry apparatus.
Figure 47:
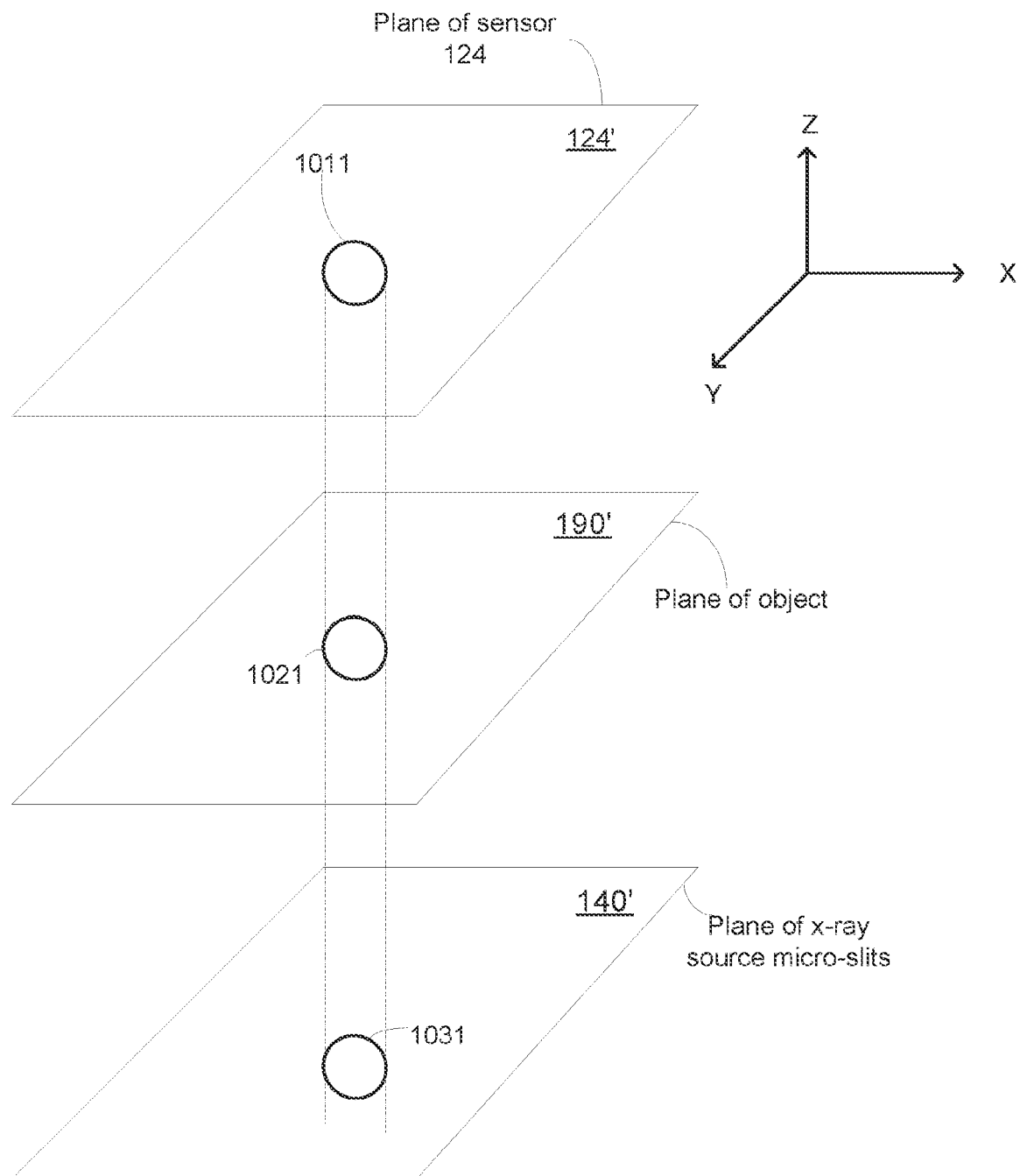

FIG. 46 illustrates an example of semiconductor object and of some parts of an X-ray scatterometry apparatus. In this figure the second angular relationship is maintained between x-ray 1852 and semiconductor object 1880.

FIGS. 47-52 illustrates cross sections of the x-ray beam at (a) the plane 140' of micro-slits 140, (b) the plane 190' of semiconductor object 190, and (c) at the plane 124' of the sensor 140.

Figure 48:
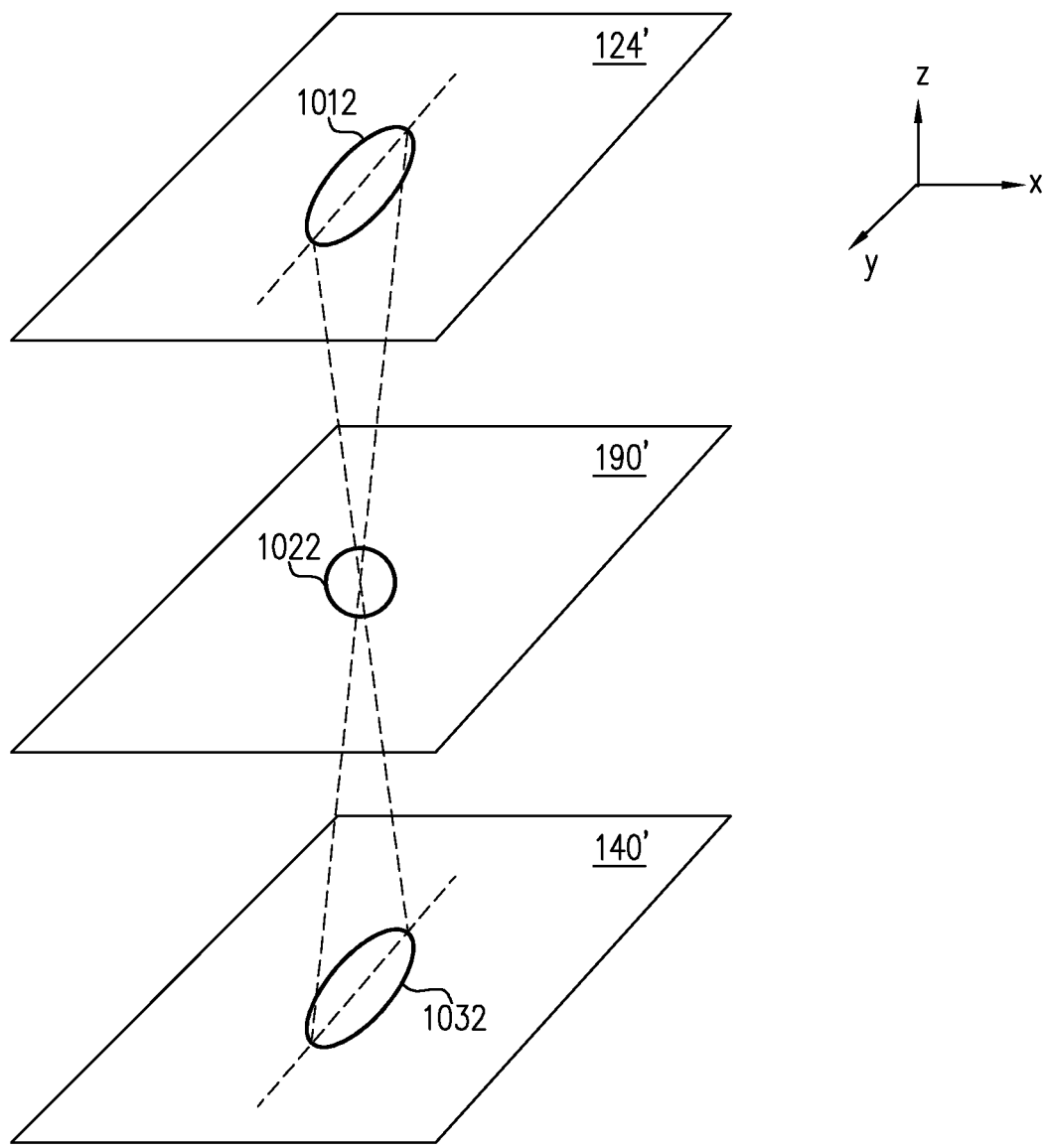
Figure 49:
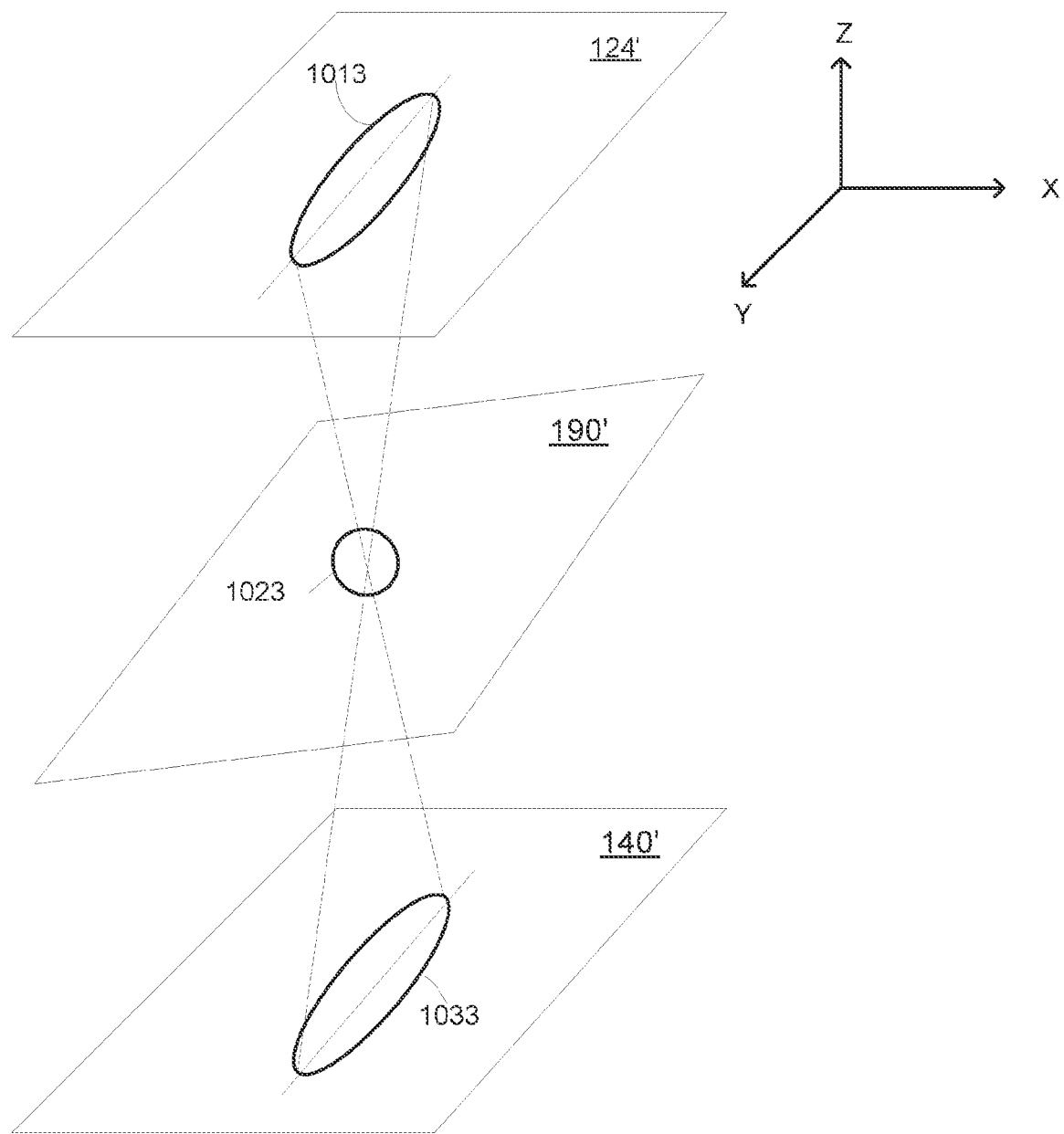
Figure 50:
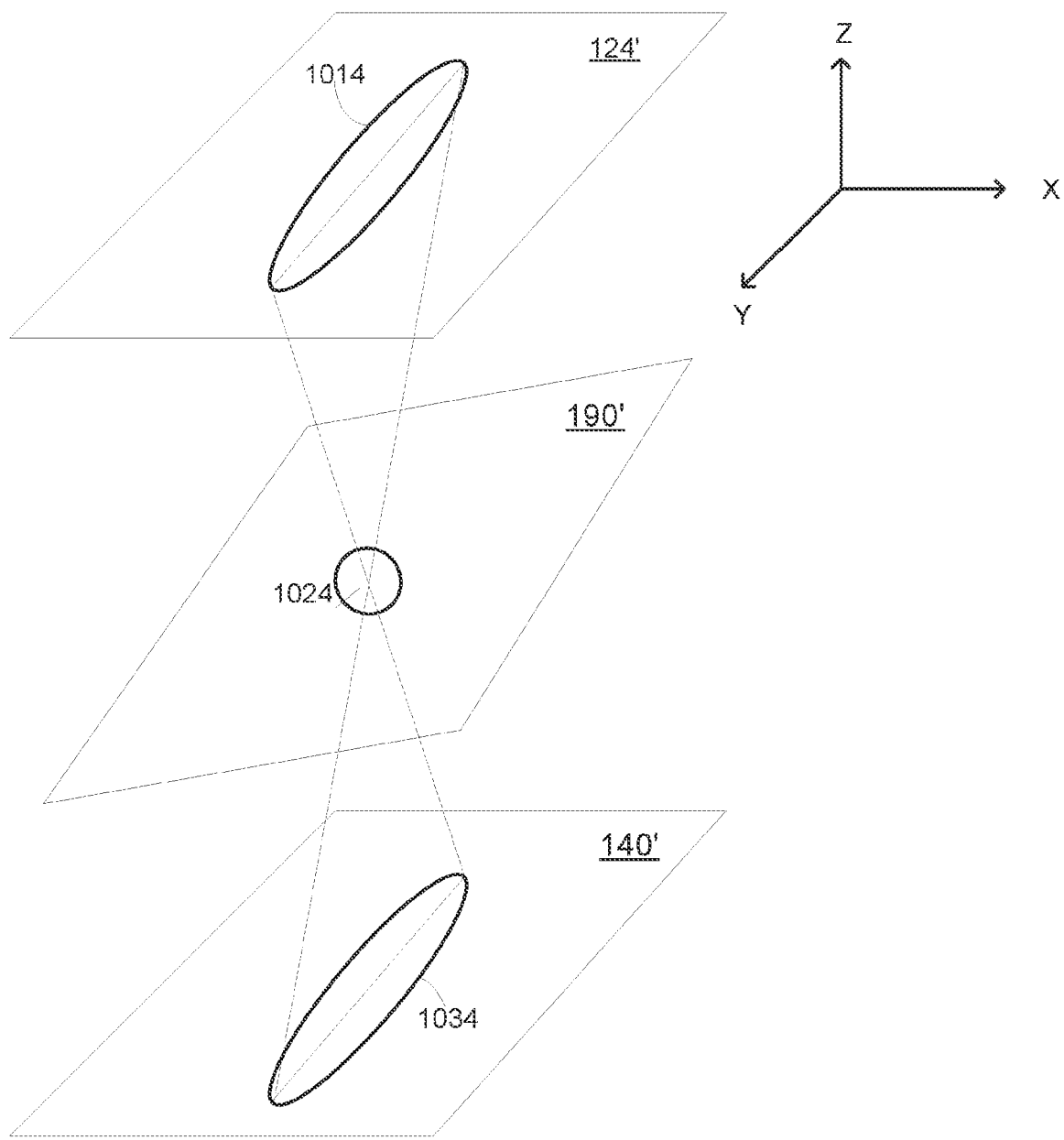

FIGS. 47-50 illustrate four example of four angular relationships—starting from alignment (FIG. 47—circular cross sections 1011, 1021 and 1031—at three planes 124', 190' and 140'), and continuing with elliptical cross sections of growing eccentricity (corresponding to increased misalignment)—in FIGS. 48, 49 and 50 (elliptical cross sections 1012, 1013 and 1014 at plane 124', elliptical cross sections 1032, 1033 and 1034 at plane 140') and circular cross section 1022; 1023 and 1024 at semiconductor plane 190'.

FIG. 51 illustrates a non-overlapping SAXS pattern 1041 obtained when the incident beam is aligned with the HAR holes and also illustrates an overlapping SAXS pattern 1042 obtained when the incident beam is misaligned with the HAR holes.

Figure 52:
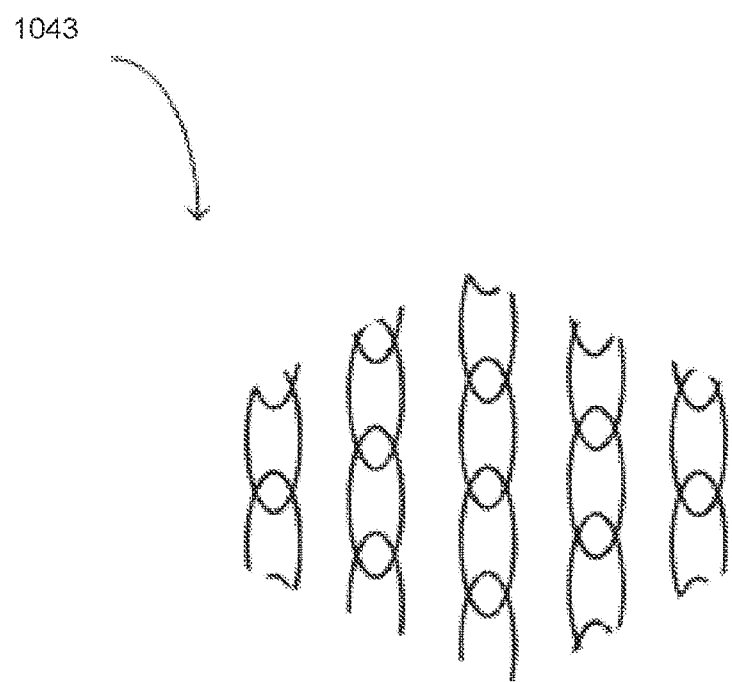

FIG. 52 illustrates a SAXS pattern 1043 that is obtained in the case of higher tile—which illustrates a higher divergence and less intensity.

There may be provided an x-ray apparatus that may include a mount that may be configured to hold a sample; an x-ray source, that may be configured to direct an x-ray beam toward a first side of the sample; a detector, positioned downstream to a second side of the sample, the detector may be configured to detect, during a sample measurement period, at least a part of x-rays that have been transmitted through the sample; and an x-ray intensity detector that may be positioned, during a beam intensity monitoring period at a measurement position that may be located between the x-ray source and the first side of the sample, so as to detect at least a part of the x-ray beam before the x-ray beam reaches the sample.

The sample measurement period and the beam intensity monitoring period do not overlap.

When positioned at the measurement position, the x-ray intensity detector may be configured to receive an entirety of the x-ray beam.

The x-ray apparatus may include a mechanical mechanism that may be configured to move the x-ray intensity detector between (a) the measurement position, and (b) an outside position in which the x-ray intensity detector may be positioned outside a path of the x-ray beam.

The mechanical mechanism may be configured to move the x-ray intensity detector between the measurement position and the outside position by a rotational movement within a plane that may be parallel to a plane of the first side of the sample.

The mechanical mechanism may be configured to move the x-ray intensity detector between the measurement position and the outside position by a rotational movement within a plane that may be not parallel to a plane of the first side of the sample.

The mechanical mechanism may be configured to move the x-ray intensity detector between the measurement position and the outside position by a linear movement within a plane that may be parallel to a plane of the first side of the sample.

The mechanical mechanism may be configured to move the x-ray intensity detector between the measurement position and the outside position by linear movements within a plane that may be not parallel to a plane of the first side of the sample.

The x-ray apparatus may include a beam limiter positioned upstream to the measurement position, wherein the beam limiter may include at least one mechanical element configured to determine at least one of a shape of the x-ray beam and a size of a cross section of the x-ray beam.

The mechanical mechanism may be configured to move the x-ray intensity detector between the measurement position and the outside position by a movement that may be parallel to the at least one mechanical element.

The mechanical mechanism may be configured to move the x-ray intensity detector between the measurement position and the outside position by a movement that may be non-parallel to the at least one mechanical element.

The beam limiter may include first and second blades, having respective first and second edges positioned in mutual proximity so as to define a slit, through which the beam of the X-rays will pass, at a distance smaller than mm from the first side of the sample; and first and second actuators, which may be configured to shift the first and second blades along respective, first and second translation axes so as to adjust a width of the slit.

The sample measurement period and the beam intensity monitoring period partially overlap.

The x-ray apparatus may be a semiconductor metrology tool.

There may be provided a method that may include holding a sample by a mount;

directing an x-ray beam toward a first side of the sample; detecting, during a sample measurement period and by a detector positioned downstream to a second side of the sample, at least a part of x-rays that have been transmitted through the sample and exited through the second side; and detecting at least a part of the x-ray beam before the x-ray beam reaches the sample, during a beam intensity monitoring period and by an x-ray intensity detector positioned at a measurement position that may be located between the x-ray source and the first side of the sample.

The sample measurement period and the beam intensity monitoring period do not overlap.

When positioned at the measurement position, the x-ray intensity detector may be configured to receive an entirety of the x-ray beam.

The method may include a mechanical mechanism that may be configured to move the x-ray intensity detector between (a) the measurement position, and (b) an outside position in which the x-ray intensity detector may be positioned outside a path of the x-ray beam.

The method may include moving the x-ray intensity detector between the measurement position and the outside position by a rotational movement within a plane that may be parallel to a plane of the first side of the sample.

The method may include moving the x-ray intensity detector between the measurement position and the outside position by a rotational movement within a plane that may be not parallel to a plane of the first side of the sample.

The method may include moving the x-ray intensity detector between the measurement position and the outside position by a linear movement within a plane that may be parallel to a plane of the first side of the sample.

The method may include moving the x-ray intensity detector between the measurement position and the outside position by a linear movement within a plane that may be not parallel to a plane of the first side of the sample.

The method may include determining, by a beam limiter positioned upstream to the measurement position and may include at least one mechanical element, at least one of a shape of the x-ray beam and a size of a cross section of the x-ray beam.

The method may include moving the x-ray intensity detector between the measurement position and the outside position by a movement that may be parallel to the at least one mechanical element.

The method may include moving the x-ray intensity detector between the measurement position and the outside position by a movement that may be non-parallel to the at least one mechanical element.

The beam limiter may include first and second blades, having respective first and second edges positioned in mutual proximity so as to define a slit, through which the beam of the X-rays will pass, at a distance smaller than mm from the first side of the sample; and first and second actuators, wherein the method may include shifting, by the first and second actuators, the first and second blades along respective, first and second translation axes so as to adjust a width of the slit.

The sample measurement period and the beam intensity monitoring period partially overlap.

There may be provided a non-transitory computer readable medium that that may store instructions for holding a sample by a mount; directing an x-ray beam toward a first side of the sample; detecting, during a sample measurement period and by a detector positioned downstream to a second side of the sample, at least a part of x-rays that have been transmitted through the sample and exited through the second side; and detecting at least a part of the x-ray beam before the x-ray beam reaches the sample, during a beam intensity monitoring period and by an x-ray intensity detector positioned at a measurement position that may be located between the x-ray source and the first side of the sample.

There may be provided an x-ray apparatus that may include a mount that may be configured to hold a sample; an x-ray source that may be configured to direct an x-ray beam toward a first side of the sample; a small angle x-ray scattering (SAXS) detector that may be positioned downstream to a second side of the sample, and configured to detect at least a part of a SAXS pattern formed by x-rays that have been transmitted through the sample and exited through the second side; and an x-ray fluorescence (XRF) detector that may be configured to detect fluorescent x-rays emitted from the sample; wherein the XRF detector may include an aperture.

The XRF sensor may be positioned upstream to the first side of the sample.

The XRF detector may include an aperture and wherein the x-ray source may be configured to direct the x-ray beam to pass through the aperture.

The XRF detector may be located within less than five millimeters from the first side of the sample.

The XRF sensor may be positioned downstream to the second side of the sample.

The aperture may be shaped and sized to enable the at least part of the SAXS pattern to reach the SAXS detector.

The apparatus may include an additional x-ray source that may be configured to direct another x-ray beam to pass through the aperture.

The XRF detector may be shaped and positioned to detect fluorescent x-rays emitted from the sample over a large solid angle.

The XRF detector may include at least one independent radiation sensing segment.

The XRF detector may include at least one independent silicon drift detector.

There may be provided a method that may include holding a sample by a mount; directing an x-ray beam toward a first side of the sample; detecting, by a small angle x-ray scattering (SAXS) detector that may be positioned downstream to a second side of the sample, at least a part of a SAXS pattern formed by x-rays that have been transmitted through the sample and exited through the second side; and detecting, by an x-ray fluorescence (XRF) detector, fluorescent x-rays emitted from the sample; wherein the XRF detector may include an aperture.

The XRF sensor may be positioned upstream to the first side of the sample.

The XRF detector may include an aperture and wherein the method may include directing, by the x-ray source, the x-ray beam to pass through the aperture.

The XRF detector may be located within less than five millimeters from the first side of the sample.

The XRF sensor may be positioned downstream to the second side of the sample.

The aperture may be shaped and sized to enable the at least part of the SAXS pattern to reach the SAXS detector.

The apparatus may include an additional x-ray source that may be configured to direct another x-ray beam to pass through the aperture.

The XRF detector may be shaped and positioned to detect fluorescent x-rays emitted from the sample over a large solid angle.

The XRF detector may include at least one independent radiation sensing segment.

The XRF detector may include at least one independent silicon drift detector. There may be provided a non-transitory computer readable medium that that may store instructions for holding a sample by a mount; directing an x-ray beam toward a first side of the sample; detecting, by a small angle x-ray scattering (SAXS) detector that may be positioned downstream to a second side of the sample, at least a part of a SAXS pattern formed by x-rays that have been transmitted through the sample and exited through the second side; and detecting, by an x-ray fluorescence (XRF) detector, fluorescent x-rays emitted from the sample; wherein the XRF detector may include an aperture.

There may be provided a method that for determining an orientation of an array of high aspect ratio (HAR) structures of a sample, the method may include obtaining different small angle x-ray scattering (SAXS) patterns for at least one out of different angular relationships or in-plane spatial relationships between the sample and an x-ray beam that illuminates the sample; wherein each SAXS pattern represents an angular intensity distribution of scattered x-ray detected by a SAXS sensor; calculating, for at least some of the different SAXS patterns, at least one sum of intensities within at least one angular range of the angular intensity distribution to provide a first plurality of sums; and determining the orientation of the array of HAR holes based at least on the first plurality of sums.

The determining may include comparing the first plurality of sums to reference sums that may be associated with known orientations of the array of HAR holes.

The calculating may include calculating the at least one sum of intensity within the at least one angular range for all of the different SAXS patterns.

The calculating may include calculating for one or more different SAXS patterns, two or more sums of intensities within two or more angular ranges of the angular intensity distribution.

The obtaining of the different SAXS patterns may include rotating the sample in relation to an x-ray beam that illuminates the sample to provide the different SAXS patterns.

The obtaining of the different SAXS patterns may include rotating, in relation to the sample, an x-ray beam that illuminates the sample to provide the different SAXS patterns.

There may be provided a non-transitory computer readable medium that that may store instructions for obtaining different small angle x-ray scattering (SAXS) patterns for different angular and/or in-plane spatial relationships between a sample that may include an array of high aspect ratio (HAR) holes and an x-ray beam that illuminates the sample; wherein each SAXS pattern represents an angular intensity distribution of scattered x-ray detected by a SAXS sensor; calculating, for at least some of the different SAXS patterns, at least one sum of intensities within at least one angular range of the angular intensity distribution to provide a first plurality of sums; and determining an orientation of the array of HAR holes based on the first plurality of sums.

The determining may include comparing the first plurality of sums to reference sums that may be associated with known orientations of the array of HAR holes.

The calculating may include calculating the at least one sum of intensity within the at least one angular range for all of the different SAXS patterns.

The calculating may include calculating for one or more different SAXS patterns, two or more sums of intensities within two or more angular ranges of the angular intensity distribution.

The obtaining of the different SAXS patterns may include rotating the sample in relation to an x-ray beam that illuminates the sample to provide the different SAXS patterns.

The obtaining of the different SAXS patterns may include rotating, in relation to the sample, an x-ray beam that illuminates the sample to provide the different SAXS patterns.

There may be provided an apparatus that may include a mount that may be configured to hold a sample that may include an array of high aspect ratio (HAR) holes; x-ray optics that may be configured to obtain different small angle x-ray scattering (SAXS) patterns for different angular relationships between the sample and an x-ray beam that illuminates the sample; wherein each SAXS pattern represents an angular intensity distribution of scattered x-ray detected by a SAXS sensor; a processor that may be configured to (a) calculate, for at least some of the different SAXS patterns, at least one sum of intensities within at least one angular range of the angular intensity distribution to provide a first plurality of sums; and (b) determine the orientation of the array of HAR holes based on the first plurality of sums.

The determining may include comparing the first plurality of sums to reference sums that may be associated with known orientations of the array of HAR holes.

The calculating may include calculating the at least one sum of intensity within the at least one angular range for all of the different SAXS patterns.

The calculating may include calculating for one or more different SAXS patterns, two or more sums of intensities within two or more angular ranges of the angular intensity distribution.

The obtaining of the different SAXS patterns may include rotating the sample in relation to an x-ray beam that illuminates the sample to provide the different SAXS patterns.

The obtaining of the different SAXS patterns may include rotating, in relation to the sample, an x-ray beam that illuminates the sample to provide the different SAXS patterns.

There may be provided a method that for determining an orientation and shape of an array of high aspect ratio (HAR) structures of a sample, the method may include illuminating the sample with an x-ray beam, while the x-ray beam may be substantially parallel to the HAR holes of the array; wherein the sample further may include one or more additional repetitive structures; wherein an aspect ratio of structural elements that form the one or more additional repetitive structures may be much smaller than an aspect ratio of the HAR holes; sensing a first small angle x-ray scattering (SAXS) pattern by a SAXS detector; changing a spatial relationship between the sample and an optical axis of the x-ray beam; illuminating the sample with the x-ray beam, while the x-ray beam may be substantially oblique to the HAR holes of the array; sensing a second SAXS pattern by the SAXS detector; determining a relationship between the first and second SAXS patterns; and generating information about the array of HAR holes based on the relationship between the first and second SAXS patterns.

The one or more additional repetitive structure may be substantially parallel to the array of HAR holes.

The changing of the spatial relationship may include changing a spatial relationship between the x-ray beam and the sample to substantially eliminate an effect of the array on the second SAXS pattern.

The changing of the spatial relationship may include rotating the sample.

The changing of the spatial relationship may include rotating the x-ray beam.

The method may include estimating, based on the relationship, a combined effect of the additional repetitive structures and backscattered x-ray radiation.

The x-ray beam may be substantially parallel to the HAR holes of the array by deviating up to two degrees from a prefect alignment with a longitudinal axis of the HAR holes.

There may be provided a non-transitory computer readable medium that that may store instructions for illuminating a sample with a x-ray beam, while the x-ray beam may be substantially parallel to high aspect ratio (HAR) holes of an array of HAR holes that belong to the sample; wherein the sample further may include one or more additional repetitive structures; wherein an aspect ratio of structural elements that form the one or more additional repetitive structures may be much smaller than an aspect ratio of the HAR holes; sensing a first small angle x-ray scattering (SAXS) pattern by a SAXS detector; changing a spatial relationship between the sample and an optical axis of the x-ray beam; illuminating the sample with the x-ray beam, while the x-ray beam may be substantially oblique to the HAR holes of the array; sensing a second SAXS pattern by the SAXS detector; determining a relationship between the first and second SAXS patterns; and generating information about the array of HAR holes based on the relationship between the first and second SAXS patterns.

The one or more additional repetitive structure may be substantially parallel to the array of HAR holes.

The changing of the spatial relationship may include changing a spatial relationship between the x-ray beam and the sample to substantially eliminate an effect of the array on the second SAXS pattern.

The changing of the spatial relationship may include rotating the sample.

The changing of the spatial relationship may include rotating the x-ray beam.

The non-transitory computer readable medium that may store instructions for estimating, based on the relationship, a combined effect of the additional repetitive structures and backscattered x-ray radiation.

The x-ray beam may be substantially parallel to the HAR holes of the array by deviating up to two degrees from a prefect alignment with a longitudinal axis of the HAR holes.

There may be provided an apparatus that may include a mount that may be configured to hold a sample that may include an array of high aspect ratio (HAR) holes and may include one or more additional repetitive structures; wherein an aspect ratio of structural elements that form the one or more additional repetitive structures may be much smaller than an aspect ratio of the HAR holes; x-ray optics that may be configured to (i) illuminate a sample with a x-ray beam, while the x-ray beam may be substantially parallel to high aspect ratio (HAR) holes of an array of HAR holes, (ii) sense a first small angle x-ray scattering (SAXS) pattern by a SAXS detector; (iii) change a spatial relationship between the sample and an optical axis of the x-ray beam; (iv)

illuminate the sample with the x-ray beam, while the x-ray beam may be substantially oblique to the HAR holes of the array; and (v) sense a second SAXS pattern by the SAXS detector; and a processor that may be configured to (i) determine a relationship between the first and second SAXS patterns; and (ii) generate information about the array of HAR holes based on the relationship between the first and second SAXS patterns.

The one or more additional repetitive structure may be substantially parallel to the array of HAR holes.

The changing of the spatial relationship may include changing a spatial relationship between the x-ray beam and the sample to substantially eliminate an effect of the array on the second SAXS pattern.

The changing of the spatial relationship may include rotating the sample.

The changing of the spatial relationship may include rotating the x-ray beam.

The apparatus may include estimating, based on the relationship, a combined effect of the additional repetitive structures and backscattered x-ray radiation.

The x-ray beam may be substantially parallel to the HAR holes of the array by deviating up to two degrees from a prefect alignment with a longitudinal axis of the HAR holes.

There may be provided a method that for evaluating a sample that may include an array of structural elements, the method may include obtaining a first small angle x-ray scattering (SAXS) pattern for a first angular relationship between the sample and an x-ray beam that exhibits a first collimation value; obtaining a second SAXS pattern for a second angular relationship between the sample and the x-ray beam, while the x-ray beam exhibits a second collimation value that differs from the first collimation value; wherein the second angular relationship differs from the first angular relationship; and wherein the obtaining of the first and second SAXS patterns may include substantially maintaining an area of a cross section of the x-ray on a first side of the sample during the obtaining of the first and second SAXS patterns.

The method may include obtaining at least one additional SAXS pattern for at least one additional angular relationship between the sample and the x-ray beam; wherein each additional angular relationship, the first and second angular relationships differ from each other; wherein the obtaining of each additional SAXS pattern may include substantially maintaining the area of the cross section of the x-ray on the first side of the sample while changing the collimation of the x-ray beam.

The method may include evaluating the sample based, at least, on the first and second SAXS patterns.

The obtaining of the first SAXS pattern and the obtaining of the second SAXS pattern further differ from each other by an intensity of the x-ray beam.

The cross section of the x-ray beam has a circular shape and wherein a difference between the first collimation value and the second collimation value determines an eccentricity of diffraction orders of first and second SAXS patterns.

The first angular relationship may be a first angle of illumination the second angular relationship may be a second angle of illumination, wherein the second angle of illumination exceeds the first angle of illumination and wherein the first collimation value represents an x-ray beam that may be more collimated than an x-ray beam having the second collimation value.

The method may include determining the second collimation value based on at least signal to noise ratio associated with the second SAXS pattern.

The method may include determining the second collimation value based on at least an expected overlap between lobes of the second SAXS pattern.

The method may include determining the second collimation value based on information obtained from the first SAXS pattern.

The method may include determining the second collimation value based on a priority or importance of the array of structural elements.

There may be provided a non-transitory computer readable medium that that may store instructions for obtaining a first small angle x-ray scattering (SAXS) pattern for a first angular relationship between a sample and an x-ray beam that exhibits a first collimation value; wherein the sample may include an array of structural elements; obtaining a second SAXS pattern for a second angular relationship between the sample and the x-ray beam, while the x-ray beam exhibits a second collimation value that differs from the first collimation value; wherein the second angular relationship differs from the first angular relationship; and wherein the obtaining of the first and second SAXS patterns may include substantially maintaining an area of a cross section of the x-ray on a first side of the sample during the obtaining of the first and second SAXS patterns.

The non-transitory computer readable medium that may store instructions for obtaining at least one additional SAXS pattern for at least one additional angular relationship between the sample and the x-ray beam; wherein each additional angular relationship, the first and second angular relationships differ from each other; wherein the obtaining of each additional SAXS pattern may include substantially maintaining the area of the cross section of the x-ray on the first side of the sample while changing the collimation of the x-ray beam.

The non-transitory computer readable medium that may store instructions for evaluating the sample based, at least, on the first and second SAXS patterns.

The obtaining of the first SAXS pattern and the obtaining of the second SAXS pattern further differ from each other by an intensity of the x-ray beam.

The cross section of the x-ray beam has a circular shape and wherein a difference between the first collimation value and the second collimation value determines an eccentricity of diffraction orders of first and second SAXS patterns.

The first angular relationship may be a first angle of illumination the second angular relationship may be a second angle of illumination, wherein the second angle of illumination exceeds the first angle of illumination and wherein the first collimation value represents an x-ray beam that may be more collimated than an x-ray beam having the second collimation value.

The non-transitory computer readable medium that may store instructions for determining the second collimation value based on at least signal to noise ratio associated with the second SAXS pattern.

The non-transitory computer readable medium that may store instructions for determining the second collimation value based on at least an expected overlap between lobes of the second SAXS pattern.

The non-transitory computer readable medium that may store instructions for determining the second collimation value based on information obtained from the first SAXS pattern.

The non-transitory computer readable medium that may store instructions for determining the second collimation value based on a priority or importance of the array of structural elements.

There may be provided an x-ray apparatus that may include a mount for holding a sample that may include an array of structural elements; x-ray optics that may be configured to obtain a first small angle x-ray scattering (SAXS) pattern for a first angular relationship between the sample and an x-ray beam that exhibits a first collimation value; and obtain a second SAXS pattern for a second angular relationship between the sample and the x-ray beam, while the x-ray beam exhibits a second collimation value that differs from the first collimation value; wherein the second angular relationship differs from the first angular relationship; wherein an obtaining of the first and second SAXS patterns may include substantially maintaining an area of a cross section of the x-ray on a first side of the sample during the obtaining of the first and second SAXS patterns.

The x-ray apparatus that may include a processor that may be configured to evaluate the sample based, at least, on the first and second SAXS patterns.

The processor may be configured to determine the second collimation value based on at least signal to noise ratio associated with the second SAXS pattern.

The processor may be configured to determine the second collimation value based on at least an expected overlap between lobes of the second SAXS pattern.

The processor may be configured to determine the second collimation value based on information obtained from the first SAXS pattern.

The processor may be configured to determine the second collimation value based on a priority or importance of the array of structural elements.

The apparatus that may be configured to obtain at least one additional SAXS pattern for at least one additional angular relationship between the sample and the x-ray beam; wherein each additional angular relationship, the first and second angular relationships differ from each other; wherein the obtaining of each additional SAXS pattern may include substantially maintaining the area of the cross section of the x-ray on the first side of the sample while changing the collimation of the x-ray beam.

The obtaining of the first SAXS pattern and the obtaining of the second SAXS pattern further differ from each other by an intensity of the x-ray beam.

The cross section of the x-ray beam has a circular shape and wherein a difference between the first collimation value and the second collimation value determines an eccentricity of diffraction orders of first and second SAXS patterns.

The first angular relationship may be a first angle of illumination the second angular relationship may be a second angle of illumination, wherein the second angle of illumination exceeds the first angle of illumination and wherein the first collimation value represents an x-ray beam that may be more collimated than an x-ray beam having the second collimation value.

The term "configured to" may mean "constructed and arranged to".

Any reference to "comprising" should be applied mutatis mutandis to "consisting" and to "consisting essentially of".

Any combination of any step of any method can be provided. Thus—steps from two or more methods can be a part of a method covered by this application.

Any combination of any instructions stored in any non-transitory computer readable medium may be provided. Thus, a computer readable medium may store instructions for executing any combinations of steps of one or more methods illustrated in the specification.

Any combination of any components (for example—sensors, optics, mechanical elements, detectors, and the like) illustrated in the application may be provided.

Any reference to any one of a method, an apparatus (including an x-ray apparatus), and a non-transitory computer readable medium should be applied mutatis mutandis to any other one of the method, apparatus (including the x-ray apparatus), and the non-transitory computer readable medium.

The drawings may be of scale or may not be of scale.

Although the embodiments described herein mainly address X-ray analysis of single-crystal, polycrystalline or amorphous samples, such as semiconductor wafers, the methods and systems described herein can also be used in other technological of applications of arrays of nanostructures.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for evaluating an array of high aspect ratio (HAR) structures on a sample, the method comprises:
    illuminating the sample with an x-ray beam along a first axis parallel to within two degrees to the HAR structures in the array;
    sensing a first pattern of small angle x-ray scattering (SAXS) scattered from the sample while illuminating the sample along the first axis;
    illuminating the sample with the x-ray beam along a second axis that is oblique to the HAR structures in the array;
    sensing a second pattern of the SAXS scattered from the sample while illuminating the sample along the second axis; and
    extracting information with respect to the HAR structures based on the first and second patterns by removing from the first pattern of the SAXS a contribution of one or more additional repetitive structures on the substrate having an aspect ratio smaller than the HAR structures, responsively to a sensitivity of the second pattern to rotation of the second axis.

2. The method according to claim 1, wherein the HAR structures comprise holes having an aspect ratio exceeding 10:1.

3. The method according to claim 2, wherein the second axis deviates by at least three degrees from alignment with the holes.

4. The method according to claim 1, wherein extracting the information comprises subtracting the second pattern from the first pattern.

5. The method according to claim 1, wherein extracting the information comprises generating a model of background scattering responsively to the second pattern, and applying the model in analyzing a contribution of the HAR structures to the first pattern.

6. The method according to claim 1, wherein extracting the information comprises removing from the first pattern of the SAXS a contribution of backscattered X-rays.

7. The method according to claim 1, wherein illuminating the sample with the x-ray beam along the second axis comprises setting an angle of the second axis so as to eliminate from the second pattern of the SAXS a contribution of the HAR structures.

8. The method according to claim 1, wherein illuminating the sample with the x-ray beam along the second axis comprises rotating the sample relative to the x-ray beam.

9. The method according to claim 1, wherein illuminating the sample with the x-ray beam along the second axis the changing of the spatial relationship comprises rotating the x-ray beam relative to the sample.

10. A non-transitory computer readable medium that stores instructions for: illuminating a sample having an array of high aspect ratio (HAR) structures thereon with an x-ray beam along a first axis parallel to within two degrees to the HAR structures in the array, sensing a first pattern of small angle x-ray scattering (SAXS) scattered from the sample while illuminating the sample along the first axis, illuminating the sample with the x-ray beam along a second axis that is oblique to the HAR structures in the array, sensing a second pattern of the SAXS scattered from the sample while illuminating the sample along the second axis, and extracting information with respect to the HAR structures based on the first and second patterns by removing from the first pattern of the SAXS a contribution of one or more additional repetitive structures on the substrate having an aspect ratio smaller than the HAR structures, responsively to a sensitivity of the second pattern to rotation of the second axis.

11. An apparatus, comprising:
a mount configured to hold a sample that includes an array of high aspect ratio (HAR) structures;
x-ray optics configured to illuminate the sample in the mount with an x-ray beam along a first axis parallel to within two degrees to the HAR structures in the array and along a second axis that is oblique to the HAR structures in the array;
a small angle x-ray scattering (SAXS) detector, configured to sense a first pattern of SAXS scattered from the sample while illuminating the sample along the first axis and a second pattern of the SAXS scattered from the sample while illuminating the sample along the second axis; and
a processor configured to extract information with respect to the HAR structures based on the first and second patterns by removing from the first pattern of the SAXS a contribution of one or more additional repetitive structures on the substrate having an aspect ratio smaller than the HAR structures, responsively to a sensitivity of the second pattern to rotation of the second axis.

12. The apparatus according to claim 11, wherein the HAR structures comprise holes having an aspect ratio exceeding 10:1.

13. The apparatus according to claim 12, wherein the second axis deviates by at least three degrees from alignment with the holes.

14. The apparatus according to claim 11, wherein the processor is configured to subtract the second pattern from the first pattern.

15. The apparatus according to claim 11, wherein the processor is configured to generate a model of background scattering responsively to the second pattern, and to apply the model in analyzing a contribution of the HAR structures to the first pattern.

16. The apparatus according to claim 11, wherein the processor is configured, using the second pattern, to remove from the first pattern of the SAXS a contribution of backscattered X-rays.

17. The apparatus according to claim 11, wherein illuminating the sample with the x-ray beam along the second axis comprises setting an angle of the second axis so as to eliminate from the second pattern of the SAXS a contribution of the HAR structures.

18. The apparatus according to claim 11, wherein illuminating the sample with the x-ray beam along the second axis comprises rotating the mount relative to the x-ray beam.

19. The apparatus according to claim 11, wherein illuminating the sample with the x-ray beam along the second axis the changing of the spatial relationship comprises rotating the x-ray beam relative to the sample.

\* \* \* \* \*